(12) United States Patent
Yamazaki

(10) Patent No.: US 9,331,100 B2
(45) Date of Patent: May 3, 2016

(54) DISPLAY DEVICE

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/028,744

(22) Filed: Sep. 17, 2013

(65) Prior Publication Data

US 2014/0091301 A1   Apr. 3, 2014

(30) Foreign Application Priority Data

Sep. 24, 2012 (JP) ................................. 2012-210231

(51) Int. Cl.
*H01L 27/12* (2006.01)
*H01L 29/786* (2006.01)

(52) U.S. Cl.
CPC ........ *H01L 27/1225* (2013.01); *H01L 29/7869* (2013.01)

(58) Field of Classification Search
CPC ............ H01L 29/7869; H01L 27/1225; H01L 27/3262
See application file for complete search history.

(56) References Cited

U.S. PATENT DOCUMENTS

| | | | |
|---|---|---|---|
| 5,528,032 A | 6/1996 | Uchiyama | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |

(Continued)

FOREIGN PATENT DOCUMENTS

| | | |
|---|---|---|
| CN | 101487961 A | 7/2009 |
| CN | 101621076 A | 1/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

(Continued)

*Primary Examiner* — Jaehwan Oh
(74) *Attorney, Agent, or Firm* — Fish & Richardson P.C.

(57) ABSTRACT

A transistor including an oxide semiconductor layer can have stable electrical characteristics. In addition, a highly reliable display device including the transistor is provided. The display device includes a multi-layer film including an oxide layer and an oxide semiconductor layer; a gate insulating film in contact with the multi-layer film; and a gate electrode overlapping with the multi-layer film with the gate insulating film provided therebetween. The oxide semiconductor layer contains indium, and is in contact with the oxide layer. The oxide layer contains indium, and has a larger energy gap than the oxide semiconductor layer.

A1                                    A2

21 Claims, 30 Drawing Sheets

(56) References Cited

U.S. PATENT DOCUMENTS

| | | |
|---|---|---|
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,237,166 B2 | 8/2012 | Kumomi et al. |
| 8,274,078 B2 | 9/2012 | Itagaki et al. |
| 8,319,905 B2 | 11/2012 | Yoon et al. |
| 8,476,719 B2 | 7/2013 | Endo et al. |
| 8,502,221 B2 | 8/2013 | Yamazaki |
| 8,525,304 B2 | 9/2013 | Endo et al. |
| 8,541,258 B2 | 9/2013 | Kim et al. |
| 8,952,381 B2 | 2/2015 | Yamazaki |
| 8,987,731 B2 | 3/2015 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0180045 A1 | 7/2009 | Yoon et al. |
| 2009/0206332 A1 | 8/2009 | Son et al. |
| 2009/0236596 A1* | 9/2009 | Itai ............... H01L 27/78618 257/43 |
| 2009/0250693 A1 | 10/2009 | Jeong et al. |
| 2009/0278122 A1 | 11/2009 | Hosono et al. |
| 2009/0280600 A1 | 11/2009 | Hosono et al. |
| 2009/0321732 A1 | 12/2009 | Kim et al. |
| 2010/0038641 A1 | 2/2010 | Imai |
| 2010/0059746 A1* | 3/2010 | Itai ............... H01L 29/78609 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0283049 A1 | 11/2010 | Sato et al. |
| 2010/0320458 A1 | 12/2010 | Umeda et al. |
| 2010/0320459 A1 | 12/2010 | Umeda et al. |
| 2011/0127523 A1 | 6/2011 | Yamazaki |
| 2011/0140100 A1* | 6/2011 | Takata ............... H01L 29/78696 257/43 |
| 2011/0156026 A1 | 6/2011 | Yamazaki et al. |
| 2011/0193083 A1 | 8/2011 | Kim et al. |
| 2011/0215328 A1 | 9/2011 | Morosawa et al. |
| 2011/0240990 A1 | 10/2011 | Yamazaki |
| 2011/0284846 A1 | 11/2011 | Endo et al. |
| 2011/0309411 A1 | 12/2011 | Takemura |
| 2012/0032730 A1 | 2/2012 | Koyama |
| 2012/0085974 A1 | 4/2012 | Kizaki |
| 2012/0119205 A1 | 5/2012 | Taniguchi et al. |
| 2012/0161133 A1* | 6/2012 | Yamazaki ........... H01L 27/1156 257/57 |
| 2012/0187395 A1 | 7/2012 | Koezuka |
| 2012/0305913 A1 | 12/2012 | Yamazaki et al. |
| 2012/0319183 A1 | 12/2012 | Yamazaki et al. |
| 2013/0146868 A1* | 6/2013 | Zan ............... H01L 29/78693 257/43 |
| 2013/0240879 A1 | 9/2013 | Kim |
| 2013/0320334 A1 | 12/2013 | Yamazaki et al. |
| 2013/0334533 A1 | 12/2013 | Yamazaki |
| 2014/0008647 A1 | 1/2014 | Yamazaki |
| 2014/0014947 A1 | 1/2014 | Yamazaki |
| 2014/0027762 A1 | 1/2014 | Tsurume et al. |
| 2014/0042433 A1 | 2/2014 | Yamazaki |
| 2014/0042434 A1 | 2/2014 | Yamazaki |
| 2014/0042435 A1 | 2/2014 | Yamazaki |
| 2014/0042436 A1 | 2/2014 | Yamazaki |
| 2014/0042437 A1 | 2/2014 | Yamazaki |
| 2014/0042438 A1 | 2/2014 | Yamazaki |
| 2014/0084287 A1 | 3/2014 | Yamazaki |

FOREIGN PATENT DOCUMENTS

| | | |
|---|---|---|
| CN | 102403361 A | 4/2012 |
| CN | 102834922 A | 12/2012 |
| CN | 102934232 A | 2/2013 |
| EP | 1 737 044 A1 | 12/2006 |
| EP | 2 141 744 A1 | 1/2010 |

(56) References Cited

FOREIGN PATENT DOCUMENTS

| | | |
|---|---|---|
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2009-170905 A | 7/2009 |
| JP | 2009-231613 A | 10/2009 |
| JP | 2010-016347 A | 1/2010 |
| JP | 4415062 | 2/2010 |
| JP | 2010-067954 A | 3/2010 |
| JP | 2010-177431 A | 8/2010 |
| JP | 4571221 | 10/2010 |
| JP | 2011-228695 A | 11/2011 |
| JP | 2011-243745 | 12/2011 |
| JP | 2011-243745 A | 12/2011 |
| JP | 2012-023352 A | 2/2012 |
| JP | 2012-059860 A | 3/2012 |
| JP | 2012-119672 A | 6/2012 |
| JP | 2012-151462 A | 8/2012 |
| JP | 2012-160679 A | 8/2012 |
| JP | 2012-164978 A | 8/2012 |
| KR | 2009-0078568 A | 7/2009 |
| KR | 2010-0002503 A | 1/2010 |
| KR | 2012-0026005 A | 3/2012 |
| KR | 2012-0084678 A | 7/2012 |
| KR | 2013-0032304 A | 4/2013 |
| KR | 2013-0051468 A | 5/2013 |
| KR | 2013-0054458 A | 5/2013 |
| TW | 200947086 A | 11/2009 |
| TW | 201214705 A | 4/2012 |
| TW | 201222823 A | 6/2012 |
| WO | 2004/114391 A1 | 12/2004 |
| WO | WO-2008/133345 | 11/2008 |
| WO | 2011/122364 A1 | 10/2011 |
| WO | 2011/158888 A1 | 12/2011 |

OTHER PUBLICATIONS

Cho, D et al., "21.2: Al and Sn-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: the "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID, 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214TH ECS Meeting, 2008, No. 2317, 1 page.

Kimizuka, N et al., "Spinel,YBFe2O4, and YB2Fe3O4 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

(56) References Cited

OTHER PUBLICATIONS

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13TH International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6TH International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," JPN. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

International Search Report (Application No. PCT/JP2013/075398) dated Oct. 29, 2013, 3 pages.

Written Opinion (Application No. PCT/JP2013/075398) dated Oct. 29, 2013, 6 pages.

Ohara, H et al., "Amorphous In—Ga—Zn—Oxide TFTs with Suppressed Variation for 4.0 inch QVGA AMOLED Display,"AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16TH International Display Workshops, 2009, pp. 689-692

Son, K et al., "42.4L: Late-News Paper: 4 Inch QVGA AMOLED Driven by the Threshold Voltage Controlled Amorphous GIZO (Ga2O3—In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15TH International Display Workshops, Dec. 3, 2008, pp. 1637-1640.

Tsuda, K et al., "Ultra Low Power Consumption Technologies for Mobile TFT-LCDs," IDW '02 : Proceedings of the 9TH International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

(56) References Cited

OTHER PUBLICATIONS

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

* cited by examiner

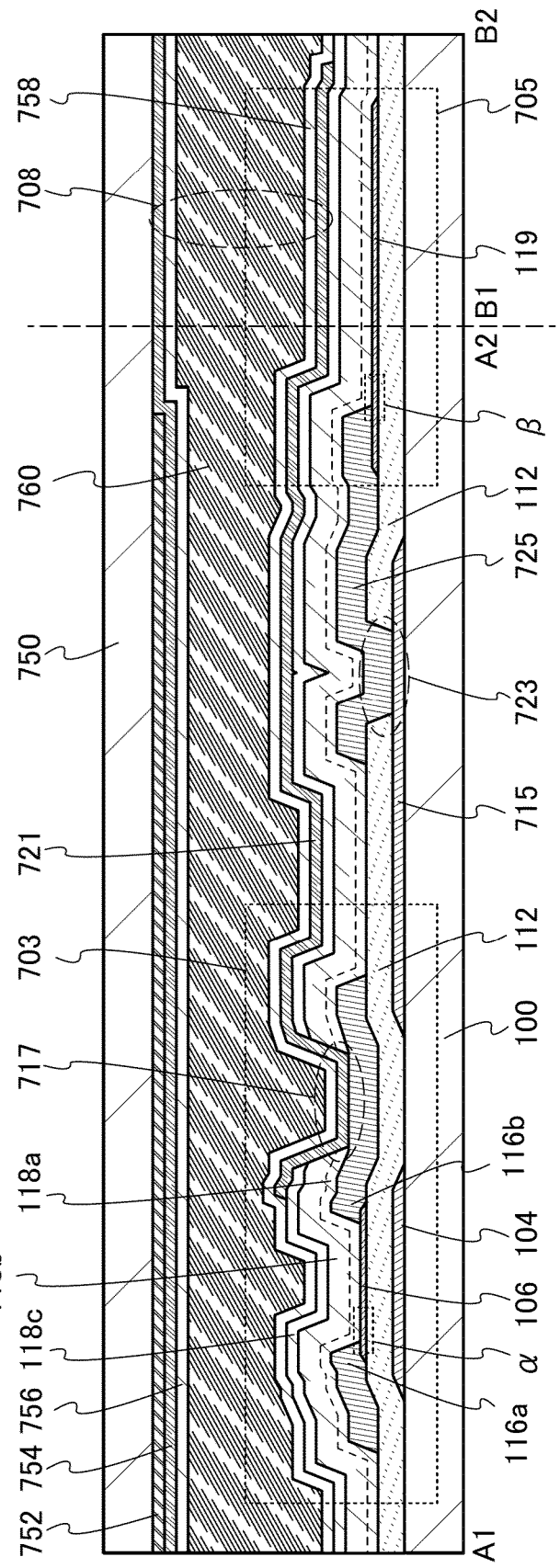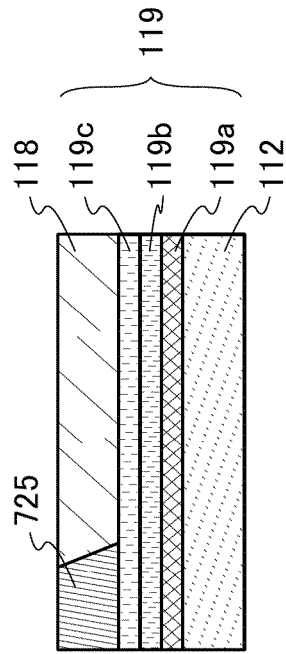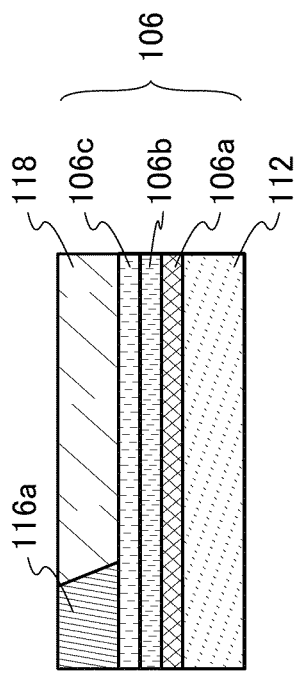

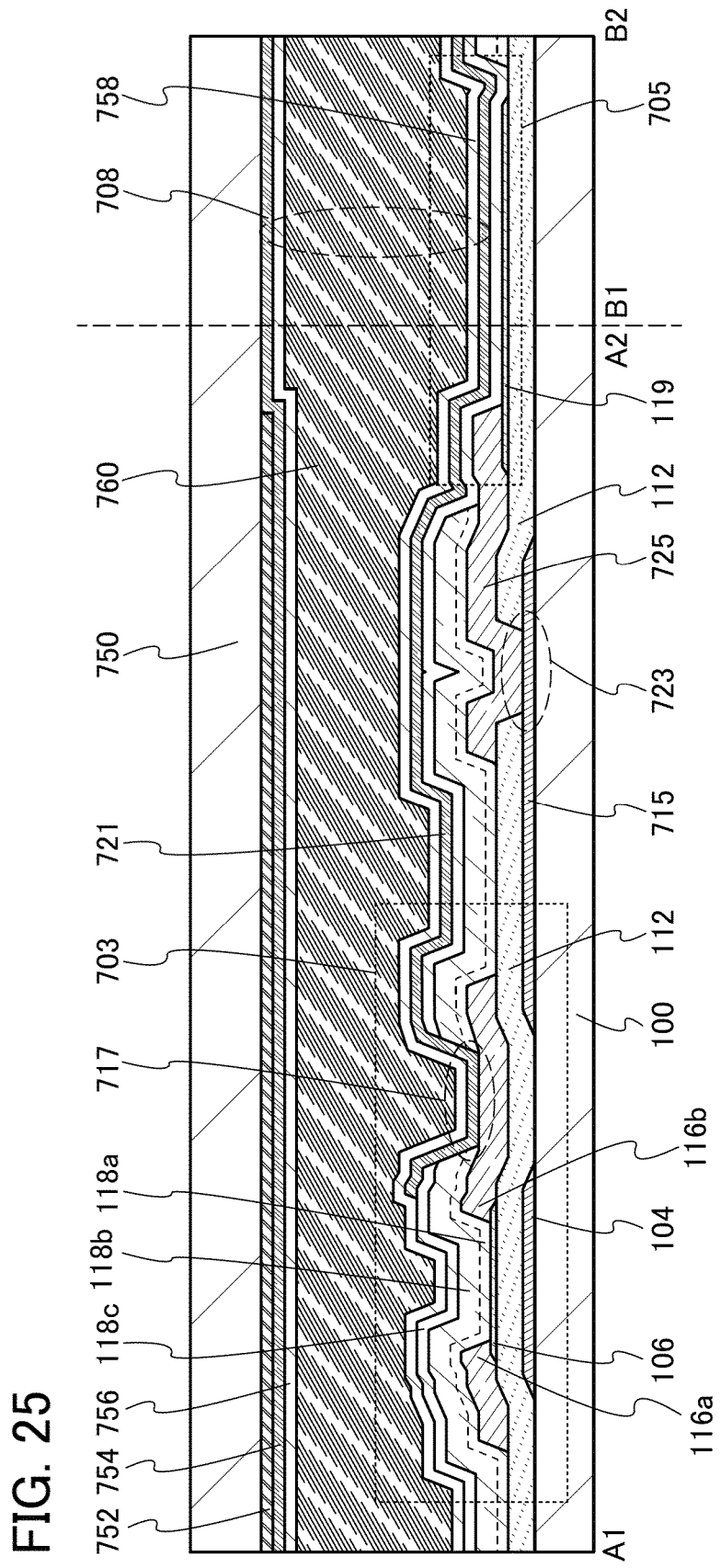

DISPLAY DEVICE

TECHNICAL FIELD

The present invention relates to a display device, a semiconductor device, and manufacturing methods thereof.

Note that in this specification, a semiconductor device refers to any device that can function by utilizing semiconductor characteristics, and an electro-optical device, a semiconductor circuit, an electronic device, and the like are all semiconductor devices.

BACKGROUND ART

A technique by which a transistor is formed using a semiconductor film formed over a substrate having an insulating surface has been attracting attention. The transistor is applied to a wide range of semiconductor devices such as an integrated circuit and a display device. A silicon film is widely known as a semiconductor film applicable to the transistor.

Whether an amorphous silicon film or a polycrystalline silicon film is used as a semiconductor film of a transistor depends on the purpose. For example, for a transistor in a large-sized display device, an amorphous silicon film is preferably used because a technique for forming a film on a large-sized substrate has been established. On the other hand, for a transistor included in a high-performance display device where driver circuits are formed over the same substrate as a display region, a polycrystalline silicon film which can form a transistor having a high field-effect mobility is preferably used. As a method for forming a polycrystalline silicon film, high-temperature heat treatment or a laser process which is performed on an amorphous silicon film has been known.

Further, in recent years, an oxide semiconductor layer has been attracting attention. For example, a transistor which includes an oxide semiconductor layer containing indium, gallium, and zinc and having a carrier density less than $10^{18}/cm^3$ is disclosed (see Patent Document 1).

An oxide semiconductor layer can be formed by a sputtering method, and thus can be used for a transistor in a large-sized display device. Moreover, a transistor including an oxide semiconductor layer has a high field-effect mobility; therefore, a high-performance display device where driver circuits are formed over the same substrate can be obtained. In addition, there is an advantage that capital investment can be reduced because part of production equipment for a transistor including an amorphous silicon film can be retrofitted and utilized.

It is known that a transistor including an oxide semiconductor layer has an extremely small leakage current when the transistor is off. For example, a CPU with low power consumption utilizing small leakage current which is characteristic of the transistor including an oxide semiconductor layer is disclosed (see Patent Document 2).

REFERENCE

Patent Documents

[Patent Document 1] Japanese Published Patent Application No. 2006-165528

[Patent Document 2] United States Patent Application Publication No. 2012/0032730

DISCLOSURE OF INVENTION

As application of a transistor including an oxide semiconductor layer becomes widespread, reliability has been requested from various aspects. Thus, it is an object of one embodiment of the present invention to obtain a transistor including an oxide semiconductor layer, which has stable electrical characteristics. It is another object thereof to provide a highly reliable display device including the transistor.

According to one embodiment of the present invention, a display device includes a multi-layer film including an oxide layer and an oxide semiconductor layer; a gate insulating film in contact with the multi-layer film; and a gate electrode overlapping with the multi-layer film with the gate insulating film provided therebetween. The oxide semiconductor layer contains indium. The oxide semiconductor layer is in contact with the oxide layer. The oxide layer contains indium and has a larger energy gap than the oxide semiconductor layer.

Note that typical examples of the oxide semiconductor layer or the oxide layer containing indium include an In—Ga oxide, an In—Zn oxide, and an In-M-Zn oxide (M is Al, Ti, Ga, Y, Zr, Sn, La, Ce, Nd, or Hf).

According to another embodiment of the present invention, a semiconductor device includes a multi-layer film including an oxide layer and an oxide semiconductor layer; a gate insulating film in contact with the multi-layer film; and a gate electrode overlapping with the multi-layer film with the gate insulating film provided therebetween. The oxide semiconductor layer contains indium. The oxide semiconductor layer is in contact with the oxide layer. The oxide layer contains indium. An energy at a bottom of a conduction band of the oxide layer is closer to a vacuum level than an energy at a bottom of a conduction band of the oxide semiconductor layer. Note that an energy gap between a vacuum level and a bottom of a conduction band is referred to as an electron affinity.

According to another embodiment of the present invention, a display device includes a multi-layer film including a first oxide layer, a second oxide layer, and an oxide semiconductor layer; a gate insulating film in contact with the multi-layer film; and a gate electrode overlapping with the multi-layer film with the gate insulating film provided therebetween. The oxide semiconductor layer contains indium. The oxide semiconductor layer is in contact with the first oxide layer. The first oxide layer contains indium and has a larger energy gap than the oxide semiconductor layer. The oxide semiconductor layer is in contact with the second oxide layer facing the first oxide layer. The second oxide layer contains indium and has a larger energy gap than the oxide semiconductor layer.

According to another embodiment of the present invention, a display device includes a multi-layer film including a first oxide layer, a second oxide layer, and an oxide semiconductor layer; a gate insulating film in contact with the multi-layer film; and a gate electrode overlapping with the multi-layer film with the gate insulating film provided therebetween. The oxide semiconductor layer contains indium. The oxide semiconductor layer is in contact with the first oxide layer. The first oxide layer contains indium. An energy at a bottom of a conduction band of the first oxide layer is closer to a vacuum level than an energy at a bottom of a conduction band of the oxide semiconductor layer. The oxide semiconductor layer is in contact with the second oxide layer facing the first oxide layer. The second oxide layer contains indium. An energy at a bottom of a conduction band of the second oxide layer is closer to the vacuum level than the energy at the bottom of the conduction band of the oxide semiconductor layer.

It is effective to reduce the concentration of impurities in the oxide semiconductor layer in order that a transistor in which a channel is formed in the oxide semiconductor layer has stable electrical characteristics. For example, silicon forms an impurity level in the oxide semiconductor layer. In some cases, the impurity level becomes a trap, which degrades electrical characteristics of a transistor. Specifically, the concentration of silicon in the oxide semiconductor layer is set to be lower than $1\times10^{19}$ atoms/cm$^3$, preferably lower than $5\times10^{18}$ atoms/cm$^3$, more preferably lower than $1\times10^{18}$ atoms/cm$^3$. Note that as the gate insulating film of the transistor, an insulating film containing silicon such as a silicon oxide film, a silicon oxynitride film, a silicon nitride film, or a silicon nitride oxide film is used in many cases; therefore, it is preferable that the oxide semiconductor layer be not in contact with the gate insulating film.

In the case where a channel is formed at the interface between a gate insulating film and an oxide semiconductor layer, interface scattering occurs at the interface, whereby the field-effect mobility of a transistor is reduced. In view of the above, it is preferable that the oxide semiconductor layer be not in contact with the gate insulating film and a channel be separate from the gate insulating film.

Thus, when the channel of the transistor is separate from the gate insulating film, the transistor can have stable electrical characteristics and a high field-effect mobility. With the use of the transistor as a switching element of a display device, a highly reliable display device can be obtained because the transistor has stable electrical characteristics.

In order to form the channel of the transistor separately from the gate insulating film, the multi-layer film including the oxide semiconductor layer may have the following structure, for example.

The multi-layer film including the oxide semiconductor layer includes at least the oxide semiconductor layer (for convenience, referred to as a second oxide layer) and the first oxide layer (also referred to as a barrier layer) between the second oxide layer and the gate insulating film. The first oxide layer contains one or more kinds of metal elements contained in the second oxide layer. The energy at the bottom of the conduction band of the first oxide layer is located closer to the vacuum level than that of the second oxide layer by 0.05 eV or more, 0.07 eV or more, 0.1 eV or more, or 0.15 eV or more and 2 eV or less, 1 eV or less, 0.5 eV or less, or 0.4 eV or less. Note that the second oxide layer preferably contains at least indium in order that the carrier mobility is high. When an electric field is applied to the gate electrode at this time, a channel is formed in the second oxide layer of the multi-layer film including the oxide semiconductor layer, whose energy at the bottom of the conduction band is low. That is, the first oxide layer is formed between the second oxide layer and the gate insulating film, whereby a channel of the transistor can be formed in a layer which is not in contact with the gate insulating film (here, the second oxide layer). Further, since the first oxide layer contains one or more kinds of metal elements contained in the second oxide layer, interface scattering is unlikely to occur at the interface between the second oxide layer and the first oxide layer. Thus, the transistor can have a high field-effect mobility because the movement of carriers is not hindered at the interface.

The first oxide layer may contain, for example, aluminum, titanium, gallium, germanium, yttrium, zirconium, tin, lanthanum, cerium, or hafnium at a higher atomic ratio than the second oxide layer. Specifically, the amount of any of the above elements in the first oxide layer in an atomic ratio is 1.5 times or more, preferably twice or more, more preferably three times or more as much as that in the second oxide layer in an atomic ratio. Any of the above elements is strongly bonded to oxygen and thus has a function of suppressing generation of an oxygen vacancy in the first oxide layer. That is, an oxygen vacancy is more unlikely to be generated in the first oxide layer than in the second oxide layer.

Alternatively, when each of the first oxide layer and the second oxide layer is an In-M-Zn oxide and the first oxide layer and the second oxide layer contain In, M, and Zn at an atomic ratio of $x_1:y_1:z_1$ and an atomic ratio of $x_2:y_2:z_2$ respectively, $y_1/x_1$ needs to be larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the first oxide layer and the second oxide layer in which $y_1/x_1$ is 1.5 times or more as large as $y_2/x_2$ are selected. More preferably, the first oxide layer and the second oxide layer in which $y_1/x_1$ is twice or more as large as $y_2/x_2$ are selected. Still more preferably, the first oxide layer and the second oxide layer in which $y_1/x_1$ is three times or more as large as $y_2/x_2$ are selected. Here, in the second oxide layer, $y_1$ is preferably larger than or equal to $x_1$ because the transistor can have stable electrical characteristics. However, when $y_1$ is three times or more as large as $x_1$, the field-effect mobility of the transistor is reduced; accordingly, $y_1$ is preferably equal to $x_1$ or smaller than three times $x_1$.

The thickness of the first oxide layer is greater than or equal to 3 nm and less than or equal to 100 nm, preferably greater than or equal to 3 nm and less than or equal to 50 nm. The thickness of the second oxide layer is greater than or equal to 3 nm and less than or equal to 200 nm, preferably greater than or equal to 3 nm and less than or equal to 100 nm, more preferably greater than or equal to 3 nm and less than or equal to 50 nm.

The multi-layer film including the oxide semiconductor layer may include a third oxide layer (also referred to as a barrier layer) which is in contact with an insulating film and the second oxide layer on the opposite side of the gate insulating film, which contains one or more kinds of metal elements contained in the second oxide layer, and the energy at the bottom of the conduction band of which is located closer to the vacuum level than that of the second oxide layer by 0.05 eV or more, 0.07 eV or more, 0.1 eV or more, or 0.15 eV or more and 2 eV or less, 1 eV or less, 0.5 eV or less, or 0.4 eV or less. Note that the second oxide layer preferably contains at least indium in order that that the carrier mobility is high. When an electric field is applied to the gate electrode at this time, a channel is not formed in the third oxide layer. Further, since the third oxide layer contains one or more kinds of metal elements contained in the second oxide layer, an interface level is unlikely to be formed at the interface between the second oxide layer and the third oxide layer. When the interface has an interface level, in some cases, a second transistor in which the interface serves as a channel and which has a different threshold voltage is formed; accordingly, the apparent threshold voltage of the transistor is changed. Thus, with the third oxide layer, fluctuation in electrical characteristics of the transistors, such as a threshold voltage, can be reduced.

The third oxide layer may contain, for example, aluminum, titanium, gallium, germanium, yttrium, zirconium, tin, lanthanum, cerium, or hafnium at a higher atomic ratio than the second oxide layer. Specifically, the amount of any of the above elements in the third oxide layer in an atomic ratio is 1.5 times or more, preferably twice or more, more preferably three times or more as much as that in the second oxide layer in an atomic ratio. Any of the above elements is strongly bonded to oxygen and thus has a function of suppressing generation of an oxygen vacancy in the third oxide layer. That is, an oxygen vacancy is more unlikely to be generated in the third oxide layer than in the second oxide layer.

Further alternatively, when each of the second oxide layer and the third oxide layer is an In-M-Zn oxide and the second oxide layer and the third oxide layer contain In, M, and Zn at an atomic ratio of $x_2:y_2:z_2$ and an atomic ratio of $x_3:y_3:z_3$ respectively, $y_3/x_3$ needs to be larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the second oxide layer and the third oxide layer in which $y_3/x_3$ is 1.5 times or more as large as $y_2/x_2$ are selected. More preferably, the second oxide layer and the third oxide layer in which $y_3/x_3$ is twice or more as large as $y_2/x_2$ are selected. Still more preferably, the second oxide layer and the third oxide layer in which $y_3/x_3$ is three times or more as large as $y_2/x_2$ are selected. Here, in the second oxide layer, $y_2$ is preferably larger than or equal to $x_2$ because the transistor can have stable electrical characteristics. However, when $y_2$ is three times or more as large as $x_2$, the field-effect mobility of the transistor is reduced; accordingly, $y_2$ is preferably equal to $x_2$ or smaller than three times $x_2$.

The thickness of the third oxide layer is greater than or equal to 3 nm and less than or equal to 100 nm, preferably greater than or equal to 3 nm and less than or equal to 50 nm.

Note that the first oxide layer or the third oxide layer is provided in contact with a source electrode (a source region) and a drain electrode (a drain region) of the transistor.

When the source electrode (the source region) and the drain electrode (the drain region) of the transistor are provided in contact with at least side edges of the oxide semiconductor layer, the source electrode (the source region) and the drain electrode (the drain region) are in contact with the channel, which is preferable.

According to one embodiment of the present invention, it is possible to obtain a transistor having stable electrical characteristics with a multi-layer film including an oxide semiconductor layer. In addition, it is possible to provide a highly reliable display device including the transistor.

BRIEF DESCRIPTION OF DRAWINGS

FIGS. 24A to 24C are cross-sectional views illustrating a display device of one embodiment of the present invention.

FIG. 25 is a cross-sectional view illustrating a display device of one embodiment of the present invention.

BEST MODE FOR CARRYING OUT THE INVENTION

Figure 1:
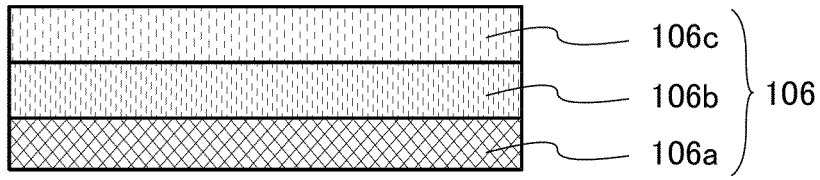
FIG. 1 is a cross-sectional view of a multi-layer film according to one embodiment of the present invention.

One embodiment of the present invention will be described below in detail with reference to the accompanying drawings. However, the present invention is not limited to the following description and it is easily understood by those skilled in the art that the mode and details can be variously changed. In addition, the present invention should not be construed as being limited to the description in the following embodiment. In describing structures of the present invention with reference to the drawings, the same reference numerals are used in common for the same portions in different drawings. Note that the same hatch pattern is applied to similar parts, and in some cases the similar parts are not especially denoted by reference numerals.

Further, the ordinal numbers such as "first" and "second" in this specification are used for convenience and do not indicate the order of steps or the stacking order of layers. In addition, the ordinal numbers in this specification do not indicate particular names which specify the present invention.

Note that in many cases, a voltage refers to a potential difference between a certain potential and a reference potential (e.g., a ground potential (GND) or a source potential). Accordingly, a voltage can also be called a potential.

Even when the expression "to be electrically connected" is used, there is a case in which no physical connection is made and a wiring is just extended in an actual circuit.

Further, functions of a source and a drain might be switched when a direction of current flow is changed in circuit operation, for example. Therefore, the terms "source" and "drain" can be switched in this specification.

The descriptions in this embodiment can be combined with each other as appropriate.

A multi-layer film including an oxide semiconductor layer used for a transistor will be described with reference to FIG. 1.

In this section, the structure of the multi-layer film will be described.

A multi-layer film 106 illustrated in FIG. 1 includes an oxide layer 106a, an oxide semiconductor layer 106b over the oxide layer 106a, and an oxide layer 106c over the oxide semiconductor layer 106b. Note that although the multi-layer film 106 has three layers in the description below, the multi-layer film 106 may have two layers or four or more layers. For example, the multi-layer film 106 may include the oxide layer 106a and the oxide semiconductor layer 106b over the oxide layer 106a. Alternatively, the multi-layer film 106 may include the oxide semiconductor layer 106b and the oxide layer 106c over the oxide semiconductor layer 106b.

In this section, the concentrations of silicon in the layers included in the multi-layer film 106 will be described with reference to FIG. 2.

Here, the oxide layer 106a is an oxide layer formed by a sputtering method using an In—Ga—Zn oxide (the atomic ratio of In to Ga and Zn is 1:3:2) target. Note that an argon gas (flow rate: 30 sccm) and an oxygen gas (flow rate: 15 sccm) were used as a deposition gas, the pressure was set to be 0.4 Pa, the substrate temperature was set to be 200° C., and a DC power of 0.5 kW was applied.

The oxide semiconductor layer 106b is an oxide semiconductor layer formed by a sputtering method using an In—Ga—Zn oxide (the atomic ratio of In to Ga and Zn is 1:1:1) target. Note that an argon gas (flow rate: 30 sccm) and an oxygen gas (flow rate: 15 sccm) were used as a deposition gas, the pressure was set to be 0.4 Pa, the substrate temperature was set to be 300° C., and a DC power of 0.5 kW was applied.

The oxide layer 106c is an oxide layer formed by a sputtering method using an In—Ga—Zn oxide (the atomic ratio of In to Ga and Zn is 1:3:2) target. Note that an argon gas (flow rate: 30 sccm) and an oxygen gas (flow rate: 15 sccm) were used as a deposition gas, the pressure was set to be 0.4 Pa, the substrate temperature was set to be 200° C., and a DC power of 0.5 kW was applied.

The multi-layer film 106 is provided over a silicon wafer, and a sample not subjected to heat treatment and a sample subjected to heat treatment at 450° C. for two hours are prepared. FIG. 2 shows the secondary ion intensities of In, Ga, and Zn in a depth direction, and the $SiO_3$ concentration (atoms/cm$^3$) in a depth direction of the samples measured by ToF-SIMS (Time-of-flight secondary ion mass spectrometry). The multi-layer film 106 includes the oxide layer 106a having a thickness of 10 nm, the oxide semiconductor layer 106b having a thickness of 10 nm over the oxide layer 106a, and the oxide layer 106c having a thickness of 10 nm over the oxide semiconductor layer 106b.

Figure 2:
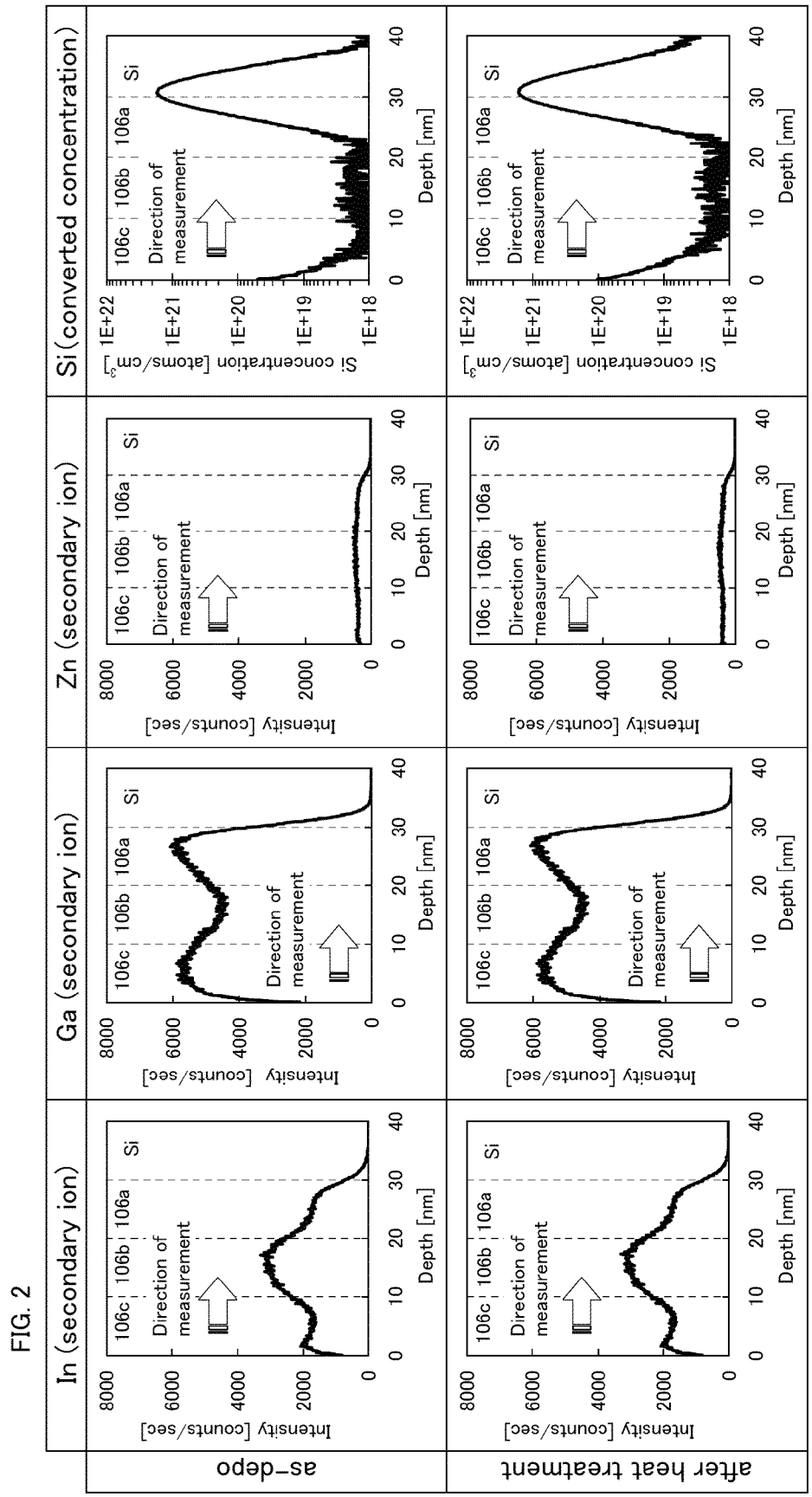
FIG. 2 shows ToF-SIMS results of a multi-layer film according to one embodiment of the present invention.

FIG. 2 shows that the compositions of the layers included in the multi-layer film 106 are changed depending on the compositions of the respective targets used at the time of the film formation. Note that the compositions of the layers cannot be simply compared using FIG. 2.

FIG. 2 indicates that the interface between the silicon wafer and the oxide layer 106a of the multi-layer film 106 and the upper surface of the oxide layer 106c has higher $SiO_3$ concentrations. Moreover, FIG. 2 shows that the concentration of $SiO_3$ in the oxide semiconductor layer 106b is about $1\times10^{18}$ atoms/cm$^3$ which is the lower limit of detection in Tof-SIMS. This is probably because, owing to the existence of the oxide layers 106a and 106c, the oxide semiconductor layer 106b is not influenced by silicon due to the silicon wafer or the surface contamination.

Further, comparison of the sample subjected to the heat treatment with an as-deposited sample (the sample not subjected to heat treatment, referred to as "as-depo" in FIG. 2) indicates that silicon is less likely to be diffused through the heat treatment though entry of silicon occurs at the time of deposition.

It is effective to highly purify the oxide semiconductor layer 106b to be a highly purified intrinsic oxide semiconductor layer so that a transistor including the multi-layer film 106 has stable electrical characteristics. Specifically, the carrier density of the oxide semiconductor layer 106b is set to be lower than $1\times10^{17}$/cm$^3$, lower than $1\times10^{15}$/cm$^3$, or lower than $1\times10^{13}$/cm$^3$. In the oxide semiconductor layer 106b, hydrogen, nitrogen, carbon, silicon, and a metal element other than the main component become an impurity. In order to reduce the concentration of impurities in the oxide semiconductor layer 106b, it is preferable to also reduce the concentration of impurities in the oxide layers 106a and 106c which are close to the oxide semiconductor layer 106b to a value almost equal to that in the oxide semiconductor layer 106b.

Particularly when silicon is contained in the oxide semiconductor layer 106b at a high concentration, an impurity level due to silicon is formed in the oxide semiconductor layer 106b. In some cases, the impurity level becomes a trap, which degrades electrical characteristics of the transistor. In order to make the deterioration of the electrical characteristics of the transistor small, the concentration of silicon in the oxide semiconductor layer 106b is set to be lower than $1\times10^{19}$ atoms/cm$^3$, preferably lower than $5\times10^{18}$ atoms/cm$^3$, more preferably lower than $1\times10^{18}$ atoms/cm$^3$. Moreover, the concentrations of silicon at the interface between the oxide layer 106a and the oxide semiconductor layer 106b and the interface between the oxide semiconductor layer 106b and the oxide layer 106c are each set to be lower than $1\times10^{19}$ atoms/cm$^3$, preferably lower than $5\times10^{18}$ atoms/cm$^3$, more preferably lower than $1\times10^{18}$ atoms/cm$^3$.

Further, hydrogen and nitrogen in the oxide semiconductor layer 106b form donor levels, which increase carrier density. In order to make the oxide semiconductor layer 106b intrinsic or substantially intrinsic, the concentration of hydrogen in the oxide semiconductor layer 106b, which is measured by SIMS, is set to be lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. The concentration of nitrogen in the oxide semiconductor layer 106b, which is measured by SIMS, is set to be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

Note that when silicon and carbon are contained in the oxide semiconductor layer 106b at a high concentration, the crystallinity of the oxide semiconductor layer 106b is lowered in some cases. In order not to lower the crystallinity of the oxide semiconductor layer 106b, the concentration of silicon in the oxide semiconductor layer 106b is set to be lower than $1\times10^{19}$ atoms/cm³, preferably lower than $5\times10^{18}$ atoms/cm³, more preferably lower than $1\times10^{18}$ atoms/cm³. Moreover, in order not to lower the crystallinity of the oxide semiconductor layer 106b, the concentration of carbon in the oxide semiconductor layer 106b is set to be lower than $1\times10^{19}$ atoms/cm³, preferably lower than $5\times10^{18}$ atoms/cm³, more preferably lower than $1\times10^{18}$ atoms/cm³. Description of the crystallinity of the multi-layer film 106 will be made later.

Here, diffusion of oxygen in the multi-layer film 106 through heat treatment at 350° C. or heat treatment at 450° C. is described with reference to FIGS. 3A to 3C.

Figure 3A:
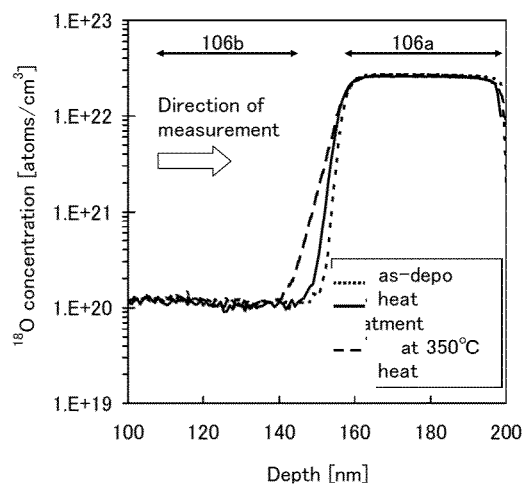
FIGS. 3A to 3C each show diffusion of oxygen in a multi-layer film according to one embodiment of the present invention.
Figure 3B:
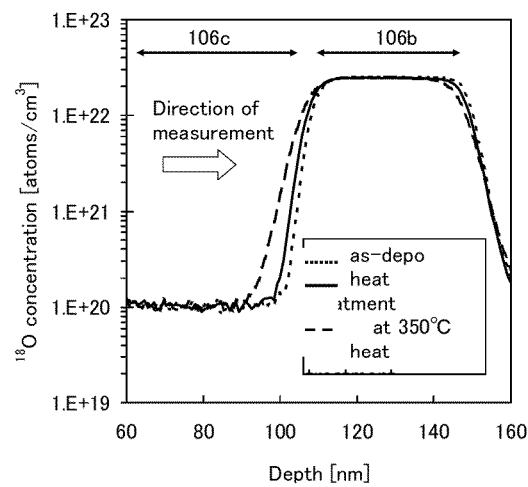
Figure 3C:
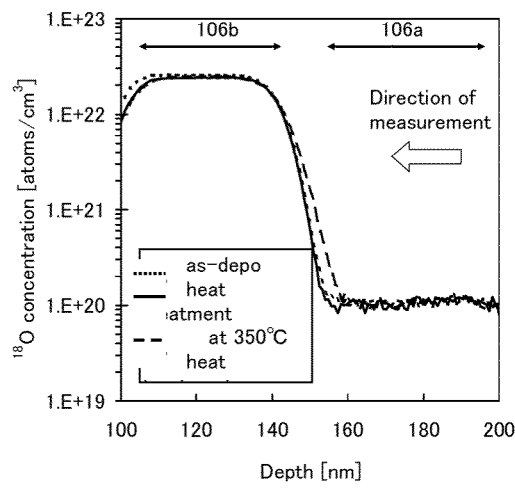

FIGS. 3A to 3C each show SIMS measurement results of concentration distribution of $^{18}O$ in a depth direction in samples in which any of the layers of the multi-layer film 106 is formed using an $^{18}O_2$ gas.

Here, the oxide layer 106a is an oxide layer formed by a sputtering method using an In—Ga—Zn oxide (the atomic ratio of In to Ga and Zn is 1:1:1) target.

The oxide semiconductor layer 106b is an oxide semiconductor layer formed by a sputtering method using an In—Ga—Zn oxide (the atomic ratio of In to Ga and Zn is 3:1:2) target.

The oxide layer 106c is an oxide layer formed by a sputtering method using an In—Ga—Zn oxide (the atomic ratio of In to Ga and Zn is 1:1:1) target.

Here, FIG. 3A shows $^{18}O$ concentration distributions in a depth direction of the oxide layer 106a, the oxide semiconductor layer 106b, and the interface therebetween of samples in each of which an $^{18}O_2$ gas is used for forming the oxide layer 106a but is not used for forming the other layers. FIG. 3A indicates that $^{18}O$ is more diffused from the oxide layer 106a to the oxide semiconductor layer 106b in a sample subjected to the heat treatment at 350° C. (shown as "after heat treatment at 350° C." with a solid line) and a sample subjected to the heat treatment at 450° C. (shown as "after heat treatment at 450° C." with a thick solid line) than in a sample not subjected to heat treatment (shown as "as-depo" with a thin solid line).

FIG. 3B shows $^{18}O$ concentration distributions in a depth direction of the oxide semiconductor layer 106b, the oxide layer 106c, and the interface therebetween of samples in each of which an $^{18}O_2$ gas is used for forming the oxide semiconductor layer 106b but is not used for forming the other layers. FIG. 3B indicates that $^{18}O$ is more diffused from the oxide semiconductor layer 106b to the oxide layer 106c in a sample subjected to the heat treatment at 350° C. (shown as "after heat treatment at 350° C." with a solid line) and a sample subjected to the heat treatment at 450° C. (shown as "after heat treatment at 450° C." with a thick solid line) than in a sample not subjected to heat treatment (shown as "as-depo" with a thin solid line).

FIG. 3C shows $^{18}O$ concentration distributions in a depth direction of the oxide layer 106a, the oxide semiconductor layer 106b, and the interface therebetween of samples in each of which an $^{18}O_2$ gas is used for forming the oxide semiconductor layer 106b but is not used for forming the other layers. FIG. 3C indicates that $^{18}O$ is more diffused from the oxide semiconductor layer 106b to the oxide layer 106a in a sample subjected to the heat treatment at 450° C. (shown as "after heat treatment at 450° C." with a thick solid line) than in a sample not subjected to heat treatment (shown as "as-depo" with a thin solid line) and a sample subjected to the heat treatment at 350° C. (shown as "after heat treatment at 350° C." with a solid line).

As shown in FIGS. 3A to 3C, in the multi-layer film 106, oxygen is diffused from one layer to the other layer.

Next, an oxide layer applicable to each of the oxide layers 106a and 106c used in the multi-layer film 106 was formed by a sputtering method, and the number of particles with a size of 1 μm or more was measured.

The measurement was performed on the following samples: a sample formed using a gallium oxide target; a sample formed using a Ga—Zn oxide (the atomic ratio of Ga to Zn is 2:5) target; a sample formed using an In—Ga—Zn oxide (the atomic ratio of In to Ga and Zn is 3:1:2) target; a sample formed using an In—Ga—Zn oxide (the atomic ratio of In to Ga and Zn is 1:1:1) target; and a sample formed using an In—Ga—Zn oxide (the atomic ratio of In to Ga and Zn is 1:3:2) target.

Figure 4:
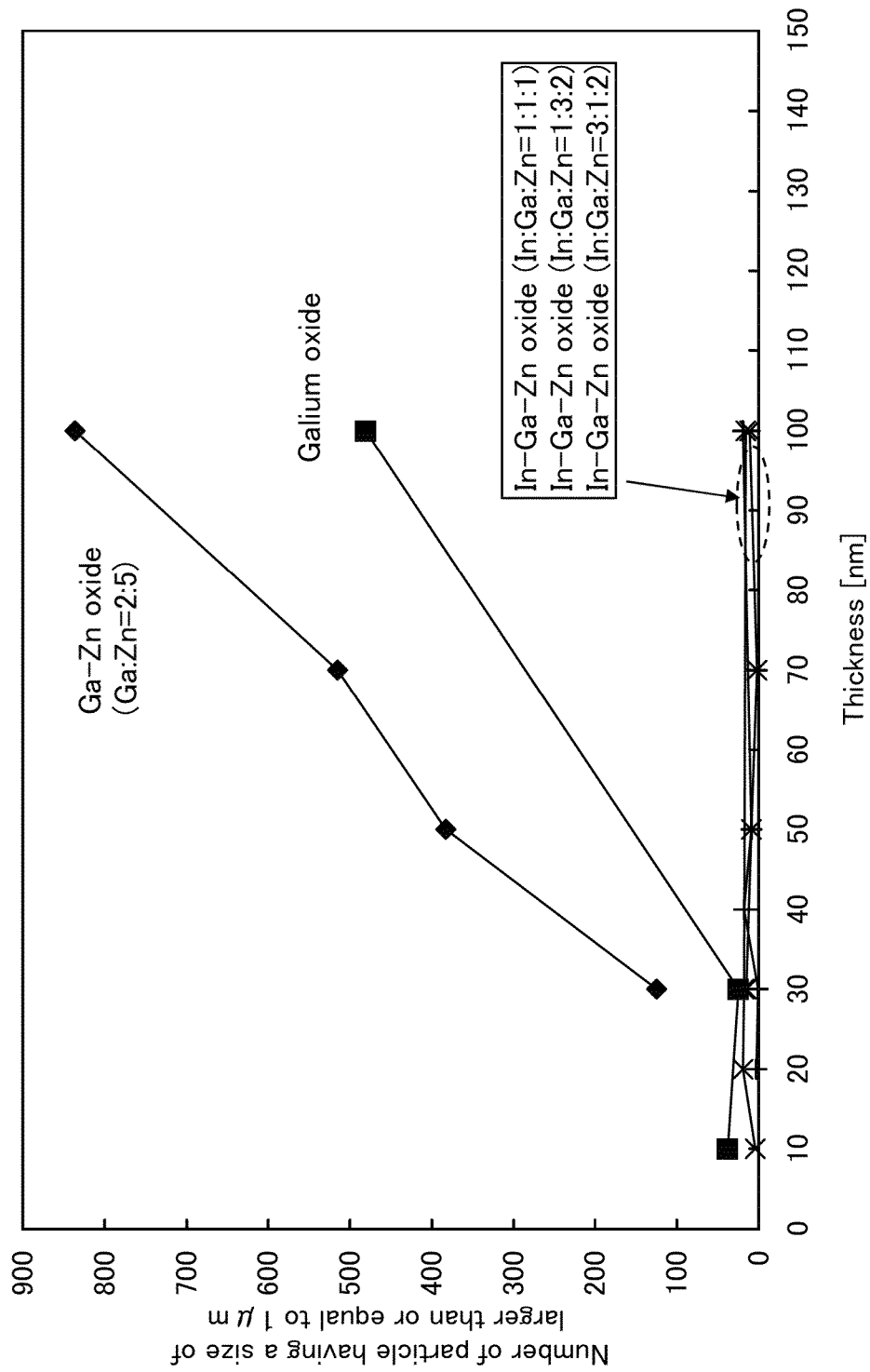
FIG. 4 shows the number of particles in an oxide layer and an oxide semiconductor layer according to one embodiment of the present invention.

FIG. 4 shows that in the sample formed using a gallium oxide target and the sample formed using a Ga—Zn oxide target, the number of particles with a size of 1 μm or more is rapidly increased as the thickness of the oxide layer is increased. On the other hand, in the samples formed using an In—Ga—Zn oxide target, the number of particles with a size of 1 μm or more is unlikely to be increased even when the thickness of the oxide layer is increased.

Thus, in the case where the oxide layer is formed by a sputtering method, a target containing indium is preferably used in terms of an increase in the number of particles. Moreover, it is preferable to use an oxide target in which the proportion of gallium in the atomic ratio of In to Ga and Zn is relatively small. Particularly in the case where a target containing indium is used, the conductivity of the target can be increased and DC discharge and AC discharge are facilitated; therefore, film formation over a large-sized substrate can be easily performed. Thus, semiconductor devices can be manufactured with improved productivity.

In this section, the band structure of the multi-layer film 106 will be described with reference to FIGS. 5A and 5B and FIGS. 6A and 6B.

Note that the oxide layer 106a was formed using an In—Ga—Zn oxide having an energy gap of 3.15 eV, the oxide semiconductor layer 106b was formed using an In—Ga—Zn oxide having an energy gap of 2.8 eV, and the oxide layer 106c was formed using an oxide layer whose physical properties are similar to those of the oxide layer 106a. Further, the energy gap in the vicinity of the interface between the oxide layer 106a and the oxide semiconductor layer 106b and the energy gap in the vicinity of the interface between the oxide layer 106c and the oxide semiconductor layer 106b were each 3 eV. The energy gaps were measured using a spectroscopic ellipsometer (UT-300 manufactured by HORIBA JOBIN YVON S.A.S.). The thicknesses of the oxide layer 106a, the oxide semiconductor layer 106b, and the oxide layer 106c were each 10 nm.

Figure 5A:
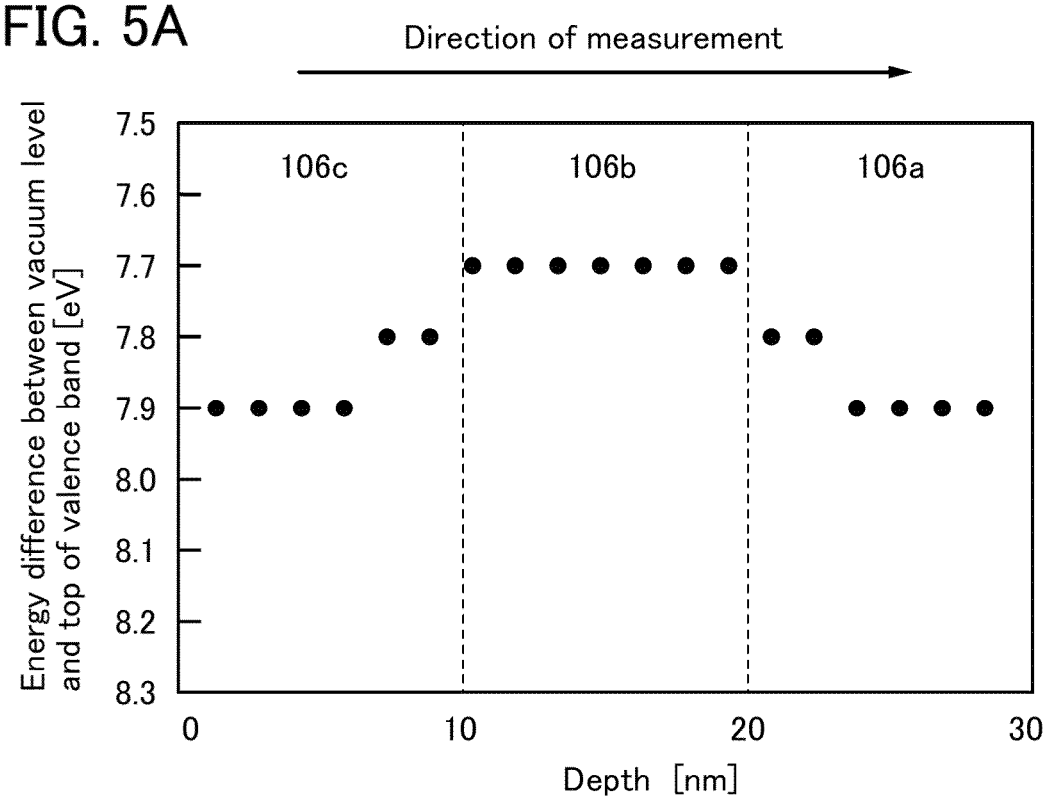
FIGS. 5A and 5B each illustrate a band structure of a multi-layer film according to one embodiment of the present invention.

FIG. 5A is a graph in which the energy gap between a vacuum level and a top of a valence band of each layer was measured while the multi-layer film 106 was etched from the oxide layer 106c side, and was plotted. The energy gap between the vacuum level and the top of the valence band was measured using an ultraviolet photoelectron spectroscopy (UPS) device (VersaProbe manufactured by ULVAC-PHI, Inc.).

Figure 5B:
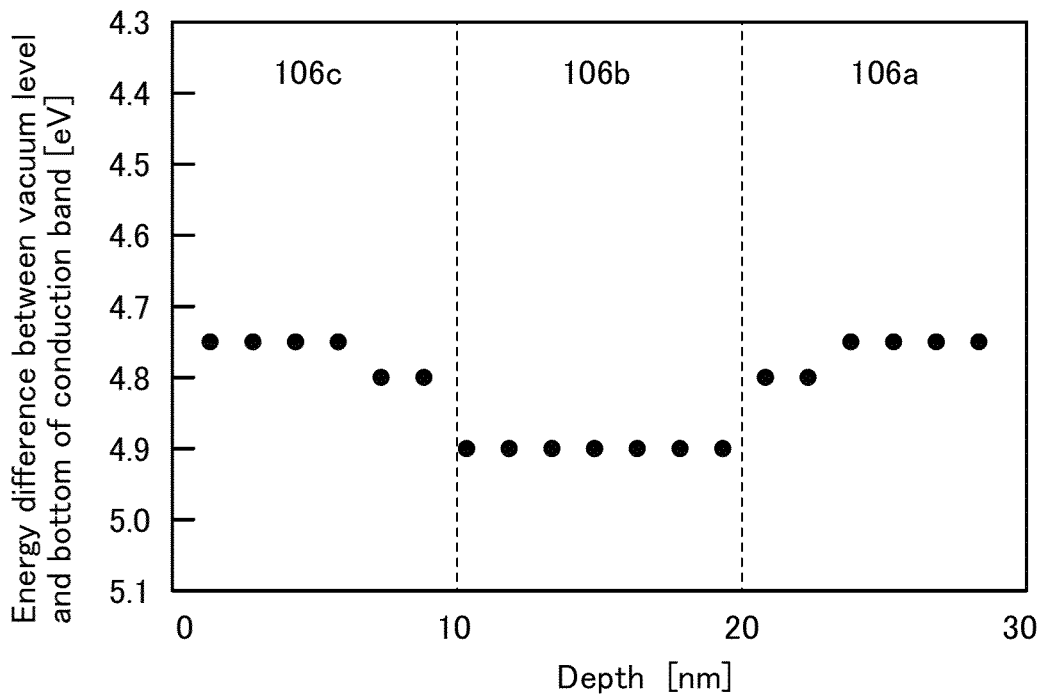

FIG. 5B is a graph in which a value obtained in such a manner that an energy gap between the vacuum level and a bottom of a conduction band of each layer was calculated by subtracting the energy gap of each layer from the energy gap between the vacuum level and the top of the valence band was plotted.

Figure 6A:
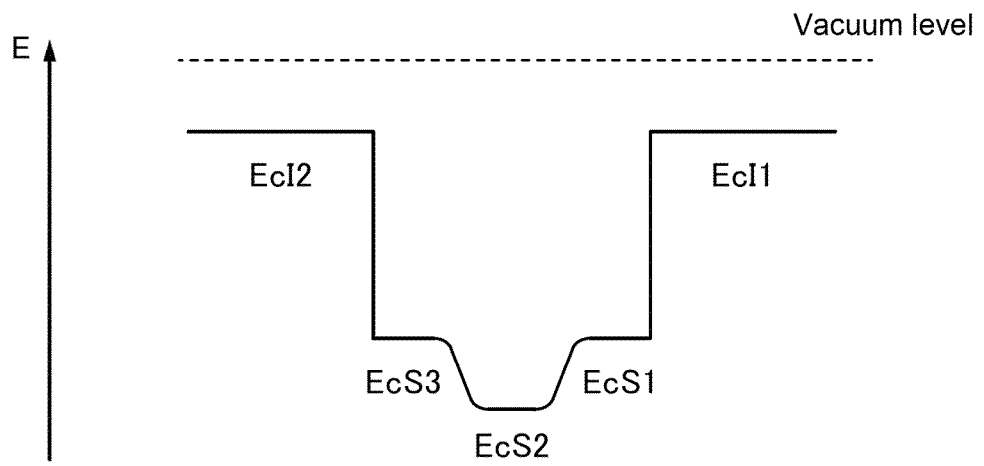
FIGS. 6A and 6B each illustrate a band structure of a multi-layer film according to one embodiment of the present invention.

Part of the band structure in FIG. 5B is schematically illustrated in FIG. 6A. FIG. 6A shows the case where silicon oxide films are provided in contact with the oxide layers 106a and 106c. Here, EcI1 denotes the energy of the bottom of the conduction band of the silicon oxide film, EcS1 denotes the energy of the bottom of the conduction band of the oxide layer 106a, EcS2 denotes the energy of the bottom of the conduction band of the oxide semiconductor layer 106b, EcS3 denotes the energy of the bottom of the conduction band of the oxide layer 106c, and EcI2 denotes the energy of the bottom of the conduction band of the silicon oxide film.

As shown in FIG. 6A, the energies of the bottoms of the conduction bands of the oxide layer 106a, the oxide semiconductor layer 106b, and the oxide layer 106c are changed continuously. This can be understood also from the results shown in FIGS. 3A to 3C that oxygen is diffused at the interface between the oxide layer 106a and the oxide semiconductor layer 106b and at the interface between the oxide semiconductor layer 106b and the oxide layer 106c.

Figure 6B:
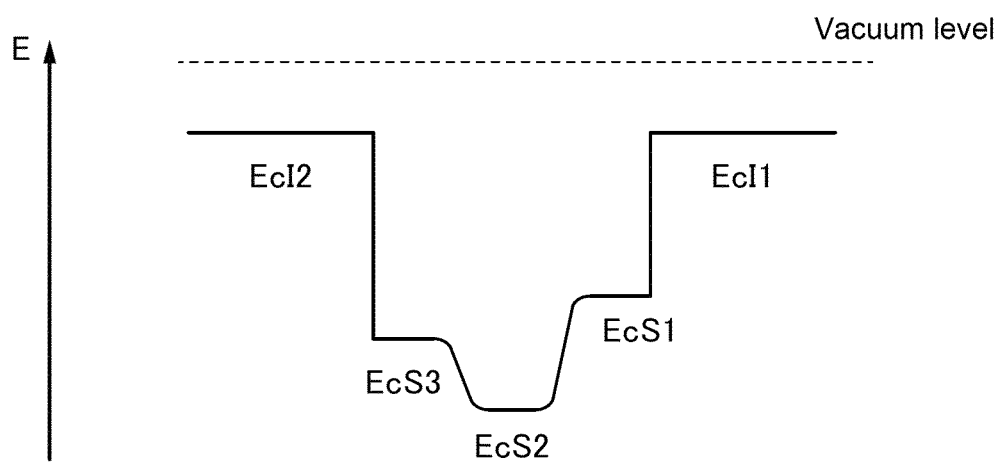

Note that FIG. 6A shows the case where the oxide layers 106a and 106c have similar physical properties; however, the oxide layers 106a and 106c may have different physical properties. For example, part of the band structure in the case where EcS1 is higher than EcS3 is shown in FIG. 6B. Alternatively, although not shown in FIGS. 6A and 6B, EcS3 may be higher than EcS1.

According to FIGS. 5A and 5B and FIGS. 6A and 6B, the oxide semiconductor layer 106b of the multi-layer film 106 serves as a well and a channel of the transistor including the multi-layer film 106 is formed in the oxide semiconductor layer 106b. Note that since the energies of the bottoms of the conduction bands are changed continuously, the multi-layer film 106 can also be referred to as a U-shaped well.

Figure 7:
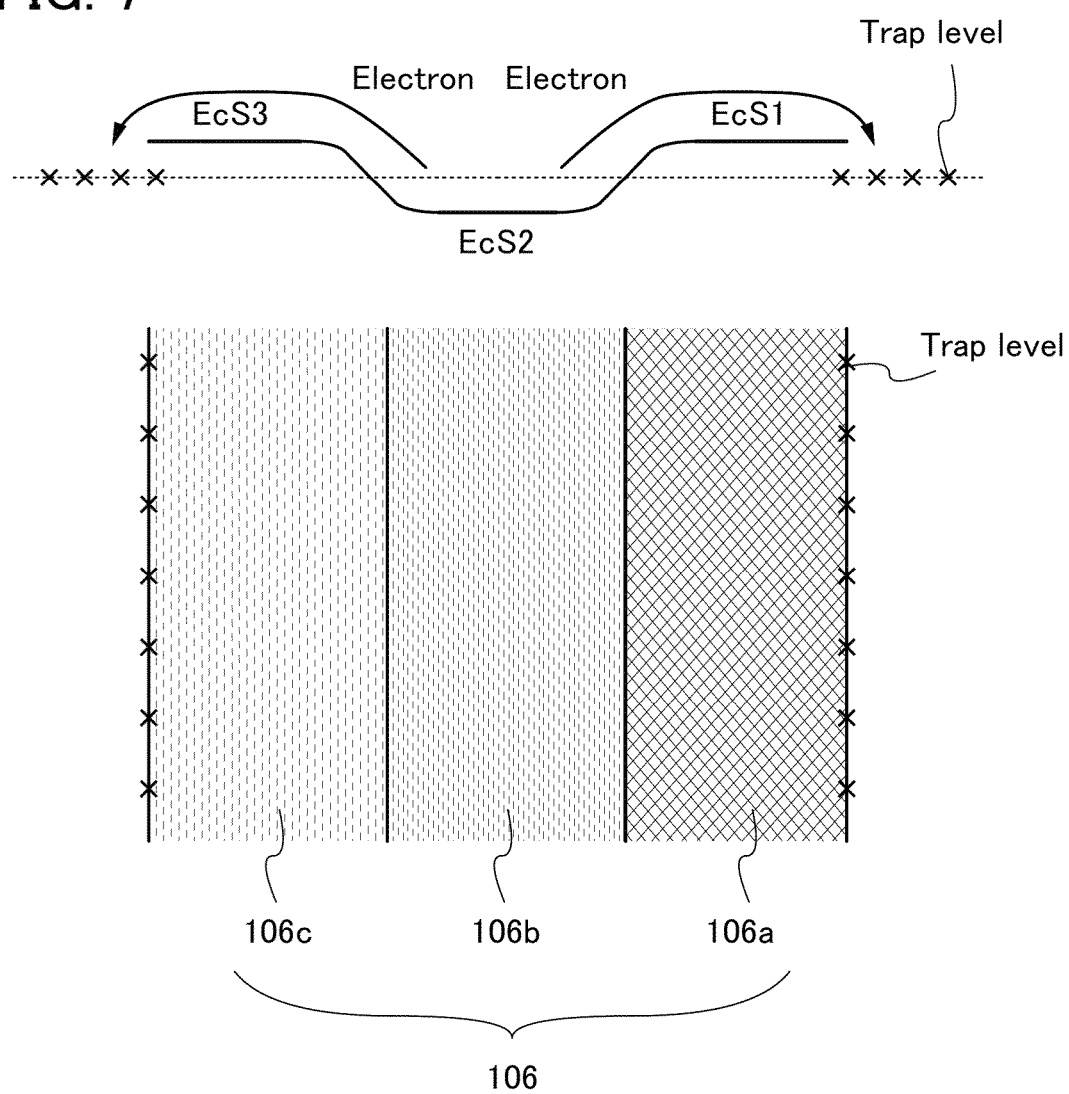
FIG. 7 illustrates a band structure of a multi-layer film according to one embodiment of the present invention.

Note that although trap levels due to impurities or defects might be formed in the vicinity of the interface between an insulating film such as a silicon oxide film and each of the oxide layers 106a and 106c as shown in FIG. 7, the oxide semiconductor layer 106b can be distanced away from the trap levels owing to the existence of the oxide layers 106a and 106c. However, when the energy gap between EcS1 or EcS3, and EcS2 is small, an electron might reach the trap level by passing over the energy gap. Since the electron is trapped in the trap level, a negative fixed charge is caused at the interface with the insulating film; thus, the threshold voltage of the transistor is shifted in the positive direction.

Thus, the energy gap between EcS1 and EcS2 and the energy gap between EcS3 and EcS2 are each preferably greater than or equal to 0.1 eV, more preferably greater than or equal to 0.15 eV because the amount of change of the threshold voltage of the transistor is reduced and the transistor has stable electrical characteristics.

It is preferable that at least the oxide semiconductor layer 106b of the multi-layer film 106 have crystallinity. With the oxide semiconductor layer 106b having crystallinity, the transistor including the multi-layer film 106 can have stable electrical characteristics as compared to the case of the oxide semiconductor layer 106b without crystallinity. In this section, an example in which the oxide semiconductor layer 106b has crystallinity in the multi-layer film 106 will be described.

Here, as for the crystallinity of the multi-layer film 106, atomic arrangement was evaluated with a transmission electron microscope (TEM). The description is made below with reference to FIGS. 8A to 8D and FIGS. 9A to 9D.

Here, the oxide layer 106a is an oxide layer formed by a sputtering method using an In—Ga—Zn oxide (the atomic ratio of In to Ga and Zn is 1:3:2) target. Note that an argon gas (flow rate: 30 sccm) and an oxygen gas (flow rate: 15 sccm) were used as a deposition gas, the pressure was set to be 0.4 Pa, the substrate temperature was set to be 200° C., and a DC power of 0.5 kW was applied.

The oxide semiconductor layer 106b is an oxide semiconductor layer formed by a sputtering method using an In—Ga—Zn oxide (the atomic ratio of In to Ga and Zn is 1:1:1) target. Note that an argon gas (flow rate: 30 sccm) and an oxygen gas (flow rate: 15 sccm) were used as a deposition gas, the pressure was set to be 0.4 Pa, the substrate temperature was set to be 300° C. or 400° C., and a DC power of 0.5 kW was applied.

The oxide layer 106c is an oxide layer formed by a sputtering method using an In—Ga—Zn oxide (the atomic ratio of In to Ga and Zn is 1:3:2) target. Note that an argon gas (flow rate: 30 sccm) and an oxygen gas (flow rate: 15 sccm) were used as a deposition gas, the pressure was set to be 0.4 Pa, the substrate temperature was set to be 200° C., and a DC power of 0.5 kW was applied.

FIGS. 8A to 8D and FIGS. 9A to 9D are transmission electron images of samples each including the multi-layer film 106 provided over a silicon oxide film over a silicon wafer which is the substrate. Note that the evaluated samples shown in FIGS. 8A to 8D and the evaluated samples in FIGS. 9A to 9D are different from each other only in that the temperatures of the substrate at the time of the formation of the oxide semiconductor layer 106b are 300° C. (FIGS. 8A to 8D) and 400° C. (FIGS. 9A to 9D). Note that each sample was not subjected to heat treatment. The transmission electron images were measured using Hitachi H-9500 transmission electron microscope (TEM).

Figure 8A:
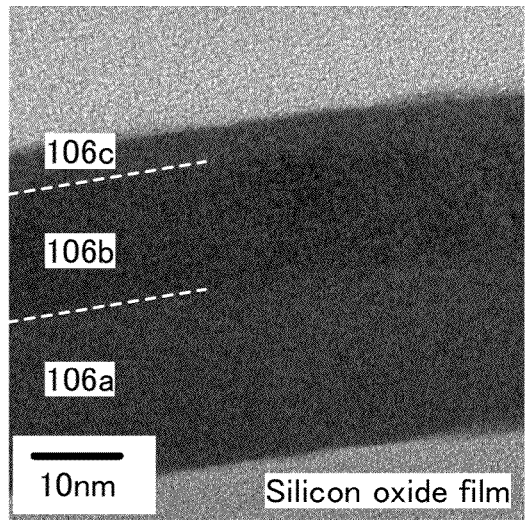
FIGS. 8A to 8D are each a transmission electron image of a multi-layer film according to one embodiment of the present invention, which is obtained with a TEM.
Figure 8C:
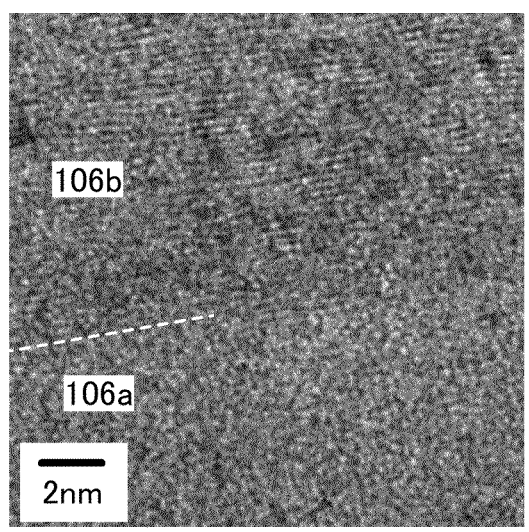
Figure 8B:
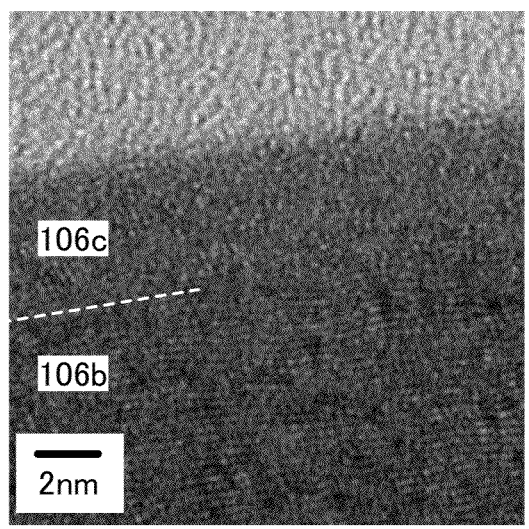
Figure 8D:
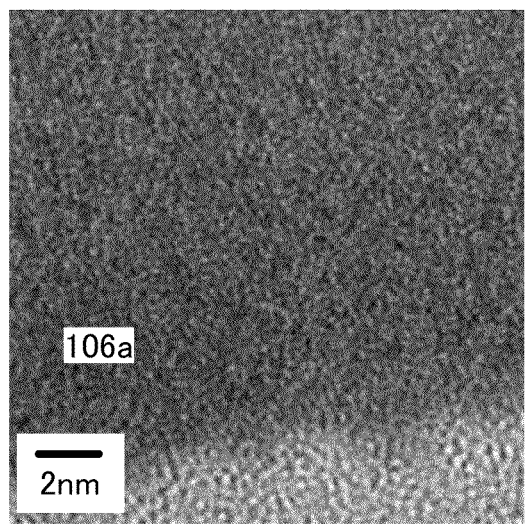
Figure 9A:
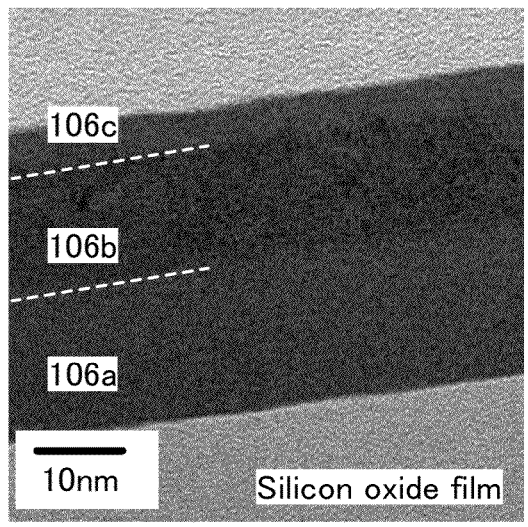
FIGS. 9A to 9D are each a transmission electron image of a multi-layer film according to one embodiment of the present invention, which is obtained with a TEM.
Figure 9C:
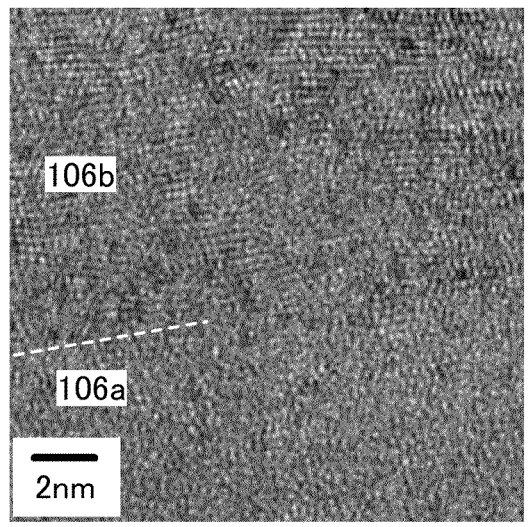
Figure 9B:
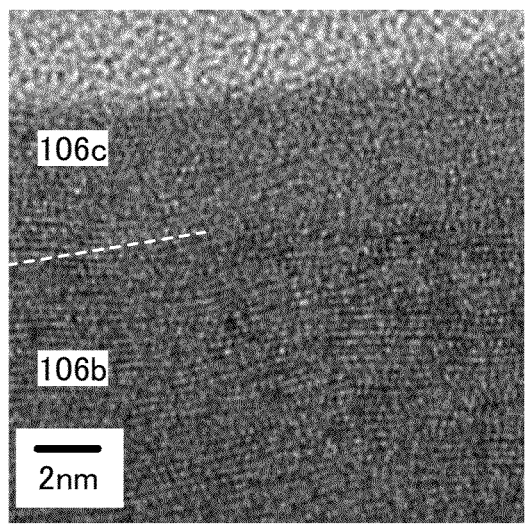
Figure 9D:
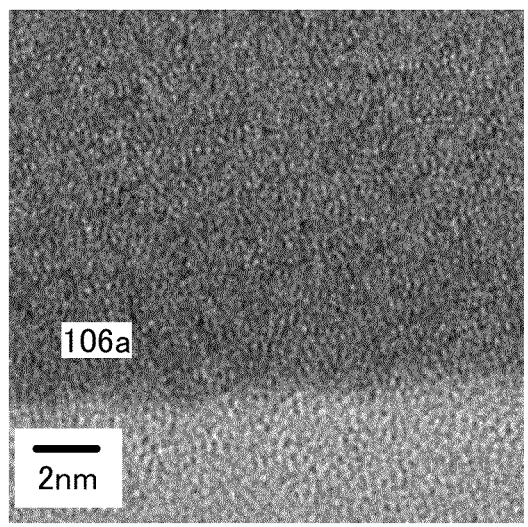

Here, the multi-layer film 106 includes an In—Ga—Zn oxide having a thickness of 20 nm as the oxide layer 106a, an In—Ga—Zn oxide having a thickness of 15 nm as the oxide semiconductor layer 106b, and an In—Ga—Zn oxide having a thickness of 5 nm as the oxide layer 106c. FIG. 8A is a transmission electron image showing the oxide layer 106a, the oxide semiconductor layer 106b, and the oxide layer 106c. FIG. 8B is an enlarged image of a portion in the vicinity of the interface between the oxide semiconductor layer 106b and the oxide layer 106c, FIG. 8C is an enlarged image of a portion in the vicinity of the interface between the oxide layer 106a and the oxide semiconductor layer 106b, and FIG. 8D is an enlarged image of a portion in the vicinity of the interface between the silicon oxide film and the oxide layer 106a. In a similar manner, FIG. 9A is a transmission electron image showing the oxide layer 106a, the oxide semiconductor layer 106b, and the oxide layer 106c. FIG. 9B is an enlarged image of a portion in the vicinity of the interface between the oxide semiconductor layer 106b and the oxide layer 106c, FIG. 9C is an enlarged image of a portion in the vicinity of the interface between the oxide layer 106a and the oxide semiconductor layer 106b, and FIG. 9D is an enlarged image of a portion in the vicinity of the interface between the silicon oxide film and the oxide layer 106a.

According to FIGS. 8A to 8D and FIGS. 9A to 9D, the oxide layers 106a and 106c have a low degree of crystallinity. Further, the oxide semiconductor layer 106b was entirely crystalline with a high degree of crystallinity from the interface with the oxide layer 106a to the interface with the oxide layer 106c. Note that the atomic arrangement in the crystal part of the oxide semiconductor layer 106b was found to be in a layered manner in a plane parallel to the upper surface of the oxide semiconductor layer 106b. Moreover, a clear grain boundary was not seen between crystal parts in the oxide semiconductor layer 106b. Further, the oxide semiconductor layer 106b in FIGS. 9A to 9D was found to have a higher degree of crystallinity than the oxide semiconductor layer 106b in FIGS. 8A to 8D.

The fact that the oxide semiconductor layer 106b was crystalline is also compatible with the ToF-SIMS results shown in FIG. 2. That is, the crystallinity of the oxide semiconductor layer 106b was not lowered probably because entry of silicon into the oxide semiconductor layer 106b was reduced owing to the existence of the oxide layers 106a and 106c.

In this manner, it seems that the oxide semiconductor layer 106b where a channel is formed has a high degree of crystallinity and there are few levels due to impurities or defects; therefore, the transistor including the multi-layer film 106 has stable electrical characteristics.

Here, the model of crystal growth in the oxide semiconductor layer 106b with a high degree of crystallinity is described with reference to FIGS. 10A and 10B.

When part of the crystal grain is separated as a particle from a cleavage plane and exposed to plasma, cutting of a bond starts at the portion where an interatomic bond is weak, so that a plurality of sputtered particles are generated.

With the use of an oxygen cation as an ion, plasma damage at the time of the film formation can be alleviated. Thus, when the ion collides with the surface of the target, a lowering in crystallinity of the target can be suppressed.

Figure 10A:
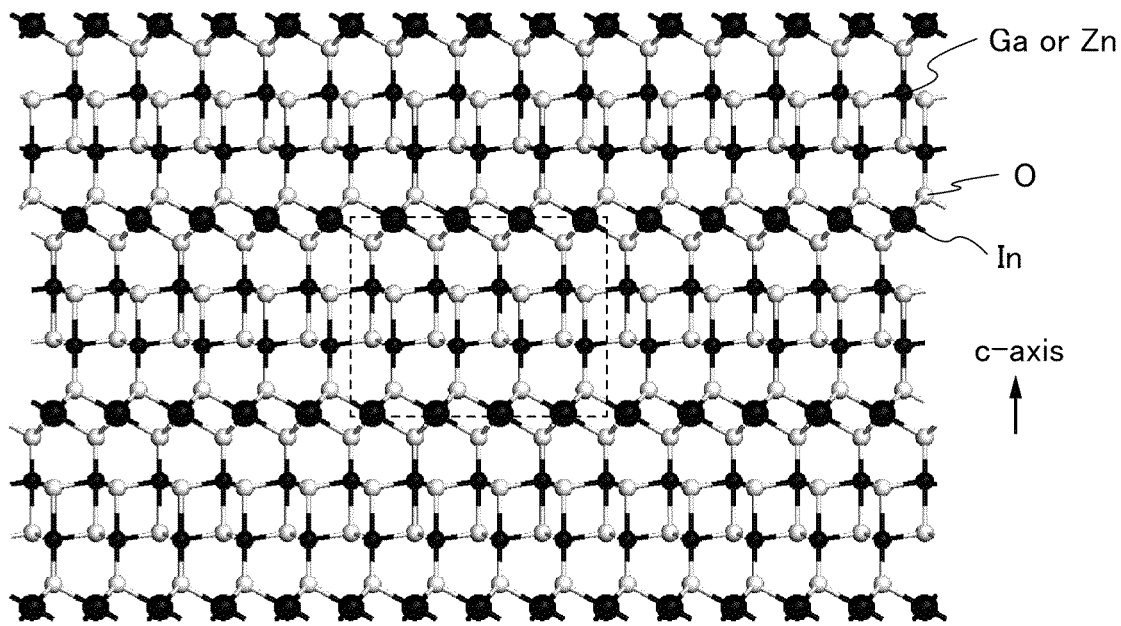
FIGS. 10A and 10B illustrate an example of a crystal structure of an In—Ga—Zn oxide.

FIG. 10A illustrates a crystal structure of an In—Ga—Zn oxide viewed from a direction parallel to an a-b plane of the crystal as an example of the target containing a polycrystalline oxide semiconductor with a high orientation. FIG. 10B illustrates an enlarged portion surrounded by a dashed line in FIG. 10A.

Figure 10B:
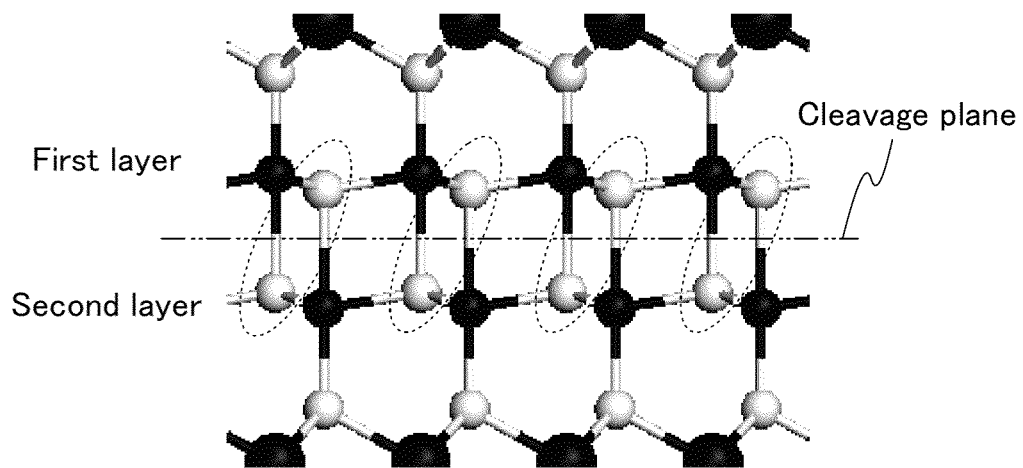

For example, in a crystal grain of an In—Ga—Zn oxide, a cleavage plane is a plane between a first layer and a second layer as illustrated in FIG. 10B. The first layer includes a gallium atom and/or zinc atom and an oxygen atom, and the second layer includes a gallium atom and/or zinc atom and an oxygen atom. This is because oxygen atoms having negative charge in the first layer and oxygen atoms having negative charge in the second layer are close to each other (see surrounded portions in FIG. 10B). In this manner, the cleavage plane is a plane parallel to an a-b plane. Further, the crystal of the In—Ga—Zn oxide shown in FIGS. 10A and 10B is a hexagonal crystal; thus the flat-plate-like crystal grain is likely to have a hexagonal prism shape with a regular hexagonal plane whose internal angle is 120°.

It is preferable that sputtered particles be positively charged. There is no particular limitation on a timing of when the sputtered particle is positively charged, but it is preferably positively charged by receiving an electric charge when an ion collides. Alternatively, in the case where plasma is generated, the sputtered particle is preferably exposed to plasma to be positively charged. Further alternatively, the ion which is an oxygen cation is preferably bonded to a side surface, a top surface, or a bottom surface of the sputtered particle, whereby the sputtered particle is positively charged.

The sputtered particles have crystals whose c-axes are aligned in a direction perpendicular to the deposition surface; accordingly, the oxide semiconductor layer 106b is a c-axis aligned crystalline oxide semiconductor (CAAC-OS) layer.

With the use of the target containing a polycrystalline oxide semiconductor with a high orientation in the above manner, the oxide semiconductor layer 106b having a uniform thickness and a uniform crystal orientation can be formed. The details of a sputtering apparatus will be described later.

The CAAC-OS is not completely single crystal nor completely amorphous. Note that in most cases, a crystal part in the CAAC-OS fits inside a cube whose one side is less than 100 nm.

In each of the crystal parts included in the CAAC-OS, a c-axis is aligned in a direction parallel to a normal vector of a surface where the CAAC-OS is formed or a normal vector of a top surface of the CAAC-OS, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 85° to 95°. In addition, a term "parallel" includes a range from −5° to 5°.

In the CAAC-OS, distribution of crystal parts is not necessarily uniform. For example, the proportion of crystal parts in the vicinity of the top surface of the CAAC-OS is higher than that in the vicinity of the surface where the CAAC-OS is formed in some cases. Further, when an impurity is added to the CAAC-OS, crystallinity of a region to which the impurity is added is lowered in some cases.

In a transistor using the CAAC-OS, change in electrical characteristics due to irradiation with visible light or ultraviolet light is small. Thus, the transistor has stable electrical characteristics.

By reducing the density of localized states of the multilayer film 106, the transistor using the multi-layer film 106 can have stable electrical characteristics. In this section, the density of localized states of the multi-layer film 106 was measured by a constant photocurrent method (CPM).

In order that the transistor has stable electrical characteristics, the absorption coefficient due to the localized level of the multi-layer film 106 measured by CPM is preferably lower than $1 \times 10^{-3}$ cm$^{-1}$, more preferably lower than $3 \times 10^{-4}$ cm$^{-1}$.

A sample on which CPM measurement was performed will be described below.

The oxide layer 106a is an oxide layer formed by a sputtering method using an In—Ga—Zn oxide (the atomic ratio of In to Ga and Zn is 1:3:2) target. Note that an argon gas (flow rate: 30 sccm) and an oxygen gas (flow rate: 15 sccm) were used as a deposition gas, the pressure was set to be 0.4 Pa, the substrate temperature was set to be 200° C., and a DC power of 0.5 kW was applied.

The oxide semiconductor layer 106b is an oxide semiconductor layer formed by a sputtering method using an In—Ga—Zn oxide (the atomic ratio of In to Ga and Zn is 1:1:1) target. Note that an argon gas (flow rate: 30 sccm) and an oxygen gas (flow rate: 15 sccm) were used as a deposition gas, the pressure was set to be 0.4 Pa, the substrate temperature was set to be 200° C., and a DC power of 0.5 kW was applied.

The oxide layer 106c is an oxide layer formed by a sputtering method using an In—Ga—Zn oxide (the atomic ratio of In to Ga and Zn is 1:3:2) target. Note that an argon gas (flow rate: 30 sccm) and an oxygen gas (flow rate: 15 sccm) were used as a deposition gas, the pressure was set to be 0.4 Pa, the substrate temperature was set to be 200° C., and a DC power of 0.5 kW was applied.

Here, in order to improve the accuracy of the CPM measurement, the multi-layer film 106 needs to have a certain thickness. Specifically, the thicknesses of the oxide layer 106a, the oxide semiconductor layer 106b, and the oxide layer 106c which are included in the multi-layer film 106 were set to be 30 nm, 100 nm, and 30 nm, respectively.

In the CPM measurement, the amount of light with which a surface of the sample between terminals is irradiated is adjusted so that a photocurrent value is kept constant in the state where voltage is applied between a first electrode and a second electrode provided in contact with the multi-layer film 106 that is the sample, and then an absorption coefficient is derived from the amount of the irradiation light at each wavelength. In the CPM measurement, when the sample has a defect, the absorption coefficient due to the energy which corresponds to the level at which the defect exists (calculated from the wavelength) is increased. The increase in the absorption coefficient is multiplied by a constant, whereby the defect density of the sample can be obtained.

Figure 11A:
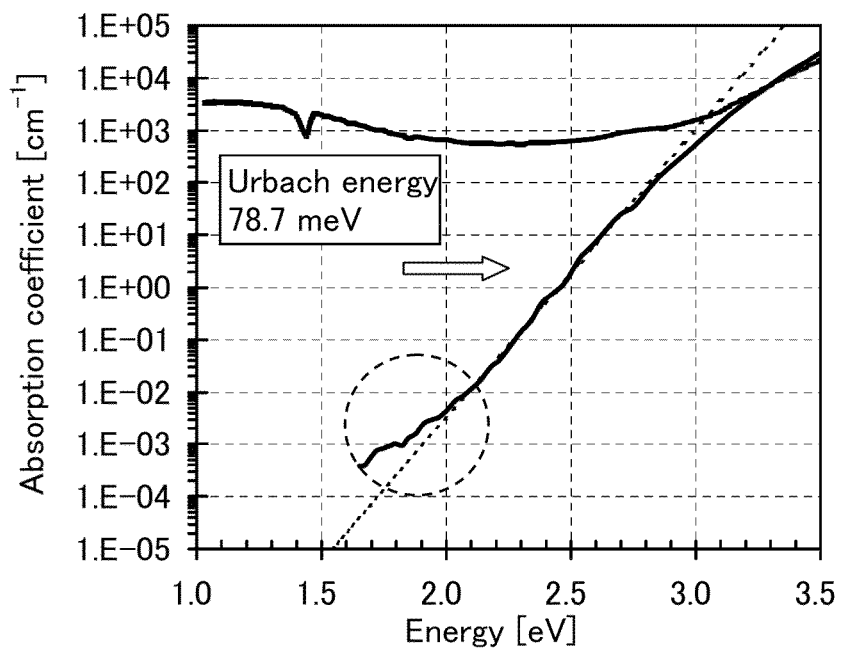
FIGS. 11A and 11B show CPM measurement results of a multi-layer film according to one embodiment of the present invention.
Figure 11B:
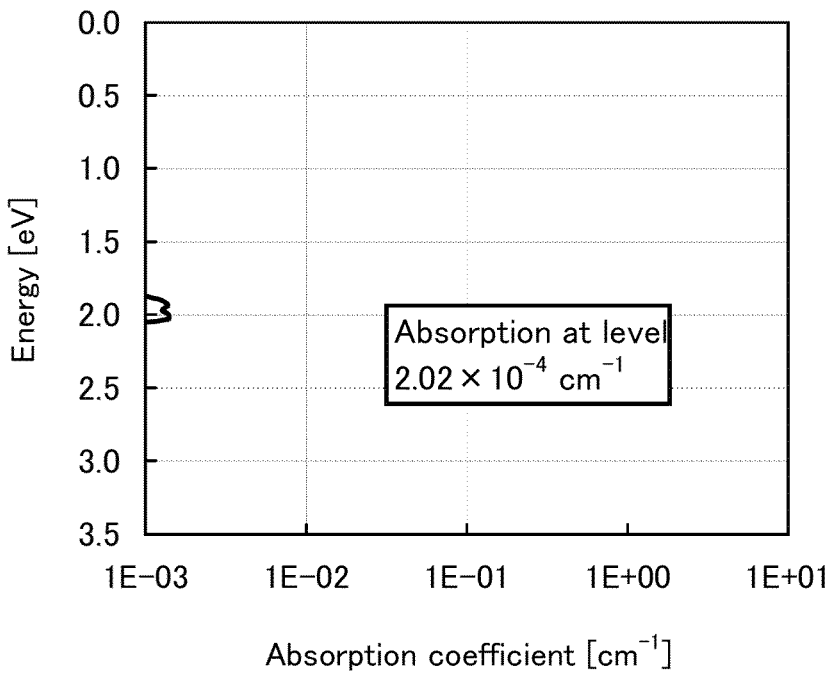

FIG. 11A shows results of fitting the absorption coefficient (broken line) measured using a spectrophotometer and the absorption coefficient (solid line) measured by CPM in the range of energy higher than or equal to the energy gap of each layer in the multi-layer film 106. Note that the Urbach energy obtained based on the absorption coefficient measured by CPM was 78.7 meV. The integral value of the absorption coefficient in the energy range was derived in such a manner that a background (dotted line) was subtracted from the absorption coefficient measured by CPM in the energy range shown with a dashed-line circle in FIG. 11A (see FIG. 11B). As a result, the absorption coefficient due to the localized level of this sample was found to be $2.02 \times 10^4$ cm$^{-1}$.

The localized level obtained here is probably due to an impurity or a defect. From the above, there are extremely few levels due to an impurity or a defect in the multi-layer film 106. That is, the transistor including the multi-layer film 106 has stable electrical characteristics.

A film formation apparatus for forming the oxide semiconductor layer 106b with a high degree of crystallinity will be described below.

First, a structure of a film formation apparatus which allows the entry of few impurities during film formation is described with reference to FIGS. 12A and 12B.

Figure 12A:
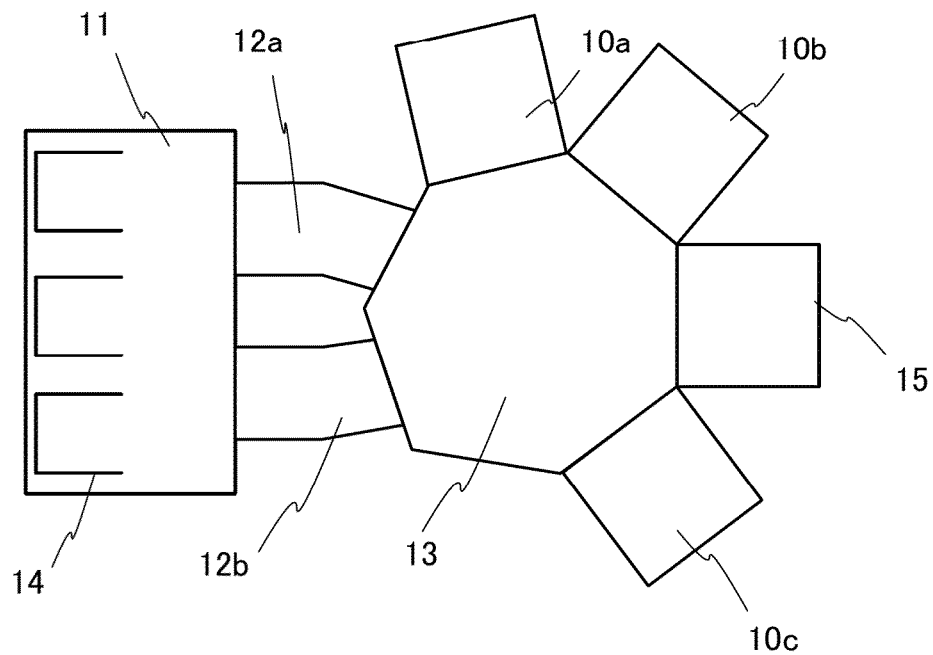
FIGS. 12A and 12B are each a top view illustrating an example of a film formation apparatus.

FIG. 12A illustrates a multi-chamber film formation apparatus. The film formation apparatus includes a substrate supply chamber 11 provided with three cassette ports 14 for holding substrates, load lock chambers 12a and 12b, a transfer chamber 13, a substrate heating chamber 15, and film formation chambers 10a, 10b, and 10c. The substrate supply chamber 11 is connected to the load lock chambers 12a and 12b. The load lock chambers 12a and 12b are connected to the transfer chamber 13. The substrate heating chamber 15 and the film formation chambers 10a to 10c are each connected only to the transfer chamber 13. A gate valve is provided for a connecting portion between chambers so that each chamber can be independently kept in a vacuum state. Although not illustrated, the transfer chamber 13 has one or more substrate transfer robots. Here, the substrate heating chamber 15 preferably also serves as a plasma treatment chamber. With a multi-chamber film formation apparatus, it is possible to transfer a substrate without exposure to the air between treatments, and adsorption of impurities to a substrate can be suppressed. In addition, the order of film formation, heat treatment, or the like can be freely determined. Note that the number of the film formation chambers, the number of the load lock chambers, and the number of the substrate heating chambers are not limited to the above, and can be determined as appropriate depending on the space for placement or the process.

Evacuation of the film formation chamber (sputtering chamber) illustrated in FIG. 12A will be described with reference to FIG. 13. A film formation chamber 10 includes a target 32 and a target holder 34 for holding the target.

Figure 13:
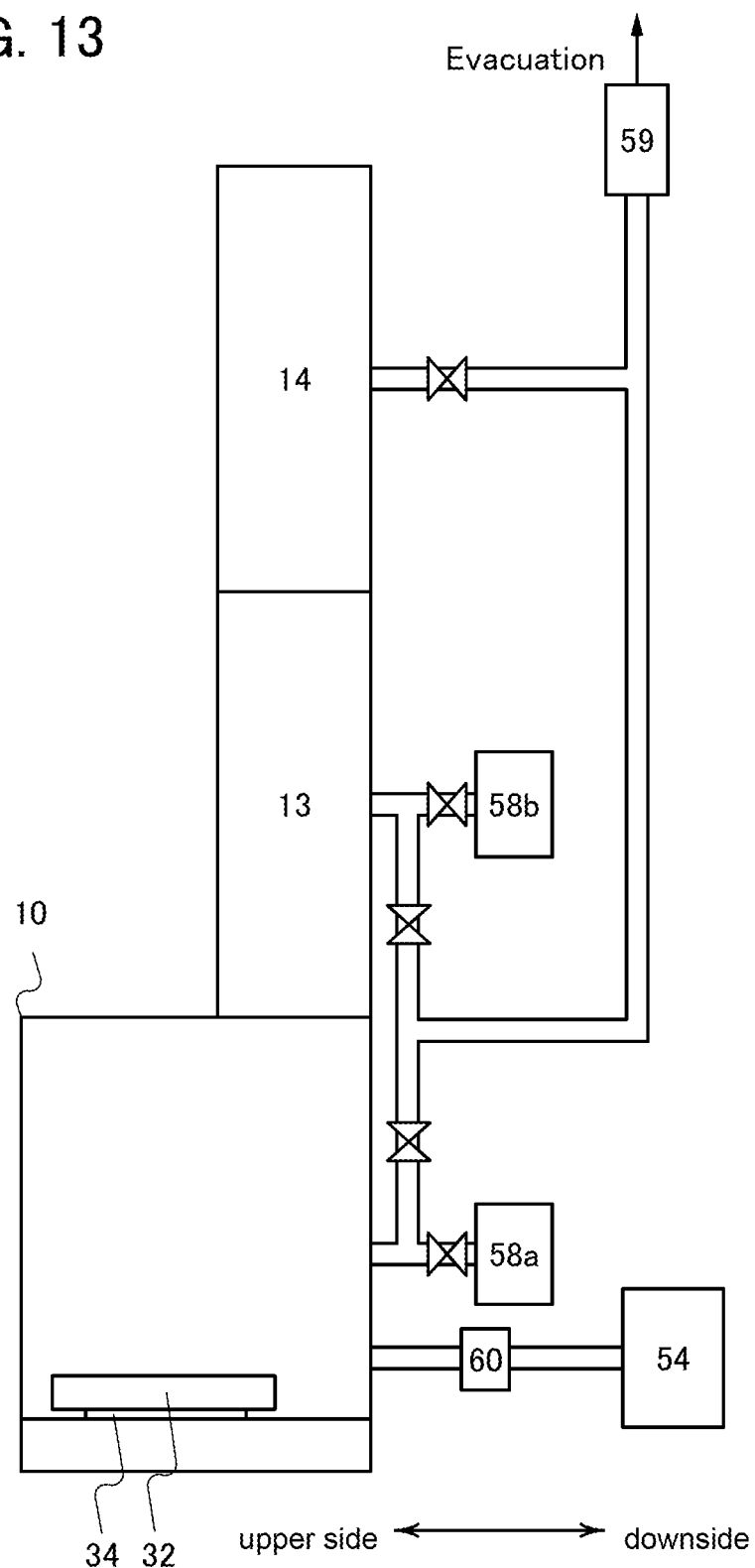
FIG. 13 illustrates an example of a film formation chamber.

The film formation chamber 10 illustrated in FIG. 13 is connected to the transfer chamber 13 through a gate valve, and the transfer chamber 13 is connected to the cassette port 14 through a gate valve.

The film formation chamber 10 in FIG. 13 is connected to a refiner 54 through a mass flow controller 60. Note that although the refiner 54 and the mass flow controller 60 are provided for each of a plurality of kinds of gases, only one refiner 54 and one mass flow controller 60 are illustrated for simplicity, and the others are not illustrated here. As a gas introduced to the film formation chamber 10 or the like, a gas whose dew point is −80° C. or lower, preferably −100° C. or lower is used. With the use of an oxygen gas, a rare gas (e.g., an argon gas), or the like whose dew point is low, moisture entering a film at the time of deposition can be reduced.

The film formation chamber 10 in FIG. 13 is connected to a cryopump 58a through a valve.

The transfer chamber 13 in FIG. 13 is connected to a cryopump 58b through a valve.

The cassette port 14 in FIG. 13 is connected to a vacuum pump 59 through a valve.

Note that the vacuum pump 59 may be a pump in which a dry pump and a mechanical booster pump are connected in series, for example. In this case, the mechanical booster pump of the vacuum pump 59 is connected to the film formation chamber 10 and the transfer chamber 13 through valves. With such a structure, evacuation can be performed using the vacuum pump 59 when the pressure inside the film formation chamber 10 is in the range of atmospheric pressure to low vacuum (about 0.1 Pa to 10 Pa) and then, by switching the valves, evacuation can be performed using the cryopump 58a or 58b when the pressure inside the film formation chamber 10 is in the range of low vacuum to high vacuum ($1 \times 10^{-4}$ Pa to $1 \times 10^{-7}$ Pa).

In a similar manner, an evacuation example of the film formation chamber in FIG. 12A will be described with reference to FIG. 14.

Figure 14:
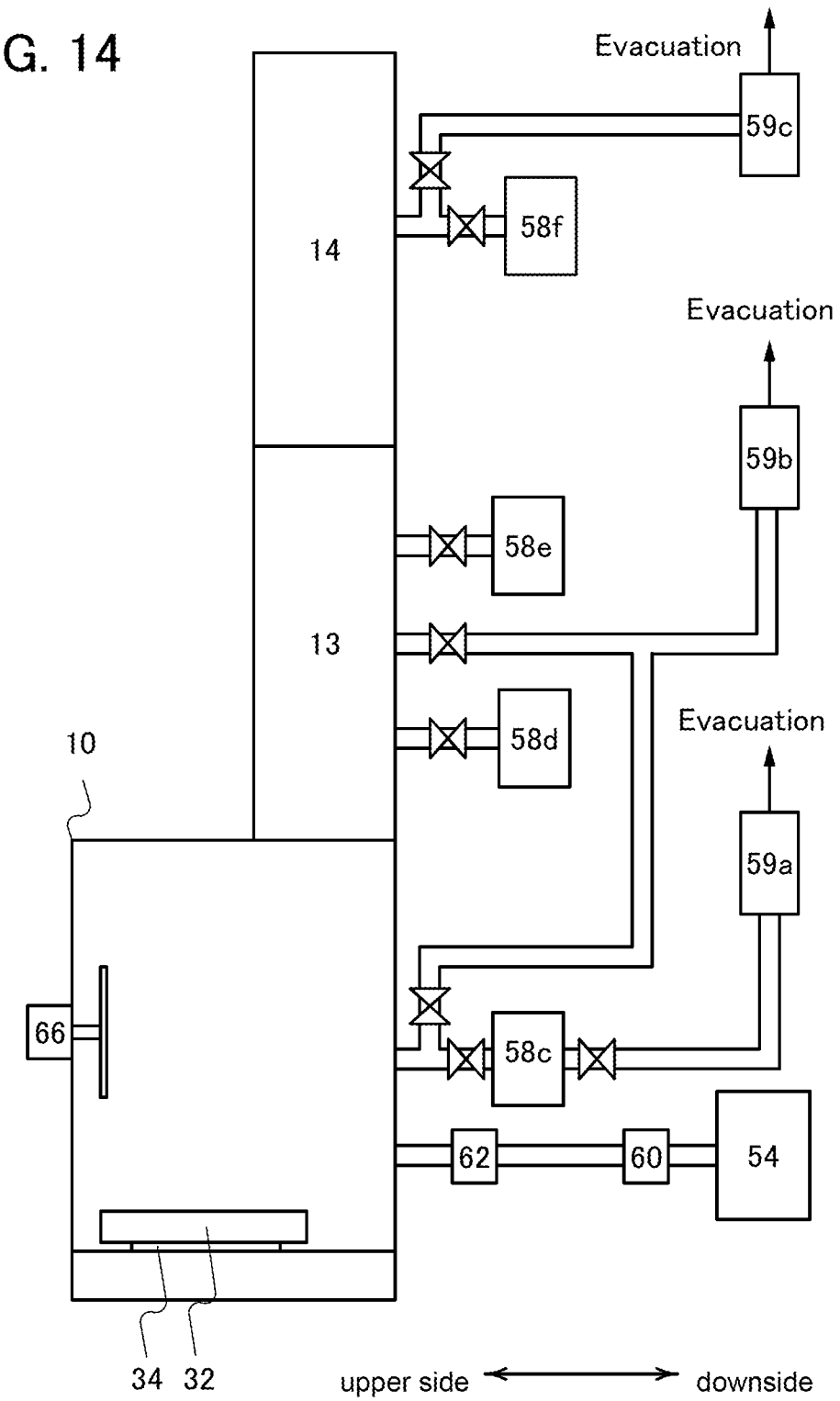
FIG. 14 illustrates an example of a film formation chamber.

The film formation chamber 10 illustrated in FIG. 14 is connected to the transfer chamber 13 through a gate valve, and the transfer chamber 13 is connected to the cassette port 14 through a gate valve.

The film formation chamber 10 illustrated in FIG. 14 is connected to a mass flow controller 60 through a gas heating system 62, and the gas heating system 62 is connected to the refiner 54 through the mass flow controller 60. With the gas heating system 62, a gas which is introduced to the film formation chamber 10 can be heated to a temperature higher than or equal to 40° C. and lower than or equal to 400° C., preferably higher than or equal to 50° C. and lower than or equal to 200° C. Note that although the gas heating system 62, the refiner 54, and the mass flow controller 60 are provided for each of a plurality of kinds of gases, only one gas heating system 62, one refiner 54, and one mass flow controller 60 are illustrated for simplicity and the others are not illustrated here.

The film formation chamber 10 illustrated in FIG. 14 is connected to a turbo molecular pump 58c through a valve. Note that as an auxiliary pump, a vacuum pump 59a is provided for the turbo molecular pump 58c through a valve. The vacuum pump 59a may have a structure similar to that of the vacuum pump 59.

In addition, the film formation chamber 10 illustrated in FIG. 14 is provided with a cryotrap 66.

It is known that the turbo molecular pump 58c is capable of stably evacuating a large-sized molecule, needs low frequency of maintenance, and thus enables high productivity, whereas it has a low capability in evacuating hydrogen and water. Hence, the cryotrap 66 having a high capability in evacuating a molecule having a relatively high melting point, such as water, is connected to the film formation chamber 10. The temperature of a refrigerator of the cryotrap 66 is set to be lower than or equal to 100 K, preferably lower than or equal to 80 K. In the case where the cryotrap 66 includes a plurality of refrigerators, it is preferable to set the temperature of each refrigerator at a different temperature because efficient evacuation is possible. For example, the temperature of a first-stage refrigerator may be set to be lower than or equal to 100 K and the temperature of a second-stage refrigerator may be set to be lower than or equal to 20 K.

The transfer chamber 13 in FIG. 14 is connected to cryopumps 58$d$ and 58$e$ through valves. In the case of one cryopump, evacuation cannot be performed while the cryopump is in regeneration; however, in the case of two or more cryopumps which are connected in parallel, even when one of the cryopumps is in regeneration, evacuation can be performed using any of the other cryopumps. Note that regeneration of a cryopump refers to treatment for discharging molecules entrapped in the cryopump. When molecules are entrapped too much in a cryopump, the evacuation capability of the cryopump is lowered; therefore, regeneration is performed regularly.

The cassette port 14 in FIG. 14 is connected to a cryopump 58$f$ and a vacuum pump 59$c$ through valves.

A vacuum pump 59$b$ is connected to the film formation chamber 10 and the transfer chamber 13 through valves. Note that the vacuum pump 59$b$ may have a structure similar to that of the vacuum pump 59.

In the film formation chamber 10, a facing-target-type sputtering apparatus may be employed. A specific positional relation between targets, magnets, and a substrate holder is described with reference to FIG. 13 and FIG. 14.

Note that a parallel-plate-type sputtering apparatus or an ion beam sputtering apparatus may be provided in the film formation chamber 10.

Next, an evacuation example of the substrate heating chamber in FIG. 12A will be described with reference to FIG. 15.

Figure 15:
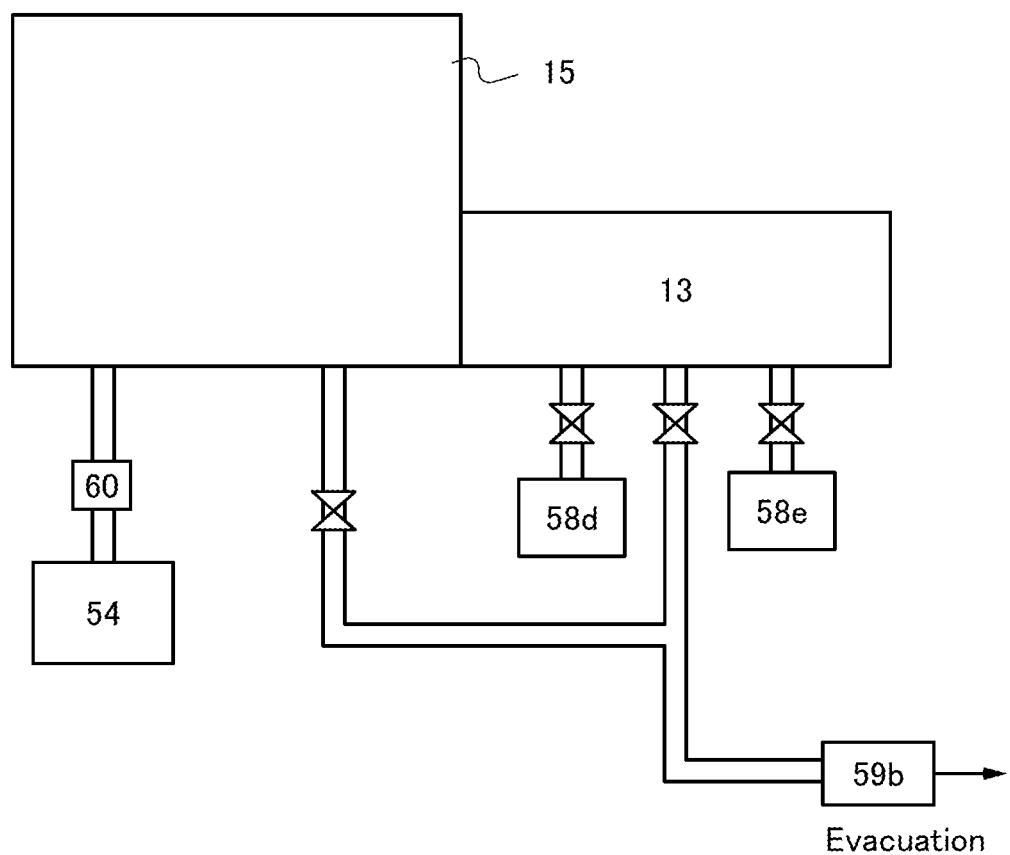
FIG. 15 illustrates an example of a heat treatment chamber.

The substrate heating chamber 15 illustrated in FIG. 15 is connected to the transfer chamber 13 through a gate valve. Note that the transfer chamber 13 is connected to a load lock chamber through a gate valve, which is not illustrated here. The load lock chamber is evacuated as illustrated in FIG. 14.

The substrate heating chamber 15 in FIG. 15 is connected to the refiner 54 through the mass flow controller 60. Note that although the refiner 54 and the mass flow controller 60 are provided for each of a plurality of kinds of gases, only one refiner 54 and one mass flow controller 60 are illustrated for simplicity, and the others are not illustrated here.

The substrate heating chamber 15 in FIG. 15 is connected to the vacuum pump 59$b$ through a valve.

The substrate heating chamber 15 may be provided with a stage on which a plurality of substrates can be set. In the substrate heating chamber 15, for example, a resistance heater or the like may be used for heating. Alternatively, heat conduction or heat radiation from a medium such as a heated gas may be used for heating. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, heat treatment is performed using a high-temperature gas. An inert gas is used as the gas.

In each of the film formation chamber 10 and the substrate heating chamber 15, the back pressure is less than or equal to $1 \times 10^{-4}$ Pa, preferably less than or equal to $3 \times 10^{-5}$ Pa, more preferably less than or equal to $1 \times 10^{-5}$ Pa.

In each of the film formation chamber 10 and the substrate heating chamber 15, the partial pressure of a gas molecule (atom) having a mass-to-charge ratio (m/z) of 18 is less than or equal to $3 \times 10^{-5}$ Pa, preferably less than or equal to $1 \times 10^{-5}$ Pa, more preferably less than or equal to $3 \times 10^{-6}$ Pa.

Moreover, in each of the film formation chamber 10 and the substrate heating chamber 15, the partial pressure of a gas molecule (atom) having a mass-to-charge ratio (m/z) of 28 is less than or equal to $3 \times 10^{-5}$ Pa, preferably less than or equal to $1 \times 10^{-5}$ Pa, more preferably less than or equal to $3 \times 10^{-6}$ Pa.

Further, in each of the film formation chamber 10 and the substrate heating chamber 15, the partial pressure of a gas molecule (atom) having a mass-to-charge ratio (m/z) of 44 is less than or equal to $3 \times 10^{-5}$ Pa, preferably less than or equal to $1 \times 10^{-5}$ Pa, more preferably less than or equal to $3 \times 10^{-6}$ Pa.

Further, in each of the film formation chamber 10 and the substrate heating chamber 15, the leakage rate is less than or equal to $3 \times 10^{-6}$ Pa·m$^3$/s, preferably less than or equal to $1 \times 10^{-6}$ Pa·m$^3$/s.

In each of the film formation chamber 10 and the substrate heating chamber 15, the leakage rate of a gas molecule (atom) having a mass-to-charge ratio (m/z) of 18 is less than or equal to $1 \times 10^{-7}$ Pa·m$^3$/s, preferably less than or equal to $3 \times 10^{-8}$ Pa·m$^3$/s.

In each of the film formation chamber 10 and the substrate heating chamber 15, the leakage rate of a gas molecule (atom) having a mass-to-charge ratio (m/z) of 28 is less than or equal to $1 \times 10^{-5}$ Pa·m$^3$/s, preferably less than or equal to $1 \times 10^{-6}$ Pa·m$^3$/s.

In each of the film formation chamber 10 and the substrate heating chamber 15, the leakage rate of a gas molecule (atom) having a mass-to-charge ratio (m/z) of 44 is less than or equal to $3 \times 10^{-6}$ Pa·m$^3$/s, preferably less than or equal to $1 \times 10^{-6}$ Pa·m$^3$/s.

Note that a total pressure and a partial pressure can be measured using a mass analyzer. For example, Qulee CGM-051, a quadrupole mass analyzer (also referred to as Q-mass) manufactured by ULVAC, Inc. may be used. Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate is set to be less than or equal to the above value.

For example, an open/close portion of the film formation chamber can be sealed with a metal gasket. For the metal gasket, metal covered with iron fluoride, aluminum oxide, or chromium oxide is preferably used. The metal gasket realizes higher adhesion than an O-ring, and can reduce the external leakage. Further, with the use of the metal covered with iron fluoride, aluminum oxide, chromium oxide, or the like, which is in the passive state, the release of gas containing impurities released from the metal gasket is suppressed, so that the internal leakage can be reduced.

For a member of the film formation apparatus, aluminum, chromium, titanium, zirconium, nickel, or vanadium, which releases a smaller amount of gas containing impurities, is used. Alternatively, an alloy containing iron, chromium, nickel, and the like covered with the above member may be used. The alloy containing iron, chromium, nickel, and the like is rigid, resistant to heat, and suitable for processing. Here, when surface unevenness of the member is decreased by polishing or the like to reduce the surface area, the release of gas can be reduced.

Alternatively, the above member of the film formation apparatus may be covered with iron fluoride, aluminum oxide, chromium oxide, or the like.

The member of the film formation apparatus is preferably formed with only metal as much as possible. For example, in the case where a viewing window formed with quartz or the like is provided, it is preferable that the surface of the viewing window be thinly covered with iron fluoride, aluminum oxide, chromium oxide, or the like so as to suppress release of gas.

In the case where the refiner is provided just before a deposition gas is introduced, the length of a pipe between the refiner and the film formation chamber is less than or equal to 10 m, preferably less than or equal to 5 m, further preferably less than or equal to 1 m. When the length of the pipe is less than or equal to 10 m, less than or equal to 5 m, or less than or equal to 1 m, the effect of the release of gas from the pipe can be reduced accordingly.

As the pipe of the deposition gas, a metal pipe the inside of which is covered with iron fluoride, aluminum oxide, chromium oxide, or the like may be used. With the above pipe, the amount of released gas containing impurities is made small and the entry of impurities into the deposition gas can be reduced as compared with a SUS316L-EP pipe, for example. Further, a high-performance ultra-compact metal gasket joint (a UPG joint) is preferably used as a joint of the pipe. A structure where all the materials of the pipe are metals is preferable because the effect of the generated released gas or the external leakage can be reduced compared with a structure where resin or the like is used.

When an adsorbate is present in the film formation chamber, the adsorbate does not affect the pressure in the film formation chamber because it is adsorbed onto an inner wall or the like; however, the adsorbate causes gas to be released when the inside of the film formation chamber is evacuated. Therefore, although there is no correlation between the leakage rate and the evacuation rate, it is important that the adsorbate present in the film formation chamber be desorbed as much as possible and evacuation be performed in advance with the use of a pump with high evacuation capability. Note that the film formation chamber may be subjected to baking to promote desorption of the adsorbate. By the baking, the desorption rate of the adsorbate can be increased about tenfold. The baking can be performed at a temperature in the range of 100° C. to 450° C. At this time, when the adsorbate is removed while an inert gas is introduced to the film formation chamber, the desorption rate of water or the like, which is difficult to be desorbed simply by evacuation, can be further increased. Note that when the inert gas which is introduced is heated to substantially the same temperature as the baking temperature of the film formation chamber, the desorption rate of the adsorbate can be further increased. Here, a rare gas is preferably used as an inert gas. Depending on the kind of a film to be formed, oxygen or the like may be used instead of an inert gas. For example, in the case of forming an oxide semiconductor layer, the use of oxygen which is the main component of the oxide semiconductor layer is preferable in some cases.

Alternatively, treatment for evacuating the inside of the film formation chamber is preferably performed a certain period of time after heated oxygen, a heated inert gas such as a heated rare gas, or the like is introduced to increase a pressure in the film formation chamber. The introduction of the heated gas can desorb the adsorbate in the film formation chamber, and the impurities present in the film formation chamber can be reduced. Note that an advantageous effect can be achieved when this treatment is repeated more than or equal to twice and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the film formation chamber, so that the pressure therein can be kept to be greater than or equal to 0.1 Pa and less than or equal to 10 kPa, preferably greater than or equal to 1 Pa and less than or equal to 1 kPa, more preferably greater than or equal to 5 Pa and less than or equal to 100 Pa in the time range of 1 minute to 300 minutes, preferably 5 minutes to 120 minutes. After that, the inside of the film formation chamber is evacuated in the time range of 5 minutes to 300 minutes, preferably 10 minutes to 120 minutes.

The desorption rate of the adsorbate can be further increased also by dummy film formation. Here, the dummy film formation refers to film formation on a dummy substrate by a sputtering method or the like, in which a film is deposited on the dummy substrate and the inner wall of the film formation chamber so that impurities in the film formation chamber and an adsorbate on the inner wall of the film formation chamber are confined in the film. For the dummy substrate, a substrate which releases a smaller amount of gas is preferably used, and for example, a substrate similar to a substrate 100 which is to be described later may be used. By performing dummy film formation, the concentration of impurities in a film which will be formed later can be reduced. Note that the dummy film formation may be performed at the same time as the baking of the film formation chamber.

Figure 12B:
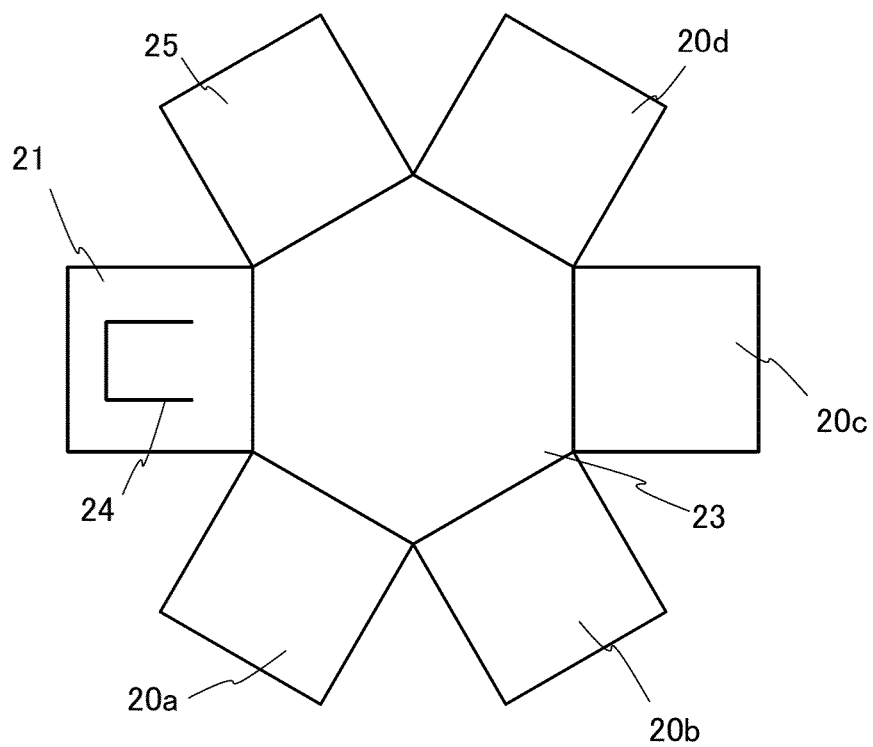

FIG. 12B illustrates a multi-chamber film formation apparatus whose structure is different from that illustrated in FIG. 12A. The film formation apparatus includes a substrate supply chamber 21 provided with a cassette port 24, a transfer chamber 23, a substrate heating chamber 25, a film formation chamber 20a, a film formation chamber 20b, a film formation chamber 20c, and a film formation chamber 20d. The substrate supply chamber 21, the substrate heating chamber 25, the film formation chamber 20a, the film formation chamber 20b, the film formation chamber 20c, and the film formation chamber 20d are connected to one another through the transfer chamber 23. Gate valves are provided for connecting portions between chambers so that each chamber can be independently kept under vacuum. Note that the film formation chambers 20a, 20b, 20c, and 20d have structures similar to those of the film formation chambers 10a, 10b, and 10c in FIG. 12A. The substrate heating chamber 25 has a structure similar to that of the substrate heating chamber 15 in FIG. 12A. A substrate is transferred in only one direction indicated by arrows in FIG. 12B, and an inlet and an outlet for the substrate are different.

When an oxide semiconductor layer is formed with the use of the above film formation apparatus, the entry of impurities into the oxide semiconductor layer can be suppressed. Further, when a film in contact with the oxide semiconductor layer is formed with the use of the above film formation apparatus, the entry of impurities into the oxide semiconductor layer from the film in contact therewith can be suppressed.

Next, a method for forming a CAAC-OS with the use of the above film formation apparatus will be described.

The surface temperature of the target is set to be lower than or equal to 100° C., preferably lower than or equal to 50° C., more preferably about room temperature (typically, 20° C. or 25° C.). In a sputtering apparatus for a large substrate, a large target is often used. However, it is difficult to form a target for a large substrate without a juncture. In fact, a plurality of targets are arranged so that there is as little space as possible therebetween to obtain a large shape; however, a slight space is inevitably generated. When the surface temperature of the target increases, in some cases, Zn or the like is volatilized from such a slight space and the space might be expanded gradually. When the space expands, a metal of a backing plate or a metal used for adhesion might be sputtered and might cause an increase in impurity concentration. Thus, it is preferable that the target be cooled sufficiently.

Specifically, for the backing plate, a metal having high conductivity and a high heat dissipation property (specifically Cu) is used. The target can be cooled efficiently by making a sufficient amount of cooling water flow through a water channel which is formed in the backing plate. Here, the sufficient amount of cooling water, which depends on the size of the target, is set to be greater than or equal to 3 L/min, greater than or equal to 5 L/min, or greater than or equal to 10 L/min in the case of, for example, a circular target whose diameter is 300 mm.

The CAAC-OS is formed in an oxygen gas atmosphere with a substrate heating temperature higher than or equal to 100° C. and lower than or equal to 600° C., preferably higher than or equal to 150° C. and lower than or equal to 550° C., more preferably higher than or equal to 200° C. and lower than or equal to 500° C. The thickness of the CAAC-OS is greater than or equal to 1 nm and less than or equal to 40 nm, preferably greater than or equal to 3 nm and less than or equal to 20 nm. As the substrate heating temperature at the time of the film formation is higher, the concentration of impurities in the obtained CAAC-OS is lower. Further, migration of sputtered particles on a deposition surface is likely to occur; therefore, the atomic arrangement is ordered and the density is increased, so that a CAAC-OS with a high degree of crystallinity is formed easily. Furthermore, when the film formation is performed in an oxygen gas atmosphere, plasma damage is alleviated and a surplus atom such as a rare gas atom is not contained in the CAAC-OS, whereby a CAAC-OS with a high degree of crystallinity is formed easily. Note that the film formation may be performed in a mixed atmosphere including an oxygen gas and a rare gas. In that case, the percentage of an oxygen gas is set to be greater than or equal to 30 vol. %, preferably greater than or equal to 50 vol. %, more preferably greater than or equal to 80 vol. %, still more preferably 100 vol. %.

Note that in the case where the target includes Zn, plasma damage is alleviated by the film formation in an oxygen gas atmosphere; thus, a CAAC-OS in which Zn is unlikely to be volatilized can be obtained.

The CAAC-OS is formed under conditions in which the film formation pressure is set to be less than or equal to 0.8 Pa, preferably less than or equal to 0.4 Pa, and the distance between the target and a substrate is set to be less than or equal to 40 mm, preferably less than or equal to 25 mm. When the CAAC-OS is formed under such a condition, the frequency of the collision between a sputtered particle and another sputtered particle, a gas molecule, or an ion can be reduced. That is, depending on the film formation pressure, the distance between the target and the substrate is made shorter than the mean free path of a sputtered particle, a gas molecule, or an ion, so that the concentration of impurities entering the film can be reduced.

For example, when the pressure is set to be 0.4 Pa and the temperature is set to be 25° C. (the absolute temperature is 298 K), a hydrogen molecule ($H_2$) has a mean free path of 48.7 mm, a helium atom (He) has a mean free path of 57.9 mm, a water molecule ($H_2O$) has a mean free path of 31.3 mm, a methane molecule ($CH_4$) has a mean free path of 13.2 mm, a neon atom (Ne) has a mean free path of 42.3 mm, a nitrogen molecule ($N_2$) has a mean free path of 23.2 mm, a carbon monoxide molecule (CO) has a mean free path of 16.0 mm, an oxygen molecule ($O_2$) has a mean free path of 26.4 mm, an argon atom (Ar) has a mean free path of 28.3 mm, a carbon dioxide molecule ($CO_2$) has a mean free path of 10.9 mm, a krypton atom (Kr) has a mean free path of 13.4 mm, and a xenon atom (Xe) has a mean free path of 9.6 mm. Note that doubling of the pressure halves a mean free path and doubling of the absolute temperature doubles a mean free path.

The mean free path depends on pressure, temperature, and the diameter of a molecule (atom). In the case where pressure and temperature are constant, as the diameter of a molecule (atom) is larger, the mean free path is shorter. Note that the diameters of the molecules (atoms) are as follows: $H_2$: 0.218 nm; He: 0.200 nm; $H_2O$: 0.272 nm; $CH_4$: 0.419 nm; Ne: 0.234 nm; $N_2$: 0.316 nm; CO: 0.380 nm; $O_2$: 0.296 nm; Ar: 0.286 nm; $CO_2$: 0.460 nm; Kr: 0.415 nm; and Xe: 0.491 nm.

Thus, as the diameter of a molecule (atom) is larger, the mean free path is shorter and the degree of crystallinity is lowered due to the large diameter of the molecule (atom) when the molecule (atom) enters the film. For this reason, it can be said that, for example, a molecule (atom) whose diameter is larger than that of Ar is likely to behave as an impurity.

Next, heat treatment is performed. The heat treatment is performed under reduced pressure or in an inert atmosphere or an oxidation atmosphere. By the heat treatment, the concentration of impurities in the CAAC-OS can be reduced.

The heat treatment is preferably performed in a manner such that after heat treatment is performed under reduced pressure or in an inert atmosphere, the atmosphere is switched to an oxidation atmosphere with the temperature maintained and heat treatment is further performed. When the heat treatment is performed under reduced pressure or in an inert atmosphere, the concentration of impurities in the CAAC-OS can be reduced; however, oxygen vacancies are caused at the same time. By the heat treatment in an oxidation atmosphere, the caused oxygen vacancies can be reduced.

When heat treatment is performed on the CAAC-OS in addition to the substrate heating at the time of the film formation, the concentration of impurities in the film can be reduced.

Specifically, the concentration of hydrogen in the CAAC-OS, which is measured by SIMS, can be set to be lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$.

The concentration of nitrogen in the CAAC-OS, which is measured by SIMS, can be set to be lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

The concentration of carbon in the CAAC-OS, which is measured by SIMS, can be set to be lower than $5 \times 10^{19}$ atoms/cm$^3$, preferably lower than or equal to $5 \times 10^{18}$ atoms/cm$^3$, more preferably lower than or equal to $1\times10^{18}$ atoms/cm$^3$, still more preferably lower than or equal to $5\times10^{17}$ atoms/cm$^3$.

The amount of each of the following gas molecules (atoms) released from the CAAC-OS can be less than or equal to $1\times10^{19}$/cm$^3$, preferably less than or equal to $1\times10^{18}$/cm$^3$, which is measured by TDS analysis: a gas molecule (atom) having a mass-to-charge ratio (m/z) of 2 (e.g., hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

A measurement method of the amount of released oxygen atoms, which will be described later, is referred to for a measurement method of the release amount using TDS analysis.

In the above manner, a CAAC-OS with a high degree of crystallinity can be formed.

A transistor including the multi-layer film 106 will be described below.

Here, a bottom-gate top-contact (BGTC) transistor, which is one kind of bottom-gate transistor, is described with reference to FIGS. 16A to 16D.

Figure 16A:
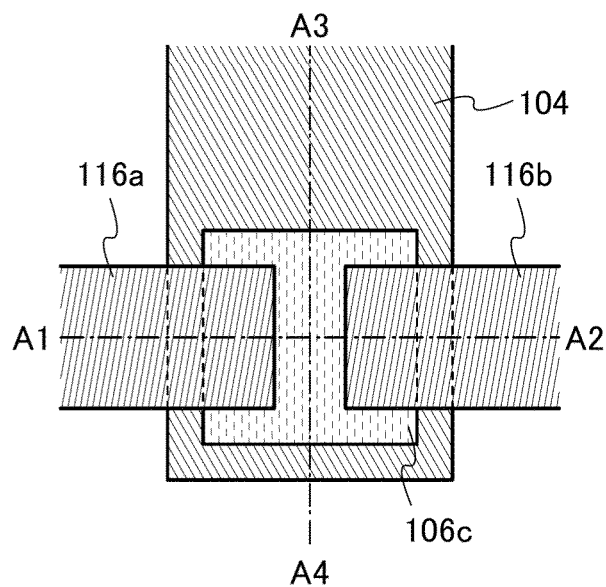
FIGS. 16A to 16D are a top view and cross-sectional views illustrating a semiconductor device according to one embodiment of the present invention.
Figure 16C:
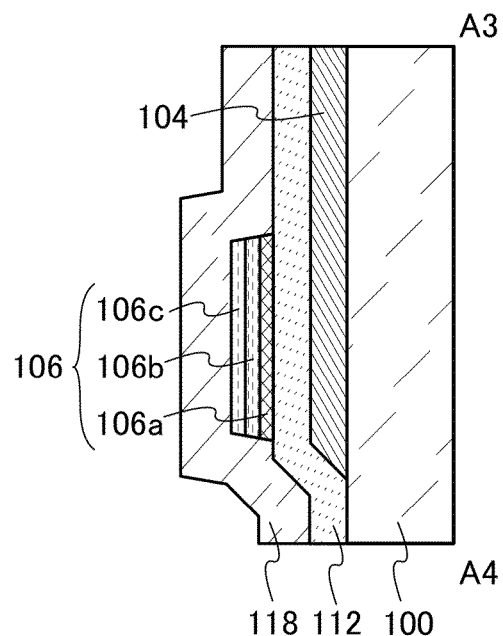
Figure 16B:
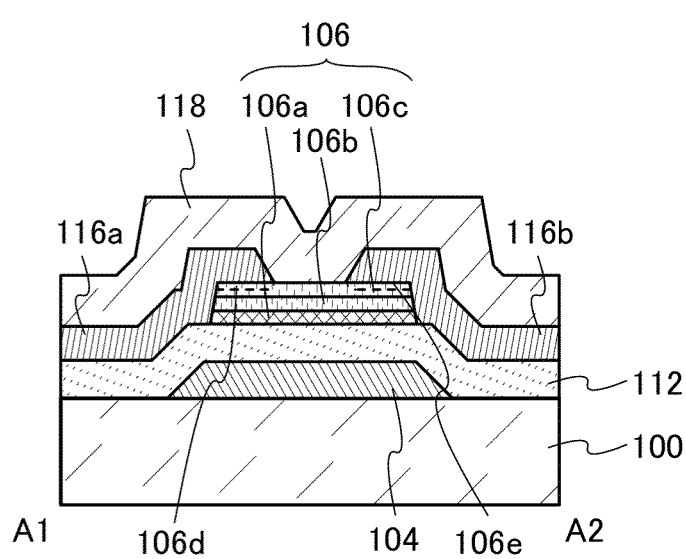

FIGS. 16A to 16D are a top view and cross-sectional views of the BGTC transistor. FIG. 16A is the top view of the transistor. FIG. 16B is the cross-sectional view taken along dashed-dotted line A1-A2 in FIG. 16A. FIG. 16C is the cross-sectional view taken along dashed-dotted line A3-A4 in FIG. 16A.

The transistor illustrated in FIG. 16B includes a gate electrode 104 over the substrate 100; a gate insulating film 112 over the gate electrode 104; the multi-layer film 106 including the oxide layer 106a over the gate insulating film 112, the oxide semiconductor layer 106b over the oxide layer 106a, and the oxide layer 106c over the oxide semiconductor layer 106b; a source electrode 116a and a drain electrode 116b over the gate insulating film 112 and the multi-layer film 106; and a protective insulating film 118 over the multi-layer film 106, the source electrode 116a, and the drain electrode 116b.

The source electrode 116a and the drain electrode 116b are in contact with side edges of the oxide semiconductor layer 106b.

Further, as illustrated in FIG. 16B, oxygen is taken away from part of the oxide layer 106c depending on the kind of conductive film used for the source electrode 116a and the drain electrode 116b so that a source region 106d and a drain region 106e are formed.

In FIG. 16A, the distance between the source electrode 116a and the drain electrode 116b in a region of the multi-layer film 106 overlapping with the gate electrode 104 is referred to as a channel length. Note that in the case where the transistor includes the source region 106d and the drain region 106e, the distance between the source region 106d and the drain region 106e in the region overlapping with the gate electrode 104 may be referred to as a channel length.

Note that a channel formation region refers to a region which overlaps with the gate electrode 104 and is located between the source electrode 116a and the drain electrode 116b when seen from above in the multi-layer film 106 (see FIG. 16B). Further, a channel refers to a region through which current mainly flows in the channel formation region. Here, the channel refers to a portion of the oxide semiconductor layer 106b in the channel formation region.

The multi-layer film 106, and the oxide layer 106a, the oxide semiconductor layer 106b, and the oxide layer 106c in the multi-layer film 106 will be described below. Note that the description in another section can be referred to for the multi-layer film 106.

The oxide layer 106a contains one or more kinds of metal elements contained in the oxide semiconductor layer 106b. The energy at the bottom of the conduction band of the oxide layer 106a is located closer to the vacuum level than that of the oxide semiconductor layer 106b by 0.05 eV or more, 0.07 eV or more, 0.1 eV or more, or 0.15 eV or more and 2 eV or less, 1 eV or less, 0.5 eV or less, or 0.4 eV or less. Note that the oxide semiconductor layer 106b preferably contains at least indium in order that the carrier mobility is high. When an electric field is applied to the gate electrode 104 at this time, a channel is formed in the oxide semiconductor layer 106b of the multi-layer film 106, whose energy at the bottom of the conduction band is low. That is, the oxide layer 106a is formed between the oxide semiconductor layer 106b and the gate insulating film 112, whereby a channel of the transistor can be formed in the oxide semiconductor layer 106b which is not in contact with the gate insulating film 112. Further, since the oxide layer 106a contains one or more kinds of elements contained in the oxide semiconductor layer 106b, interface scattering is unlikely to occur at the interface between the oxide semiconductor layer 106b and the oxide layer 106a. Thus, the transistor can have a high field-effect mobility because the movement of carriers is not hindered at the interface.

The oxide layer 106a may contain, for example, aluminum, silicon, titanium, gallium, germanium, yttrium, zirconium, tin, lanthanum, cerium, or hafnium at a higher atomic ratio than the oxide semiconductor layer 106b. Specifically, the amount of any of the above elements in the oxide layer 106a in an atomic ratio is 1.5 times or more, preferably twice or more, more preferably three times or more as much as that in the oxide semiconductor layer 106b in an atomic ratio. Any of the above elements is strongly bonded to oxygen and thus has a function of suppressing generation of an oxygen vacancy in the oxide layer 106a. That is, an oxygen vacancy is more unlikely to be generated in the oxide layer 106a than in the oxide semiconductor layer 106b.

Alternatively, when each of the oxide layer 106a and the oxide semiconductor layer 106b is an In-M-Zn oxide and the oxide layer 106a and the oxide semiconductor layer 106b contain In, M, and Zn at an atomic ratio of $x_1:y_1:z_1$ and an atomic ratio of $x_2:y_2:z_2$ respectively, $y_1/x_1$ needs to be larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the oxide layer 106a and the oxide semiconductor layer 106b in which $y_1/x_1$ is 1.5 times or more as large as $y_2/x_2$ are selected. More preferably, the oxide layer 106a and the oxide semiconductor layer 106b in which $y_1/x_1$ is twice or more as large as $y_2/x_2$ are selected. Still more preferably, the oxide layer 106a and the oxide semiconductor layer 106b in which $y_1/x_1$ is three times or more as large as $y_2/x_2$ are selected. Here, in the oxide semiconductor layer 106b, $y_1$ is preferably larger than or equal to $x_1$ because the transistor can have stable electrical characteristics. However, when $y_1$ is three times or more as large as $x_1$, the field-effect mobility of the transistor is reduced; accordingly, $y_1$ is preferably equal to $x_1$ or smaller than three times $x_1$.

The thickness of the oxide layer 106a is greater than or equal to 3 nm and less than or equal to 100 nm, preferably greater than or equal to 3 nm and less than or equal to 50 nm. The thickness of the oxide semiconductor layer 106b is greater than or equal to 3 nm and less than or equal to 200 nm, preferably greater than or equal to 3 nm and less than or equal to 100 nm, more preferably greater than or equal to 3 nm and less than or equal to 50 nm.

The oxide layer 106c contains one or more kinds of metal elements contained in the oxide semiconductor layer 106b. The energy at the bottom of the conduction band of the oxide layer 106c is located closer to the vacuum level than that of the oxide semiconductor layer 106b by 0.05 eV or more, 0.07 eV or more, 0.1 eV or more, or 0.15 eV or more and 2 eV or less, 1 eV or less, 0.5 eV or less, or 0.4 eV or less. Since the oxide layer 106c contains one or more kinds of elements contained in the oxide semiconductor layer 106b, an interface level is unlikely to be formed at the interface between the oxide semiconductor layer 106b and the oxide layer 106c. When the interface has an interface level, in some cases, a second transistor in which the interface serves as a channel and which has a different threshold voltage is formed; accordingly, the apparent threshold voltage of the transistor is changed. Thus, with the oxide layer 106c, fluctuation in electrical characteristics of the transistors, such as a threshold voltage, can be reduced.

For example, the oxide layer 106c may contain, for example, aluminum, silicon, titanium, gallium, germanium, yttrium, zirconium, tin, lanthanum, cerium, or hafnium at a higher atomic ratio than the oxide semiconductor layer 106b. Specifically, the amount of any of the above elements in the oxide layer 106c in an atomic ratio is 1.5 times or more, preferably twice or more, more preferably three times or more as much as that in the oxide semiconductor layer 106b in an atomic ratio. Any of the above elements is strongly bonded to oxygen and thus has a function of suppressing generation of an oxygen vacancy in the oxide layer 106c. That is, an oxygen vacancy is more unlikely to be generated in the oxide layer 106c than in the oxide semiconductor layer 106b.

Further alternatively, when each of the oxide semiconductor layer 106b and the oxide layer 106c is an In-M-Zn oxide and the oxide semiconductor layer 106b and the oxide layer 106c contain In, M, and Zn at an atomic ratio of $x_2:y_2:z_2$ and an atomic ratio of $x_3:y_3:z_3$ respectively, $y_3/x_3$ needs to be larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the oxide semiconductor layer 106b and the oxide layer 106c in which $y_3/x_3$ is 1.5 times or more as large as $y_2/x_2$ are selected. More preferably, the oxide semiconductor layer 106b and the oxide layer 106c in which $y_3/x_3$ is twice or more as large as $y_2/x_2$ are selected. Still more preferably, the oxide semiconductor layer 106b and the oxide layer 106c in which $y_3/x_3$ is three times or more as large as $y_2/x_2$ are selected. Here, in the oxide semiconductor layer 106b, $y_2$ is preferably larger than or equal to $x_2$ because the transistor can have stable electrical characteristics. However, when $y_2$ is three times or more as large as $x_2$, the field-effect mobility of the transistor is reduced; accordingly, $y_2$ is preferably equal to $x_2$ or smaller than three times $x_2$.

The thickness of the oxide layer 106c is greater than or equal to 3 nm and less than or equal to 100 nm, preferably greater than or equal to 3 nm and less than or equal to 50 nm.

Note that the oxide layer 106a, the oxide semiconductor layer 106b, and the oxide layer 106c have crystallinity. Preferably, the oxide layer 106a has a low degree of crystallinity, the oxide semiconductor layer 106b has a high degree of crystallinity, and the oxide layer 106c has a low degree or high degree of crystallinity. When the oxide semiconductor layer 106b in which a channel is formed has a high degree of crystallinity, the transistor can have stable electrical characteristics.

Next, other structures of the transistor will be described.

There is no particular limitation on the substrate 100. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates provided with a semiconductor element may be used as the substrate 100.

In the case of using a large glass substrate such as the fifth generation (1000 mm×1200 mm or 1300 mm×1500 mm); the sixth generation (1500 mm×1800 mm); the seventh generation (1870 mm×2200 mm); the eighth generation (2200 mm×2500 mm); the ninth generation (2400 mm×2800 mm); or the tenth generation (2880 mm×3130 mm) as the substrate 100, microfabrication is sometimes difficult due to shrinkage of the substrate 100, which is caused by heat treatment or the like in the manufacturing process of a semiconductor device. Therefore, in the case where the above-described large glass substrate is used as the substrate 100, a substrate which is unlikely to shrink through the heat treatment is preferably used. For example, as the substrate 100, it is possible to use a large glass substrate in which the amount of shrinkage after heat treatment for one hour at 400° C., preferably 450° C., more preferably 500° C. is less than or equal to 10 ppm, preferably less than or equal to 5 ppm, more preferably less than or equal to 3 ppm.

Further alternatively, a flexible substrate may be used as the substrate 100. As the method for providing a transistor over a flexible substrate, there is also a method in which a transistor is formed over a non-flexible substrate, and then, the transistor is separated from the non-flexible substrate and transferred to the substrate 100 which is a flexible substrate. In that case, a separation layer is preferably provided between the non-flexible substrate and the transistor.

The gate electrode 104 may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten.

Note that the gate electrode 104 is provided such that the edge of the multi-layer film 106 is located on the inner side than the edge of the gate electrode 104 as illustrated in FIG. 16A. By providing the gate electrode 104 at such a position, when light irradiation is performed from the substrate 100 side, generation of carriers in the multi-layer film 106 due to light can be suppressed. Note that the edge of the multi-layer film 106 may be located on the outer side than the edge of the gate electrode 104.

The gate insulating film 112 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The gate insulating film 112 may be, for example, a multi-layer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in electron spin resonance (ESR) is less than or equal to $3\times10^{17}$ spins/cm$^3$, preferably less than or equal to $5\times10^{16}$ spins/cm$^3$ is used. As the silicon oxide layer, a silicon oxide layer having excess oxygen is preferably used. As the silicon nitride layer, a silicon nitride layer from which hydrogen and ammonia are less likely to be released is used. The amount of discharge of hydrogen or ammonia may be measured by thermal desorption spectroscopy (TDS).

The source electrode 116a and the drain electrode 116b may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten. Note that the source electrode 116a and the drain electrode 116b may have the same composition or different compositions.

The protective insulating film 118 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The protective insulating film 118 may be, for example, a multi-layer film including a silicon oxide layer as a first layer and a silicon nitride layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in ESR is less than or equal to $3\times10^{17}$ spins/cm$^3$, preferably less than or equal to $5\times10^{16}$ spins/cm$^3$ is used. As the silicon nitride layer, a silicon nitride layer from which hydrogen and ammonia are less likely to be released is used. The amount of discharge of hydrogen or ammonia may be measured by TDS. Further, as the silicon nitride layer, a silicon nitride layer which does not transmit or hardly transmits oxygen is used.

Figure 16D:
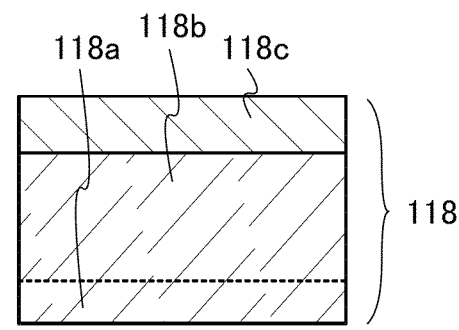

Alternatively, the protective insulating film 118 may be, for example, a multi-layer film including a first silicon oxide layer 118a as a first layer, a second silicon oxide layer 118b as a second layer, and a silicon nitride layer 118c as a third layer (see FIG. 16D). In that case, the first silicon oxide layer 118a and/or the second silicon oxide layer 118b may be a silicon oxynitride layer. In addition, the silicon nitride layer may be a silicon nitride oxide layer. As the first silicon oxide layer 118a, a silicon oxide layer whose defect density is low is preferably used. Specifically, a silicon oxide layer whose spin density attributed to a signal with a g factor of 2.001 in ESR is less than or equal to $3\times10^{17}$ spins/cm$^3$, preferably less than or equal to $5\times10^{16}$ spins/cm$^3$ is used. As the second silicon oxide layer 118b, a silicon oxide layer having excess oxygen is used. As the silicon nitride layer 118c, a silicon nitride layer from which hydrogen and ammonia are less likely to be released is used. Further, as the silicon nitride layer, a silicon nitride layer which does not transmit or hardly transmits oxygen is used.

The silicon oxide layer having excess oxygen means a silicon oxide layer from which oxygen can be released by heat treatment or the like. When the above definition of the silicon oxide layer is applied broadly to an insulating film, an insulating film having excess oxygen means an insulating film from which oxygen is released by heat treatment.

Here, a film from which oxygen is released by heat treatment may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ in TDS analysis (converted into the number of oxygen atoms).

Here, the method of measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to Formula 1 using the TDS results of a silicon wafer containing hydrogen at a predetermined density, which is a reference sample, and the TDS results of the measurement sample. Here, all gases having a mass number of 32 which are obtained in the TDS analysis are assumed to originate from an oxygen molecule. Note that CH$_3$OH, which is a gas having a mass number of 32, is not taken into consideration because it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = \frac{N_{H2}}{S_{H2}} \times S_{O2} \times \alpha \qquad \text{[Formula 1]}$$

Here, $N_{H2}$ is the value obtained by conversion of the number of hydrogen molecules desorbed from the reference sample into densities. In addition, $S_{H2}$ is the integral value of ion intensity in the TDS analysis of the reference sample. Here, the reference value of the reference sample is expressed as $N_{H2}/S_{H2}$. Further, $S_{O2}$ is the integral value of ion intensity in the TDS analysis of the measurement sample, and $\alpha$ is a coefficient affecting the ion intensity in the TDS analysis. Refer to Japanese Published Patent Application No. H6-275697 for details of Formula 1. The amount of released oxygen was measured with a thermal desorption spectroscopy apparatus produced by ESCO Ltd., EMD-WA1000S/W using a silicon wafer containing hydrogen atoms at $1\times10^{16}$ atoms/cm$^2$ as the reference sample.

Further, in the TDS analysis, part of oxygen is detected as an oxygen atom. The ratio between oxygen molecules and oxygen atoms can be calculated from the ionization rate of the oxygen molecules. Since the above $\alpha$ includes the ionization rate of the oxygen molecules, the number of the released oxygen atoms can also be estimated through the evaluation of the number of the released oxygen molecules.

Here, $N_{O2}$ is the number of the released oxygen molecules. The amount of released oxygen converted into oxygen atoms is twice the number of the released oxygen molecules.

Further, the film from which oxygen is released by heat treatment may contain a peroxide radical. Specifically, the spin density attributed to the peroxide radical is greater than or equal to $5\times10^{17}$ spins/cm$^3$. Note that the film containing a peroxide radical may have an asymmetric signal with a g factor of approximately 2.01 in ESR.

The insulating film containing excess oxygen may be oxygen-excess silicon oxide (SiO$_X$(X>2)). In the oxygen-excess silicon oxide (SiO$_X$(X>2)), the number of oxygen atoms per unit volume is more than twice the number of silicon atoms per unit volume. The number of silicon atoms and the number of oxygen atoms per unit volume are measured by Rutherford backscattering spectrometry (RBS).

In the case where at least one of the gate insulating film 112 and the protective insulating film 118 is the insulating film containing excess oxygen, oxygen vacancies in the oxide semiconductor layer 106b can be reduced.

In the above-described transistor, the channel is formed in the oxide semiconductor layer 106b of the multi-layer film 106; thus, the transistor has stable electrical characteristics and a high field-effect mobility.

Next, a method for manufacturing the transistor will be described with reference to FIGS. 17A to 17C and FIGS. 18A and 18B.

First, the substrate 100 is prepared.

Then, a conductive film to be the gate electrode 104 is formed. The conductive film to be the gate electrode 104 may be formed using any of the conductive films given as examples of the gate electrode 104 by a sputtering method, a chemical vapor deposition (CVD) method, a molecular beam epitaxy (MBE) method, an atomic layer deposition (ALD) method, or a pulsed laser deposition (PLD) method.

Figure 17A:
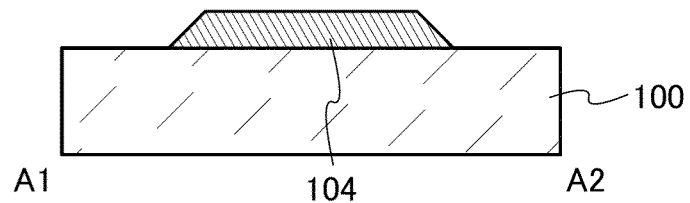
FIGS. 17A to 17C are cross-sectional views illustrating a manufacturing method of a semiconductor device according to one embodiment of the present invention.

Next, the conductive film to be the gate electrode 104 is partly etched to form the gate electrode 104 (see FIG. 17A).

Figure 17B:
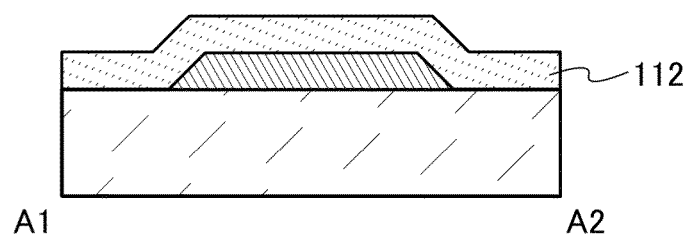

Next, the gate insulating film 112 is formed (see FIG. 17B). The gate insulating film 112 may be formed using any of the above insulating films given as examples of the gate insulating film 112 by a sputtering method, a CVD method, an MBE method, an ALD method, or a PLD method.

Then, an oxide layer to be the oxide layer 106a is formed. The oxide layer to be the oxide layer 106a may be formed using any of the above oxide layers given as examples of the oxide layer 106a by a sputtering method, a CVD method, an MBE method, an ALD method, or a PLD method.

Next, an oxide semiconductor layer to be the oxide semiconductor layer 106b is formed. For the method for forming the oxide semiconductor layer 106b, the description in the above section is referred to.

Then, an oxide layer to be the oxide layer 106c is formed. The oxide layer to be the oxide layer 106c may be formed using any of the above oxide layers given as examples of the oxide layer 106c by a sputtering method, a CVD method, an MBE method, an ALD method, or a PLD method.

It is preferable that the oxide layer to be the oxide layer 106a, the oxide semiconductor layer to be the oxide semiconductor layer 106b, and the oxide layer to be the oxide layer 106c be successively formed without being exposed to the air in order that impurities are less likely to be taken into each interface.

Figure 17C:
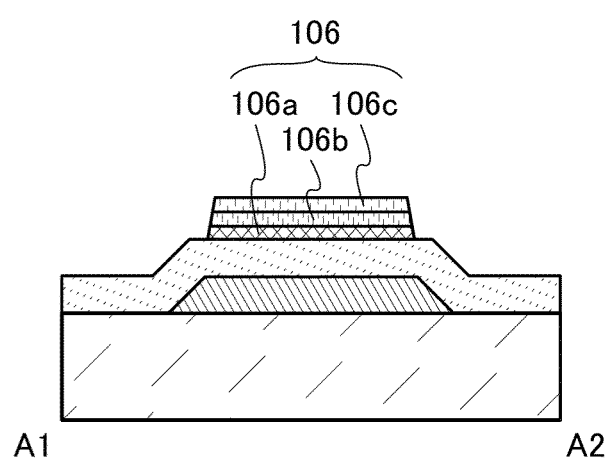

Next, the oxide layer to be the oxide layer 106a, the oxide semiconductor layer to be the oxide semiconductor layer 106b, and the oxide layer to be the oxide layer 106c are partly etched to form the multi-layer film 106 including the oxide layer 106a, the oxide semiconductor layer 106b, and the oxide layer 106c (see FIG. 17C).

Next, first heat treatment is preferably performed. The first heat treatment is performed at a temperature higher than or equal to 250° C. and lower than or equal to 650° C., preferably higher than or equal to 300° C. and lower than or equal to 500° C. The first heat treatment is performed in an inert gas atmosphere, in an atmosphere containing an oxidizing gas at 10 ppm or more, 1% or more, or 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, the crystallinity of the oxide semiconductor layer 106b can be improved, and in addition, impurities such as hydrogen and water can be removed from the gate insulating film 112 and/or the multi-layer film 106.

Then, a conductive film to be the source electrode 116a and the drain electrode 116b is formed. The conductive film to be the source electrode 116a and the drain electrode 116b may be formed using any of the above conductive films given as examples of the source electrode 116a and the drain electrode 116b by a sputtering method, a CVD method, an MBE method, an ALD method, or a PLD method.

Figure 18A:
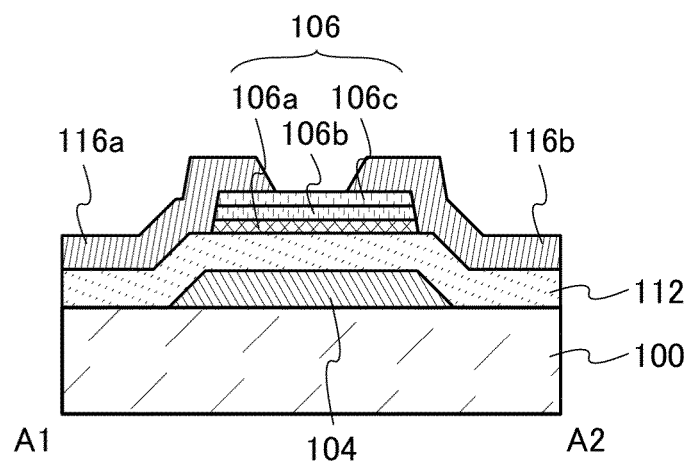
FIGS. 18A and 18B are cross-sectional views illustrating a manufacturing method of a semiconductor device according to one embodiment of the present invention.

Next, the conductive film to be the source electrode 116a and the drain electrode 116b is partly etched to form the source electrode 116a and the drain electrode 116b (see FIG. 18A).

Next, second heat treatment is preferably performed. The description of the first heat treatment can be referred to for the second heat treatment. By the second heat treatment, impurities such as hydrogen and water can be removed from the multi-layer film 106. Note that water is a compound containing hydrogen, and thus might behave as an impurity in the oxide semiconductor layer 106b.

Figure 18B:
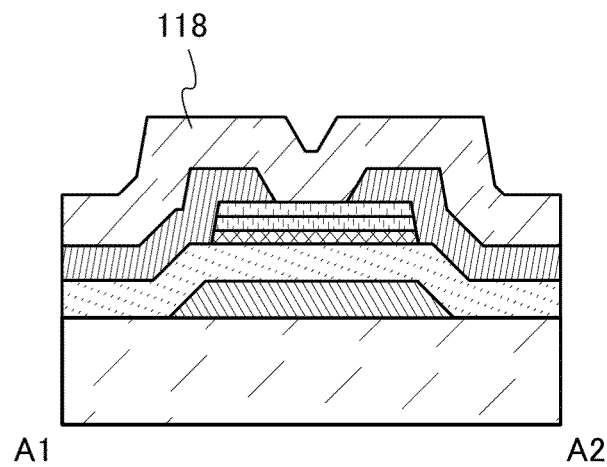

Next, the protective insulating film 118 is formed (see FIG. 18B). The protective insulating film 118 may be formed using any of the above insulating films given as examples of the protective insulating film 118 by a sputtering method, a CVD method, an MBE method, an ALD method, or a PLD method.

Here, the case where the protective insulating film 118 has a three-layer structure as illustrated in FIG. 16D is described. First, the first silicon oxide layer 118a is formed. Next, the second silicon oxide layer 118b is formed. Then, treatment for adding oxygen ions to the second silicon oxide layer 118b is preferably performed. The treatment for adding oxygen ions may be performed with an ion doping apparatus or a plasma treatment apparatus. As the ion doping apparatus, an ion doping apparatus with a mass separation function may be used. As a source material of oxygen ions, an oxygen gas such as $^{16}O_2$ or $^{18}O_2$, a nitrous oxide gas, an ozone gas, or the like may be used. Then, the silicon nitride layer 118c is formed. In this manner, the protective insulating film 118 may be formed.

Next, third heat treatment is preferably performed. The description of the first heat treatment can be referred to for the third heat treatment. By the third heat treatment, excess oxygen is released from the gate insulating film 112 and/or the protective insulating film 118; thus, oxygen vacancies in the multi-layer film 106 can be reduced. Note that in the multi-layer film 106, an oxygen vacancy captures an adjacent oxygen atom, so that the oxygen vacancy seems to move. Therefore, excess oxygen can reach the oxide semiconductor layer 106b through the oxide layer 106a or the oxide layer 106c.

In the above manner, the BGTC transistor can be manufactured.

This transistor has stable electrical characteristics because oxygen vacancies in the oxide semiconductor layer 106b of the multi-layer film 106 are reduced.

In this section, a top-gate transistor will be described.

Here, a top-gate top-contact (TGTC) transistor, which is one kind of top-gate transistor, is described with reference to FIGS. 19A to 19C.

Figure 19A:
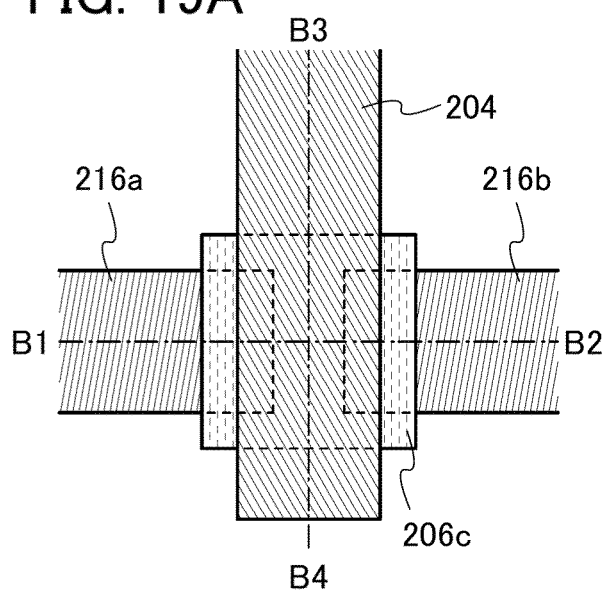
FIGS. 19A to 19C are a top view and cross-sectional views illustrating a semiconductor device according to one embodiment of the present invention.
Figure 19C:
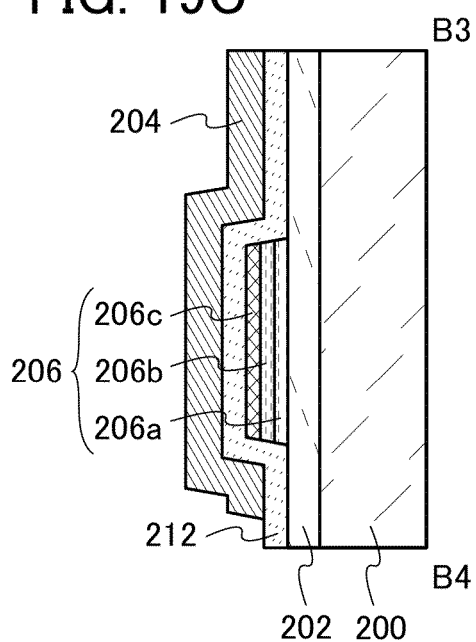
Figure 19B:
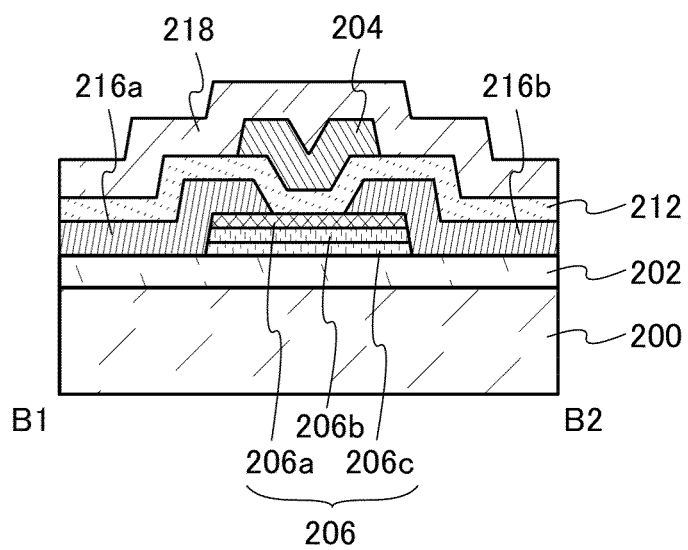

FIGS. 19A to 19C are a top view and cross-sectional views of the TGTC transistor. FIG. 19A is the top view of the transistor. FIG. 19B is the cross-sectional view taken along dashed-dotted line B1-B2 in FIG. 19A. FIG. 19C is the cross-sectional view taken along dashed-dotted line B3-B4 in FIG. 19A.

The transistor illustrated in FIG. 19B includes a base insulating film 202 over a substrate 200; a multi-layer film 206 including an oxide layer 206a over the base insulating film 202, an oxide semiconductor layer 206b over the oxide layer 206a, and an oxide layer 206c over the oxide semiconductor layer 206b; a source electrode 216a and a drain electrode 216b over the base insulating film 202 and the multi-layer film 206; a gate insulating film 212 over the multi-layer film 206, the source electrode 216a, and the drain electrode 216b; a gate electrode 204 over the gate insulating film 212; and a protective insulating film 218 over the gate insulating film 212 and the gate electrode 204. Note that the transistor does not necessarily include the base insulating film 202 and/or the protective insulating film 218.

The source electrode 216a and the drain electrode 216b are in contact with side edges of the oxide semiconductor layer 206b.

Further, as illustrated in FIG. 19B, oxygen is taken away from part of the oxide layer 206c depending on the kind of conductive film used for the source electrode 216a and the drain electrode 216b so that a source region and a drain region are formed.

In FIG. 19A, the distance between the source electrode 216a and the drain electrode 216b in a region of the multi-layer film 206 overlapping with the gate electrode 204 is referred to as a channel length. Note that in the case where the transistor includes the source region and the drain region, the distance between the source region and the drain region in the region overlapping with the gate electrode 204 may be referred to as a channel length.

Note that a channel formation region refers to a region which overlaps with the gate electrode 204 and is located between the source electrode 216a and the drain electrode 216b when seen from above in the multi-layer film 206. Further, a channel refers to a region through which current mainly flows in the channel formation region. Here, the channel refers to a portion of the oxide semiconductor layer 206b in the channel formation region.

For the multi-layer film 206, the description of the multi-layer film 106 is referred to. Specifically, for the oxide layer 206a, the description of the oxide layer 106c is referred to; for the oxide semiconductor layer 206b, the description of the oxide semiconductor layer 106b is referred to; and for the oxide layer 206c, the description of the oxide layer 106a is referred to.

For the substrate 200, the description of the substrate 100 is referred to. For the source electrode 216a and the drain electrode 216b, the description of the source electrode 116a and the drain electrode 116b is referred to. For the gate insulating film 212, the description of the gate insulating film 112 is referred to. For the gate electrode 204, the description of the gate electrode 104 is referred to. For the protective insulating film 218, the description of the protective insulating film 118 is referred to.

Although the edge of the multi-layer film 206 is located on the outer side than the edge of the gate electrode 204 in FIG. 19A, the edge of the multi-layer film 206 may be located on the inner side than the edge of the gate electrode 204 in order to suppress generation of carriers in the multi-layer film 206 due to light.

The base insulating film 202 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The base insulating film 202 may be, for example, a multi-layer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in ESR is less than or equal to $3\times10^{17}$ spins/cm$^3$, preferably less than or equal to $5\times10^{16}$ spins/cm$^3$ is used. As the silicon nitride layer, a silicon nitride layer from which hydrogen and ammonia are less likely to be released is used. The amount of discharge of hydrogen or ammonia may be measured by TDS. Further, as the silicon nitride layer, a silicon nitride layer which does not transmit or hardly transmits oxygen is used.

The base insulating film 202 may be, for example, a multi-layer film including a silicon nitride layer as a first layer, a first silicon oxide layer as a second layer, and a second silicon oxide layer as a third layer. In that case, the first silicon oxide layer and/or the second silicon oxide layer may be a silicon oxynitride layer. In addition, the silicon nitride layer may be a silicon nitride oxide layer. As the first silicon oxide layer, a silicon oxide layer whose defect density is low is preferably used. Specifically, a silicon oxide layer whose spin density attributed to a signal with a g factor of 2.001 in ESR is less than or equal to $3\times10^{17}$ spins/cm$^3$, preferably less than or equal to $5\times10^{16}$ spins/cm$^3$ is used. As the second silicon oxide layer, a silicon oxide layer having excess oxygen is used. As the silicon nitride layer, a silicon nitride layer from which hydrogen and ammonia are less likely to be released is used. Further, as the silicon nitride layer, a silicon nitride layer which does not transmit or hardly transmits oxygen is used.

In the case where at least one of the gate insulating film 212 and the base insulating film 202 is the insulating film containing excess oxygen, oxygen vacancies in the oxide semiconductor layer 206b can be reduced.

In the above-described transistor, the channel is formed in the oxide semiconductor layer 206b of the multi-layer film 206; thus, the transistor has stable electrical characteristics and a high field-effect mobility.

Next, a method for manufacturing the transistor will be described with reference to FIGS. 20A to 20C and FIGS. 21A and 21B.

First, the substrate 200 is prepared.

Next, an oxide layer to be the oxide layer 206a is formed. For the method for forming the oxide layer to be the oxide layer 206a, the description of the method for forming the oxide layer to be the oxide layer 106c is referred to.

Next, an oxide semiconductor layer to be the oxide semiconductor layer 206b is formed. For the method for forming the oxide semiconductor layer to be the oxide semiconductor layer 206b, the description of the method for forming the oxide semiconductor layer to be the oxide semiconductor layer 106b is referred to.

Then, an oxide layer to be the oxide layer 206c is formed. For the method for forming the oxide layer to be the oxide layer 206c, the description of the method for forming the oxide layer to be the oxide layer 106a is referred to.

Next, first heat treatment is preferably performed. The first heat treatment is performed at a temperature higher than or equal to 250° C. and lower than or equal to 650° C., preferably higher than or equal to 300° C. and lower than or equal to 500° C. The first heat treatment is performed in an inert gas atmosphere, in an atmosphere containing an oxidizing gas at 10 ppm or more, preferably 1% or more, further preferably 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, preferably 1% or more, further preferably 10% or more in order to compensate desorbed oxygen. By the first heat treatment, the crystallinity of the oxide semiconductor layer to be the oxide semiconductor layer 206*b* can be improved, and in addition, impurities such as hydrogen and water can be removed from the base insulating film 202, the oxide layer to be the oxide layer 206*a*, the oxide semiconductor layer to be the oxide semiconductor layer 206*b*, and/or the oxide layer to be the oxide layer 206*c*.

Figure 20A:
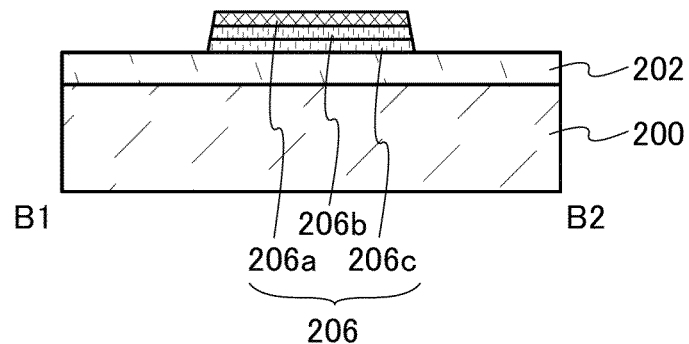
FIGS. 20A to 20C are cross-sectional views illustrating a manufacturing method of a semiconductor device according to one embodiment of the present invention.

Next, the oxide layer to be the oxide layer 206*a*, the oxide semiconductor layer to be the oxide semiconductor layer 206*b*, and the oxide layer to be the oxide layer 206*c* are partly etched to form the multi-layer film 206 including the oxide layer 206*a*, the oxide semiconductor layer 206*b*, and the oxide layer 206*c* (see FIG. 20A).

Then, a conductive film to be the source electrode 216*a* and the drain electrode 216*b* is formed. For the method for forming the conductive film to be the source electrode 216*a* and the drain electrode 216*b*, the description of the method for forming the conductive film to be the source electrode 116*a* and the drain electrode 116*b* is referred to.

Figure 20B:
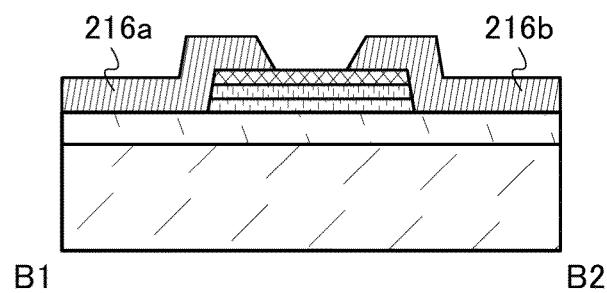

Next, the conductive film to be the source electrode 216*a* and the drain electrode 216*b* is partly etched to form the source electrode 216*a* and the drain electrode 216*b* (see FIG. 20B).

Next, second heat treatment is preferably performed. The description of the first heat treatment can be referred to for the second heat treatment. By the second heat treatment, impurities such as hydrogen and water can be removed from the multi-layer film 206.

Figure 20C:
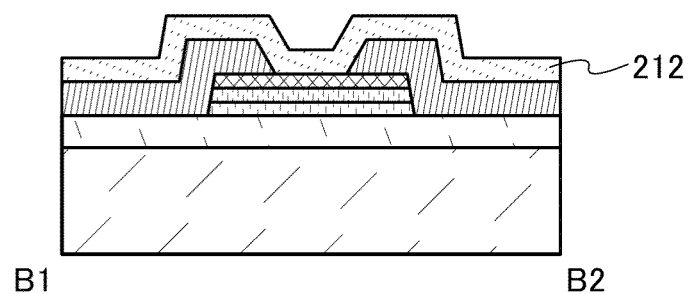

Next, the gate insulating film 212 is formed (see FIG. 20C). For the method for forming the gate insulating film 212, the description of the method for forming the gate insulating film 112 is referred to.

Next, a conductive film to be the gate electrode 204 is formed. For the method for forming the conductive film to be the gate electrode 204, the description of the method for forming the conductive film to be the gate electrode 104 is referred to.

Figure 21A:
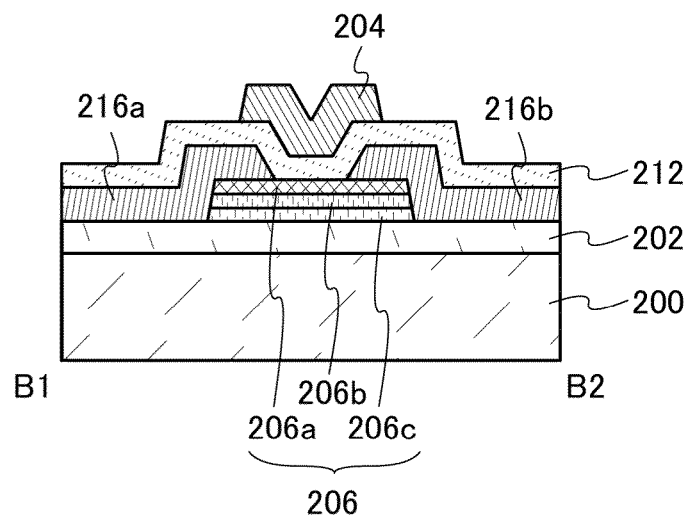
FIGS. 21A and 21B are cross-sectional views illustrating a manufacturing method of a semiconductor device according to one embodiment of the present invention.

Next, the conductive film to be the gate electrode 204 is partly etched to form the gate electrode 204 (see FIG. 21A).

Figure 21B:
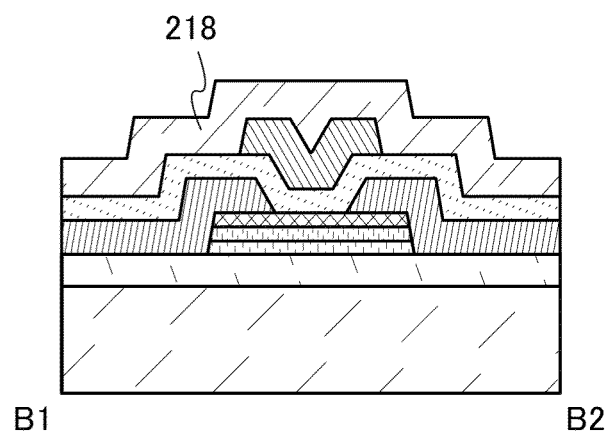

Next, the protective insulating film 218 is formed (see FIG. 21B). For the method for forming the protective insulating film 218, the description of the method for forming the protective insulating film 118 is referred to.

In the above manner, the transistor can be manufactured.

This transistor has stable electrical characteristics because oxygen vacancies in the oxide semiconductor layer 206*b* of the multi-layer film 206 are reduced.

A transistor disclosed in this specification can be applied to a variety of electronic deices (including game machines). Examples of the electronic devices include display devices of televisions, monitors, and the like, lighting devices, desktop personal computers and notebook personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, mobile phones, car phones, portable game machines, calculators, portable information terminals, electronic notebooks, e-book readers, electronic translators, audio input devices, cameras such as video cameras and digital still cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipment such as dialyzers. In addition, the examples include alarm devices such as smoke detectors, gas alarm devices, and security alarm devices. Further, the examples also include industrial equipment such as guide lights, traffic lights, belt conveyors, elevators, escalators, industrial robots, and power storage systems. In addition, moving objects and the like driven by oil engines and electric motors using power from non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, and spacecrafts. Specific examples of these electronic devices are illustrated in FIGS. 22A to 22C, FIG. 23, FIGS. 24A to 24C, FIG. 25, FIG. 26, FIG. 27, FIG. 28, FIG. 29, and FIGS. 30A to 30D.

In this section, the structure of a liquid crystal display device will be described.

Figure 22A:
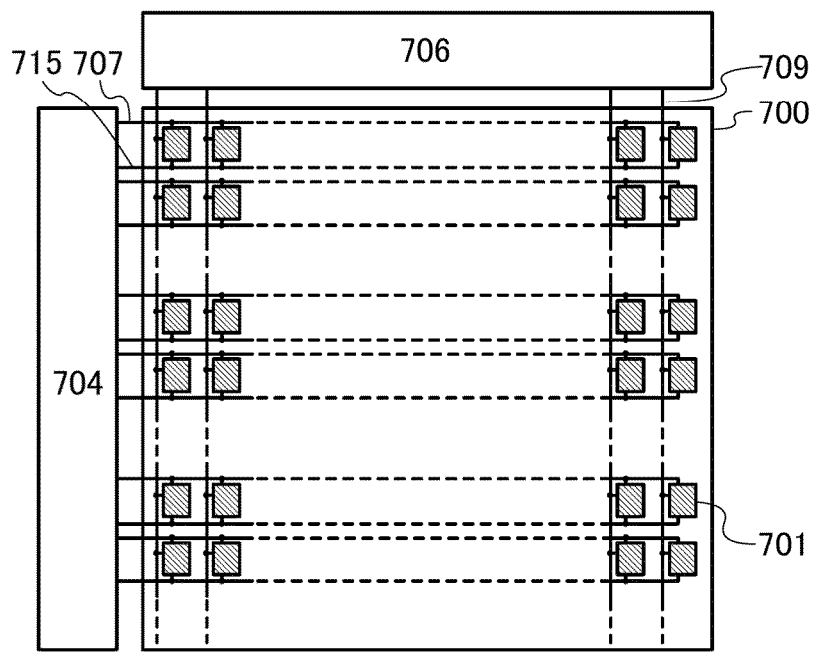
FIG. 22A illustrates a display device of one embodiment of the present invention and FIGS. 22B and 22C are circuit diagrams each illustrating a pixel.

FIG. 22A illustrates an example of a liquid crystal display device. The display device in FIG. 22A includes a pixel portion 700, a scan line driver circuit 704, a signal line driver circuit 706, m scan lines 707 which are arranged in parallel or substantially in parallel and whose potentials are controlled by the scan line driver circuit 704, and n signal lines 709 which are arranged in parallel or substantially in parallel and whose potentials are controlled by the signal line driver circuit 706. Further, the pixel portion 700 includes a plurality of pixels 701 arranged in a matrix. Furthermore, capacitor lines 715 arranged in parallel or substantially in parallel are provided along the scan lines 707. Note that the capacitor lines 715 may be arranged in parallel or substantially in parallel along the signal lines 709.

Each scan line 707 is electrically connected to the n pixels 701 in the corresponding row among the pixels 701 arranged in m rows and n columns in the pixel portion 700. Each signal line 709 is electrically connected to the m pixels 701 in the corresponding column among the pixels 701 arranged in m rows and n columns. Note that m and n are each an integer of 1 or more. Note that in the case where the capacitor lines 715 are arranged in parallel or substantially in parallel along the signal lines 709, each capacitor line 715 is electrically connected to the m pixels 701 in the corresponding column among the pixels 701 arranged in m rows and n columns.

Since the transistor is easily broken owing to static electricity or the like, a protective circuit for protecting the driver circuit such as the scan line driver circuit 704 or the signal line driver circuit 706 is preferably provided. The protective circuit is provided between the scan line driver circuit 704 and an external input terminal connected to an FPC or the like or between the signal line driver circuit 706 and the external input terminal. The protective circuit is preferably formed using a nonlinear element.

Figure 22B:
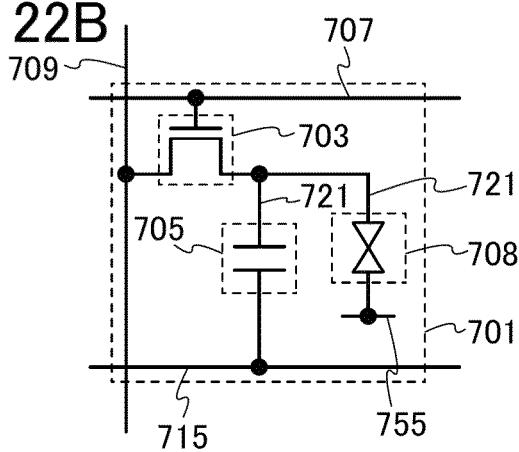

FIG. 22B is an example of a circuit diagram of the pixel 701 included in the display device illustrated in FIG. 22A. The pixel 701 illustrated in FIG. 22B includes a transistor 703, a capacitor 705, and a liquid crystal element 708.

One electrode of the capacitor 705 is electrically connected to a drain electrode of the transistor 703 and a pixel electrode 721, and the other electrode of the capacitor 705 is electrically connected to the capacitor line 715 for supplying a constant potential. FIG. 22B is a circuit diagram in the case where the other electrode of the capacitor 705 has high conductivity. On the other hand, FIG. 22C is a circuit diagram in the case where the other electrode of the capacitor 705 has low conductivity.

Figure 22C:
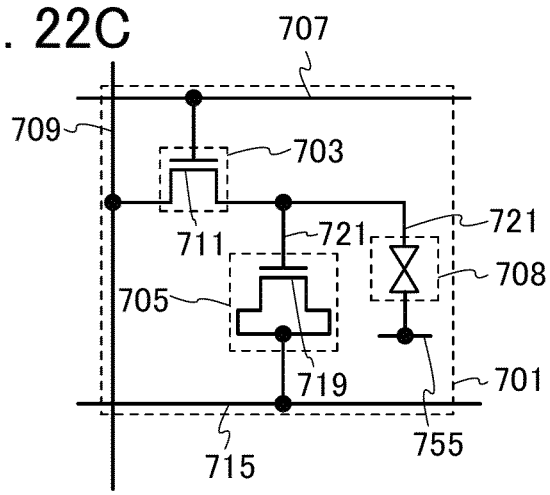

In the capacitor 705 illustrated in FIG. 22C, a multi-layer film 719 has the same layered structure as the multi-layer film 106 used in the transistor 703. The multi-layer film 719 functions as an electrode when a potential applied to the multi-layer film 719 is controlled so that current flows therethrough. The pixel electrode 721 serves as the other electrode of the capacitor 705. Thus, the capacitor 705 can be regarded as a metal oxide semiconductor (MOS) capacitor.

The liquid crystal element 708 is an element which controls transmission of light by an optical modulation action of liquid crystal which is sandwiched between a substrate provided with the transistor 703 and the pixel electrode 721 and a substrate provided with a counter electrode. The counter electrode is electrically connected to a wiring 755. The optical modulation action of liquid crystal is controlled by an electric field applied to the liquid crystal (including a horizontal electric field, a vertical electric field, and a diagonal electric field).

Figure 23:
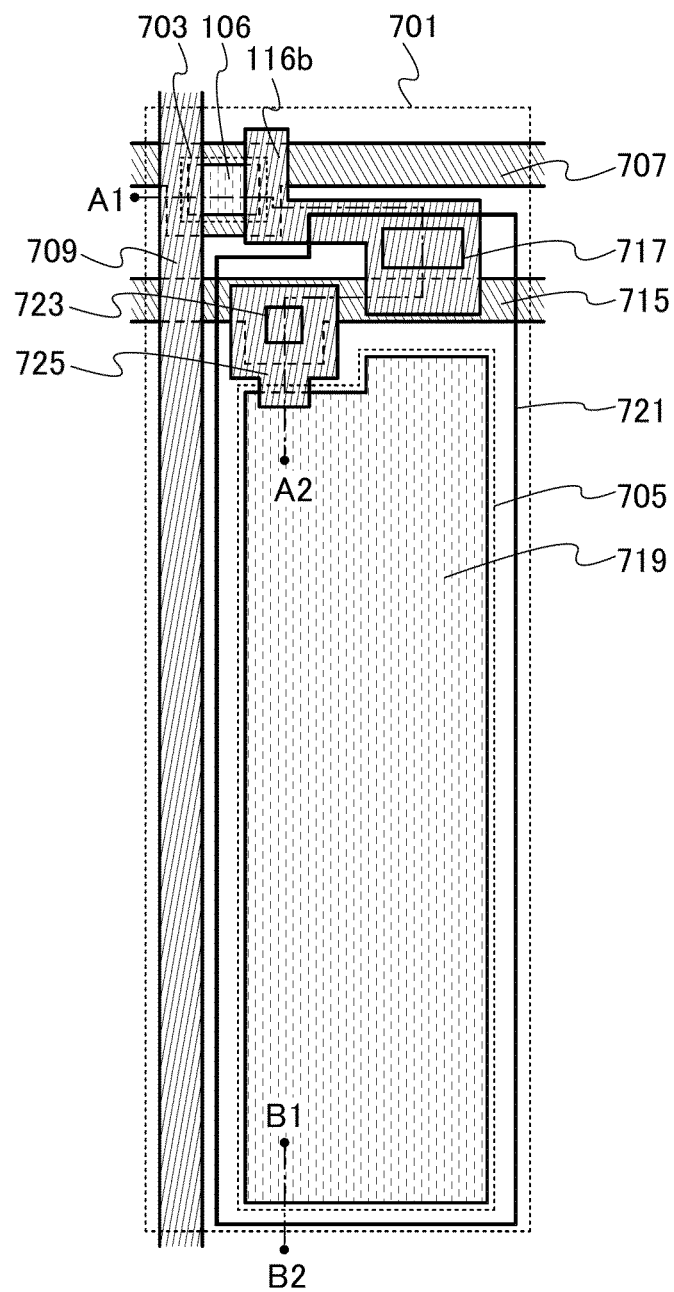
FIG. 23 is a top view illustrating a pixel of a display device of one embodiment of the present invention.

Next, a specific example of the pixel 701 of the liquid crystal display device will be described. FIG. 23 is a top view of the pixel 701. Note that the counter electrode and the liquid crystal element are not illustrated in FIG. 23.

The transistor 703 is provided in a region where the scan line 707 and the signal line 709 cross each other. The transistor 703 includes a gate electrode, a gate insulating film (not illustrated in FIG. 23) over the gate electrode, and the multi-layer film 106 including an oxide semiconductor layer over the gate insulating film. A region of the scan line 707 which overlaps with the multi-layer film 106 functions as the gate electrode of the transistor 703. Further, in FIG. 23, an edge of the scan line 707 is on the outer side than an edge of the multi-layer film 106 when seen from above. Thus, the scan line 707 functions as a light-blocking film for blocking light from a backlight. For this reason, the multi-layer film 106 including an oxide semiconductor layer which is included in the transistor 703 is not irradiated with light, so that variation in the electrical characteristics of the transistor 703 can be reduced.

The drain electrode 116b is electrically connected to the light-transmitting pixel electrode 721 through an opening 717. Thus, the light-transmitting pixel electrode 721 is electrically connected to the transistor 703.

The capacitor 705 is provided in a region which is in the pixel 701 and surrounded by the capacitor lines 715 and the signal lines 709. The capacitor 705 is electrically connected to the capacitor line 715 through a conductive film 725 provided in an opening 723. Note that the capacitor 705 has a light-transmitting property. Thus, the capacitor 705 can be formed large (in a large area) in the pixel 701. This enables the display device to have a higher aperture ratio and higher charge capacity.

For example, in a high-definition display device such as a liquid crystal display device, the area of a pixel is small and thus the area of a capacitor is also small. For this reason, the capacity of charge accumulated in the capacitor 705 is small in a high-definition display device. However, by providing the capacitor 705 having a light-transmitting property in each pixel, the capacity of charge in each pixel can be sufficiently obtained and the aperture ratio can be improved even in a high-definition display device with a pixel density of 200 ppi or more, further 300 ppi or more.

FIG. 24A is a cross-sectional view taken along dashed-dotted lines A1-A2 and B1-B2 in FIG. 23.

The scan line 707 including the gate electrode 104 of the transistor 703 and the capacitor line 715 over the same surface as the scan line 707 are provided over the substrate 100.

As the substrate 100, a light-transmitting substrate such as a glass substrate or a plastic substrate is used.

The gate insulating film 112 is provided over the scan line 707 and the capacitor line 715. The multi-layer film 106 is provided over a region overlapping with the gate electrode 104 with the gate insulating film 112 therebetween, and a multi-layer film 119 is provided over the gate insulating film 112 in a region where the capacitor 705 is formed. Further, the drain electrode 116b of the transistor 703 and the signal line 709 including the source electrode 116a of the transistor 703 are provided over the gate insulating film 112. Note that in the liquid crystal display device, the source electrode 116a of the transistor 703 functions as a drain electrode and the drain electrode 116b of the transistor 703 functions as a source electrode depending on driving method; however, here, an electrode electrically connected to the pixel electrode is called the drain electrode 116b for convenience.

The opening 723 reaching the capacitor line 715 is formed in the gate insulating film 112 in the region where the capacitor 705 is formed, and the conductive film 725 is provided in the opening 723 and over the gate insulating film 112 and the multi-layer film 119.

Further, the first silicon oxide layer 118a, the second silicon oxide layer 118b, and the silicon nitride layer 118c which function as a protective insulating film of the transistor 703 and as a dielectric of the capacitor 705 are provided over the gate insulating film 112, the source electrode 116a, the multi-layer film 106, the drain electrode 116b, the conductive film 725, and the multi-layer film 119. Note that the opening 717 reaching the drain electrode 116b is provided in the first silicon oxide layer 118a, the second silicon oxide layer 118b, and the silicon nitride layer 118c, and the pixel electrode 721 is provided over the silicon nitride layer 118c and in the opening 717.

FIG. 24B is an enlarged view of an α region (the gate insulating film 112, the multi-layer film 106, the source electrode 116a, and the protective insulating film 118) of the display device illustrated in FIG. 24A. FIG. 24C is an enlarged view of a β region (the gate insulating film 112, the multi-layer film 119, the conductive film 725, and the protective insulating film 118).

In FIG. 24C, the multi-layer film 119 includes a first oxide layer 119a which is in contact with the gate insulating film 112, a second oxide layer 119b which is an oxide semiconductor film over and in contact with the first oxide layer 119a, and a third oxide layer 119c which is over and in contact with the second oxide layer 119b. Note that the conductive film 725 and the protective insulating film 118 are formed over the third oxide layer 119c.

The multi-layer film 119 functioning as the other electrode of the capacitor 705 has the same layered structure as the multi-layer film 106. In other words, the multi-layer film 119 can be formed using an oxide film which can be applied to the multi-layer film 106. Further, since the multi-layer film 119 can be formed together with the multi-layer film 106, the multi-layer film 119 contains a metal element of an oxide semiconductor forming the multi-layer film 106.

It is preferable that a mask covering at least the multi-layer film 106 be formed and an element (dopant) which increases conductivity be selectively added to the multi-layer film 119. As the dopant, one or more selected from hydrogen, boron, nitrogen, fluorine, aluminum, phosphorus, arsenic, indium, tin, antimony, and a rare gas element can be used. The concentration of the dopant contained in the multi-layer film 119 is preferably higher than or equal to $1\times10^{19}$ atoms/cm$^3$ and lower than or equal to $1\times10^{22}$ atoms/cm$^3$, in which case the conductivity of the multi-layer film 119 can be higher than or equal to 10 S/cm and lower than or equal to 1000 S/cm, preferably higher than or equal to 100 S/cm and lower than or equal to 1000 S/cm, so that the multi-layer film 119 can sufficiently function as one electrode of the capacitor 705.

The substrate 100 is fixed to a counter substrate 750 with a sealant or the like, and a liquid crystal layer 760 is held between the pair of substrates. Note that as the counter substrate 750, a light-transmitting substrate such as a glass substrate or a plastic substrate is used.

The counter substrate 750 is provided with a light-blocking film 752 formed using a material such as a metal or an organic resin including a pigment, a counter electrode 754 formed using the same light-transmitting conductive material as the pixel electrode 721, and an insulating film 756 functioning as an alignment film. Further, the counter substrate 750 may be provided with a coloring film (also referred to as a color filter) having a function of transmitting light with a predetermined wavelength.

The liquid crystal element 708 includes the pixel electrode 721, the counter electrode 754, and the liquid crystal layer 760. The liquid crystal layer 760 is sandwiched between an insulating film 758 which is provided over the pixel electrode 721 over the substrate 100 and functions as an alignment film and the insulating film 756 which is provided in the element portion on the substrate 750 side and functions as an alignment film.

Note that the cross-sectional structure illustrated in FIGS. 24A to 24C is merely an example, and one embodiment of the present invention is not particularly limited thereto. For example, FIG. 25 illustrates a cross-sectional structure of a pixel partly different from that in FIGS. 24A to 24C. Note that structures other than the capacitor 705 are the same as those in FIGS. 24A to 24C, and thus the detailed description is omitted.

Only a structure in which the protective insulating film 118 illustrated in FIGS. 24A to 24C is partly removed will be described with reference to FIG. 25.

Selective addition of an element (dopant) which increases conductivity to the multi-layer film 119 is not necessarily performed. Instead, the uppermost layer of the multi-layer film 119 may be provided in contact with the nitride insulating film. When the uppermost layer of the multi-layer film 119 is in contact with the nitride insulating film, a defect state (interface level) is formed at the interface between the silicon nitride layer 118c that is the nitride insulating film and the multi-layer film 119, or nitrogen and/or hydrogen in the nitride insulating film are/is moved to the multi-layer film 119; thus, the conductivity of the multi-layer film 119 is increased so that the multi-layer film 119 becomes a metal oxide film having conductor characteristics.

In the structure illustrated in FIG. 25, the thickness of the dielectric film can be reduced; therefore, an increase in the charge capacity of the capacitor can be achieved.

In this section, the multi-layer film 106 including the oxide semiconductor layer includes a first oxide layer, a second oxide layer which is an oxide semiconductor over and in contact with the first oxide layer, and a third oxide layer over and in contact with the second oxide layer. Since the channel is formed in the layer which is not in contact with the gate insulating film, the transistor can have stable electrical characteristics, so that the liquid crystal display device can have high reliability.

Figure 26:
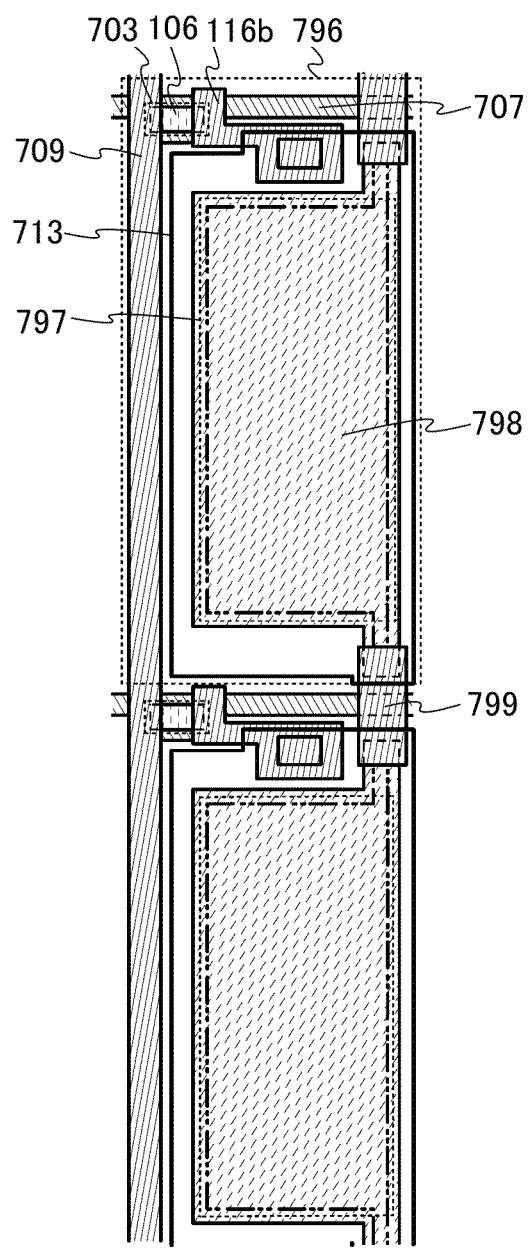
FIG. 26 is a top view illustrating a pixel of a display device of one embodiment of the present invention.

FIG. 26 is a top view of a pixel partly different from that in a pixel structure illustrated in FIG. 23. Note that here, only a structure in which the capacitor line 715 illustrated in FIG. 23 is not provided is described. In this section, a capacitor 797 is provided instead of the capacitor 705 described in the above section.

FIG. 26 is a top view of a pixel 796 where a multi-layer film 798 serving as an electrode of the capacitor 797 and the capacitor line is provided. The multi-layer film 798 has a region which extends in the direction parallel to the signal line 709 and the region functions as the capacitor line. In the multi-layer film 798, a region which overlaps with a pixel electrode 713 functions as an electrode of the capacitor 797. Note that the multi-layer film 798 can be formed in a manner similar to that of the multi-layer film 119.

With the structure illustrated in FIG. 26, a liquid crystal display device having a higher aperture ratio than that illustrated in FIG. 23 can be achieved.

In this section, the structure of an organic EL display device will be described.

Figure 27:
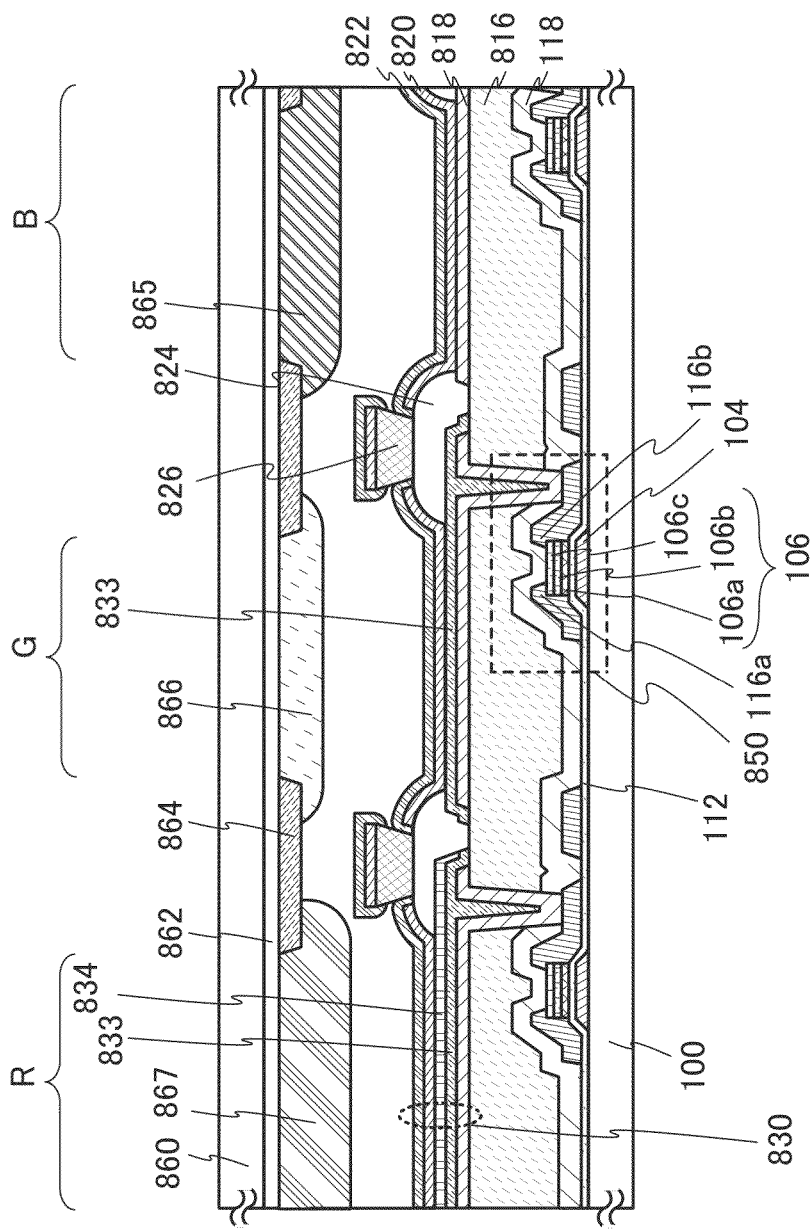
FIG. 27 is a cross-sectional view illustrating a display device of one embodiment of the present invention.

FIG. 27 is a cross-sectional view illustrating a specific structure of a pixel of the organic EL display device. As a transistor 850 electrically connected to a light-emitting element 830, the transistor illustrated in FIGS. 16A to 16D is used. In FIG. 27, the same portions as those in FIGS. 16A to 16D are denoted by the same reference numerals.

The organic EL display device illustrated in FIG. 27 includes the substrate 100; the transistor 850 over the substrate 100; the protective insulating film 118; an insulating film 816 over the protective insulating film 118; the light-emitting element 830 electrically connected to the transistor 850; and a first bank 824 and a second bank 826 which isolate the light-emitting element 830. Further, the organic EL display device includes a sealing substrate 860 which is fixed to the substrate 100 with a sealant or the like. The sealing substrate 860 is provided with a base layer 862, a black matrix 864, a red color filter 867, a green color filter 866, and a blue color filter 865. The transistor 850 includes the gate electrode 104, the multi-layer film 106, the source electrode 116a, the drain electrode 116b, and the gate insulating film 112. The light-emitting element 830 includes a reflective electrode 818 functioning as an anode, a first microcavity layer 833, a second microcavity layer 834, a light-emitting layer 820, and a cathode 822.

The first bank 824 preferably has a curved top surface. The second bank 826 preferably has a flat top surface and a reverse tapered shape in cross section.

The first bank 824 can be formed using an organic insulating material or an inorganic insulating material. In particular, a photosensitive resin material is preferably used. The first bank can be formed using a colored organic insulating material.

The second bank 826 can be formed using an inorganic insulating material or an organic insulating material. As the organic insulating material, for example, a negative or positive photosensitive resin material, a non-photosensitive resin material, or the like can be used. Further, the second bank can be formed using a colored organic insulating material. Furthermore, in order to increase the light-transmitting property of the organic EL display device, a light-transmitting material may be used.

The first microcavity layer 833 and the second microcavity layer 834 are each formed over and in contact with the reflective electrode 818. The first microcavity layer 833 and the second microcavity layer 834 are preferably formed using a light-transmitting conductive material. The first microcavity layer 833 may have a single-layer structure or a layered structure including a plurality of transparent conductive layers. Further, the second microcavity layer 834 may have a single-layer structure or a layered structure including a plurality of transparent conductive layers.

By forming the first microcavity layer 833 and the second microcavity layer 834 over and in contact with the reflective electrode 818, the optical path length from the reflective electrode 818 to the cathode 822 in each of the pixel emitting red light, the pixel emitting green light, and a pixel emitting blue light, can be optimized in accordance with light wavelengths of three colors of RGB. In FIG. 27, the first microcavity layer 833 and the second microcavity layer 834 are formed in the pixel emitting red light, and the second microcavity layer 834 is formed in the pixel emitting green light. Accordingly, in the pixel emitting red light, the distance between the electrodes can be made longer, and in the pixel emitting blue light, the distance between the electrodes can be made shorter. Thus, in accordance with the light wavelengths of three colors of RGB, high-intensity light can be extracted from each light-emitting layer 820.

The black matrix 864 can be formed using a metal material with low reflectance, such as titanium or chromium, an organic insulating material impregnated with a black pigment or a black dye, or the like.

As the insulating film 816, an insulating film having a planarization function is preferably selected in order to reduce surface unevenness due to the transistor. For the insulating film 816, for example, an organic material such as polyimide or a benzocyclobutene-based resin can be used. Besides the above organic materials, a low-dielectric constant material (a low-k material) or the like can be used.

The light-emitting layer 820 can be formed by an evaporation method (including a vacuum evaporation method) or the like. The light-emitting layer 820 includes a plurality of light-emitting units and a plurality of intermediate units. For example, the light-emitting layer 820 can include a B unit including a blue light-emitting layer, R and G units including a red light-emitting layer and a green light-emitting layer, an intermediate unit connecting these units, and the like. The color of light emitted from the light-emitting layer 820 is preferably white.

The light-emitting layer 820 is isolated by the first bank 824 and the second bank 826. The light-emitting layer 820 may be left on part of the top surface and the side surface of the second bank 826.

As a material of the cathode 822, a light-transmitting metal oxide or the like can be used. As the light-transmitting metal oxide, indium oxide ($In_2O_3$ or the like), tin oxide ($SnO_2$ or the like), zinc oxide (ZnO), indium oxide-tin oxide ($In_2O_3$—$SnO_2$ or the like, which is abbreviated to ITO), indium oxide-zinc oxide ($In_2O_3$—ZnO or the like), any of these metal oxide materials in which silicon oxide is contained, or the like can be used.

The light-emitting element 830 has a function of emitting light in accordance with the amount of current which flows between the anode and the cathode.

In the cross-sectional structure illustrated in FIG. 27, the reflective electrode 818 is formed in contact with the drain electrode 116b of the transistor; however, one embodiment of the present invention is not limited thereto. For example, a wiring and an interlayer insulating film may be formed between the reflective electrode 818 and the drain electrode 116b of the transistor so that the reflective electrode 818 and the drain electrode 116b are electrically connected to each other through the wiring.

As described above, in the display device in this section, the multi-layer film 106 formed using an oxide semiconductor material is used as the semiconductor layer in the transistor illustrated in FIGS. 16A to 16D, and the transistor is electrically connected to the light-emitting element 830. In this manner, a highly reliable organic EL display device is achieved.

In this section, the structure of an organic EL display device with a sensor will be described.

The organic EL display device has a touch-input function. In the case where an analog resistive touch panel is used, the touch panel may be attached to the organic EL display device.

Also in the case where a surface capacitive touch panel is used, the touch panel may be attached to the organic EL display device. Further, also in the case where a projected capacitive (mutual capacitive) touch panel is used, the touch panel may be attached to the organic EL display device.

In this section, a touch-input function using a photosensor is described as an example. The photosensor can be formed over the same substrate as a transistor, and thus the number of components can be reduced.

Figure 28:
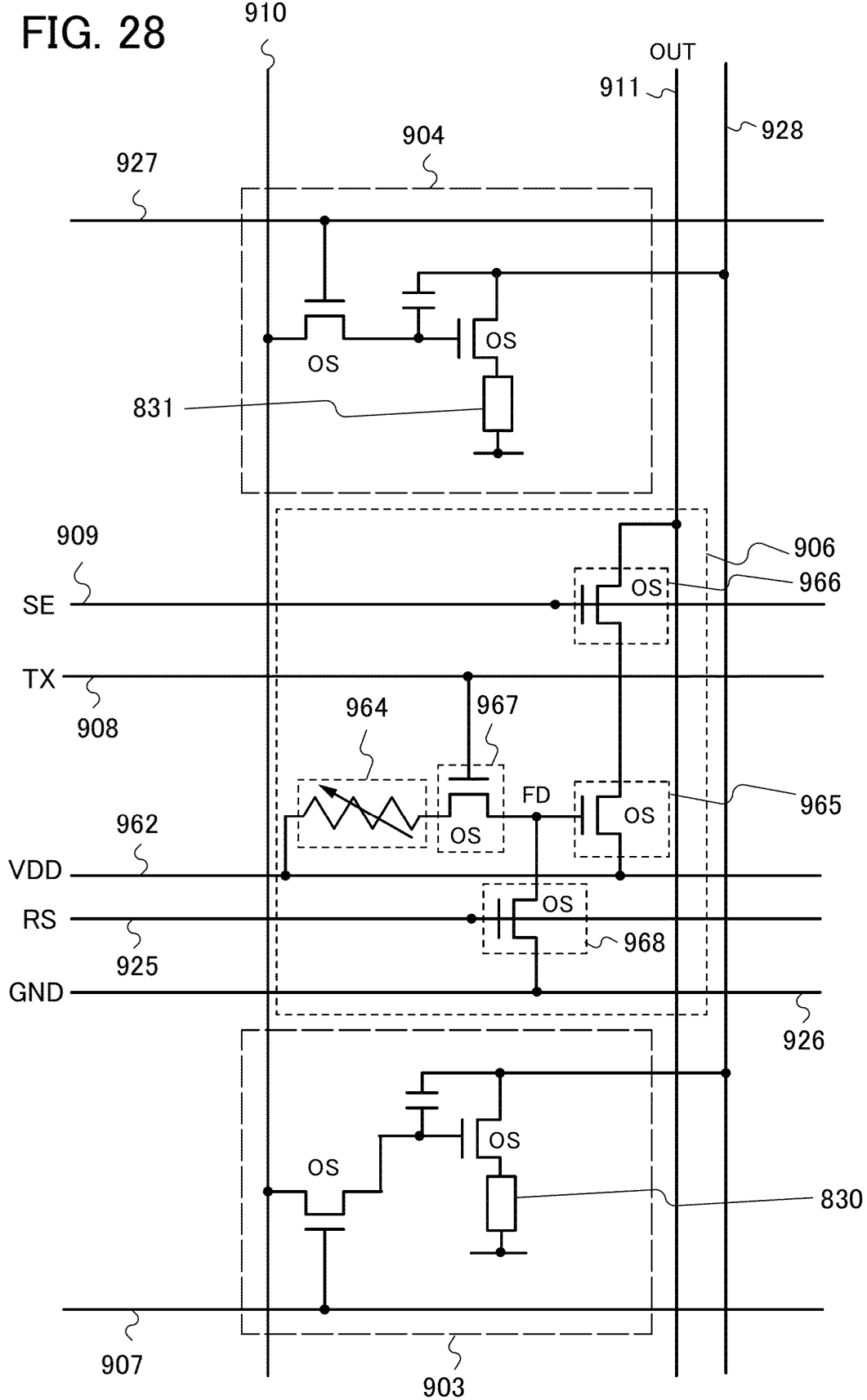
FIG. 28 is a circuit diagram illustrating pixels of a display device of one embodiment of the present invention.

Here, a circuit diagram of a pixel 903, a photosensor 906, and a pixel 904 adjacent to the pixel 903 will be described with reference to FIG. 28. The pixel 903 including the light-emitting element 830 is electrically connected to a display element driver circuit through a scan line (also referred to as gate signal line) 907 and is electrically connected to a display element driver circuit through a signal line (also referred to as source signal line) 910.

The pixel 904 including a light-emitting element 831 adjacent to the light-emitting element 830 is electrically connected to the display element driver circuit through a scan line (also referred to as gate signal line) 927 and is electrically connected to the display element driver circuit through the signal line (also referred to as source signal line) 910. The emission colors of the light-emitting element 830 and the light-emitting element 831 adjacent to the light-emitting element 830 are white, and the light-emitting element 830 and the light-emitting element 831 adjacent to the light-emitting element 830 are connected to a common power supply line 928. Light from the light-emitting element 831 adjacent to the light-emitting element 830 passes through a coloring layer (a red coloring layer, a blue coloring layer, or a green coloring layer) overlapping with light-emitting element 831 adjacent to the light-emitting element 830 so that any one of red, blue, and green is recognized by human eyes.

The photosensor 906 disposed between the pixel 903 and the pixel 904 adjacent to the pixel 903 includes a sensor element 964, a transistor 965, a transistor 966, a transistor 967, and a transistor 968. The transistor 965, the transistor 966, the transistor 967, and the transistor 968 are each a transistor including an oxide semiconductor layer in a channel formation region, and thus have an advantage of an extremely small leakage current in an off state (an extremely small off-state current). Accordingly, charge (potential) accumulated in a node in an off state can be held for a long time.

One terminal of the sensor element 964 is electrically connected to a power supply line 962 (VDD), and the other terminal thereof is electrically connected to one of a source and a drain of the transistor 967.

Figure 29:
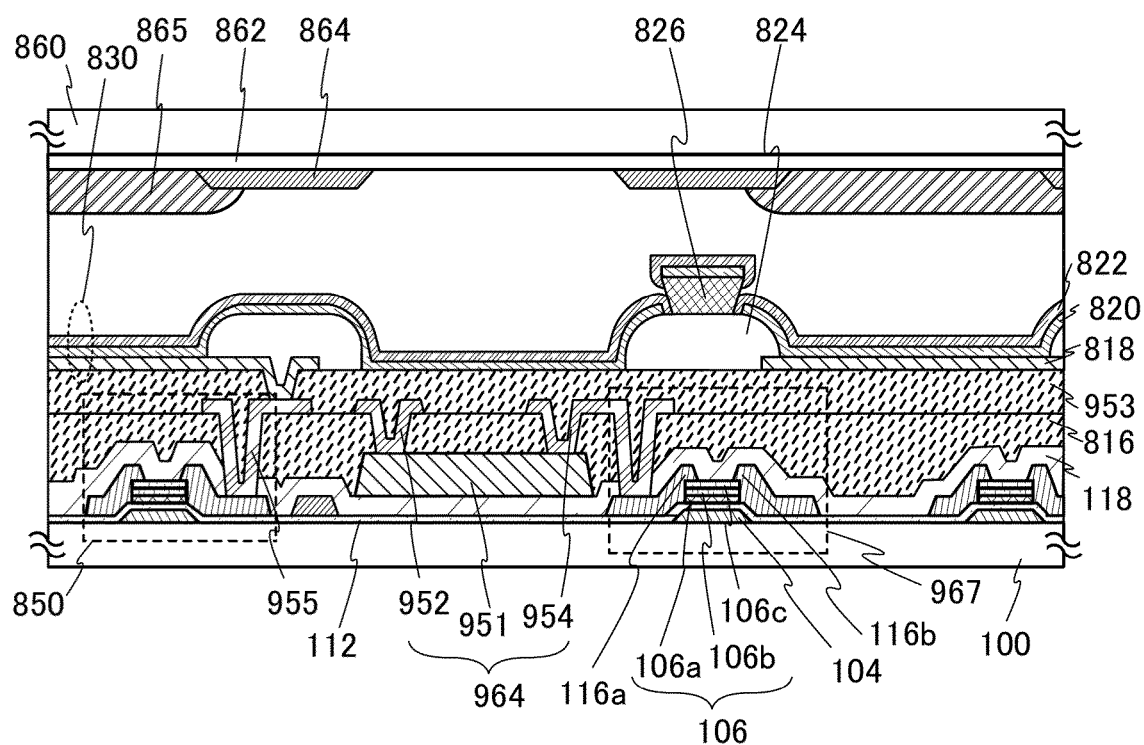
FIG. 29 is a cross-sectional view illustrating a display device of one embodiment of the present invention.

FIG. 29 is an example of a cross-sectional view of a display device using a photosensor. As illustrated in FIG. 29, the light-emitting element 830, the transistor 850 including the multi-layer film 106 formed using an oxide semiconductor for driving the light-emitting element, the transistor 967 including the multi-layer film 106 of an oxide semiconductor for driving the sensor element 964, and the sensor element 964 using an amorphous silicon layer 951 are provided over the same substrate.

As illustrated in FIG. 29, the sensor element 964 includes one amorphous silicon layer 951 which is in contact with and connected to a pair of electrodes 952 and 954. Note that the same portions as those in FIGS. 16A to 16D and FIG. 27 are denoted by the same reference numerals in FIG. 29.

In FIG. 29, the reflective electrode 818 is electrically connected to the drain electrode 116b of the transistor 850 through a wiring 955. The wiring 955 and the pair of electrodes 952 and 954 are covered with an interlayer insulating film 953, and the reflective electrode 818 is provided over the interlayer insulating film 953.

A gate of the transistor 967 is electrically connected to a signal line 908 (TX), the one of the source and the drain thereof is electrically connected to the other terminal of the sensor element 964, and the other of the source and the drain thereof is electrically connected to one of a source and a drain of the transistor 968 and a gate of the transistor 965. Note that a portion where the other of the source and the drain of the transistor 967, the one of the source and the drain of the transistor 968, and the gate of the transistor 965 are connected to one another is referred to as a node FD.

A gate of the transistor 968 is electrically connected to a reset line 925 (RS), and the one of the source and the drain thereof is electrically connected to the other of the source and the drain of the transistor 967 and the gate of the transistor 965. The other of the source and the drain of the transistor 968 is electrically connected to a ground line 926 (GND).

One of a source and a drain of the transistor 965 is electrically connected to the power supply line 962 (VDD), and the other of the source and the drain thereof is electrically connected to one of a source and a drain of the transistor 966.

A gate of the transistor 966 is electrically connected to a selection line 909 (SE), and the other of the source and the drain thereof is electrically connected to a photosensor output signal line 911 (OUT). The photosensor output signal line 911 (OUT) is electrically connected to a photosensor reading circuit.

A high-level power supply potential VDD and a ground potential GND (0 V) as a low-level power supply potential VSS are input to the power supply line 962 (VDD) and the ground line GND, respectively. Note that the ground potential GND (0 V) is used as the low-level power supply potential VSS in this specification; however, any potential lower than the high-level power supply potential VDD can be used as the low-level power supply potential VSS. In this specification, the high-level power supply potential VDD is a high-level potential VH or higher, a low-level potential VL is the ground potential GND or higher, and the high-level potential VH is higher than the low-level potential VL.

In this section, an example where an organic EL display device has a touch-input function is described; however, a liquid crystal display device may also have a touch input function.

Figure 30A:
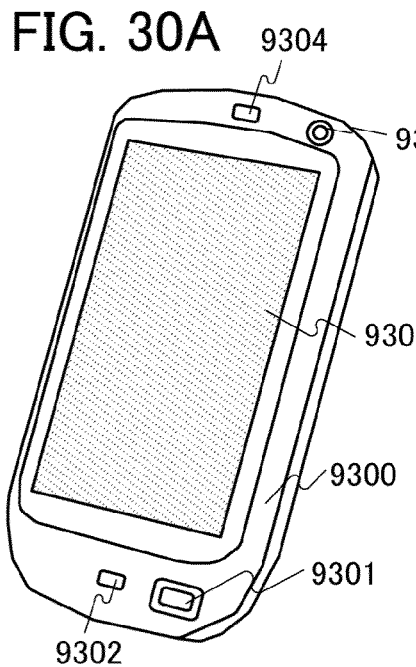
FIGS. 30A to 30D each illustrate an electronic device.

FIG. 30A illustrates a portable information terminal. The portable information terminal illustrated in FIG. 30A includes a housing 9300, a button 9301, a microphone 9302, a display portion 9303, a speaker 9304, and a camera 9305, and has a function as a mobile phone. One embodiment of the present invention can be applied to the display portion 9303. One embodiment of the present invention can also be applied to an arithmetic unit, a wireless circuit, or a memory circuit in a main body.

Part or the whole of the display portion 9303 can function as a touch panel. By touching an operation key displayed on the touch panel, a user can make settings for a game or a call, for example. One embodiment of the present invention can be applied to the display portion 9303 also in the case where the display portion 9303 is a touch panel.

Figure 30B:
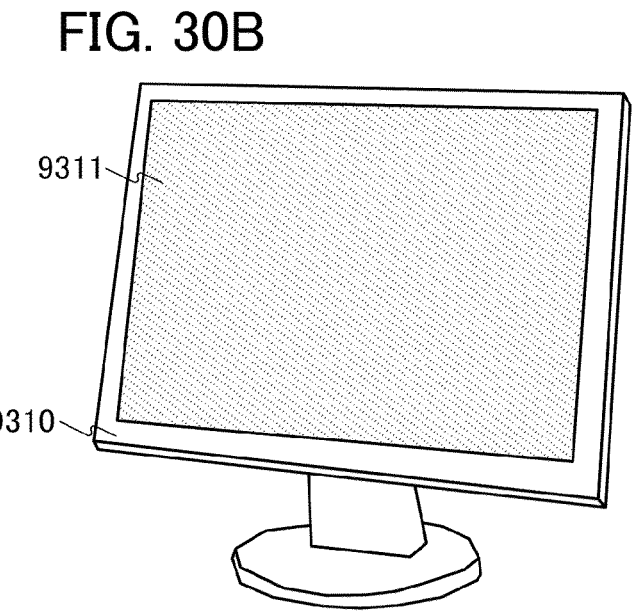

FIG. 30B illustrates a display. The display illustrated in FIG. 30B includes a housing 9310 and a display portion 9311. One embodiment of the present invention can be applied to the display portion 9311. One embodiment of the present invention can also be applied to an arithmetic unit, a wireless circuit, or a memory circuit in a main body.

Figure 30C:
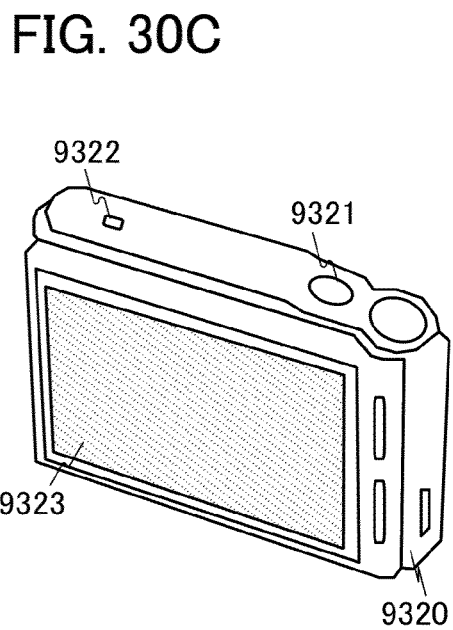

FIG. 30C illustrates a digital still camera. The digital still camera illustrated in FIG. 30C includes a housing 9320, a button 9321, a microphone 9322, and a display portion 9323. One embodiment of the present invention can be applied to the display portion 9323. One embodiment of the present invention can also be applied to an arithmetic unit, a wireless circuit, or a memory circuit in a main body.

Part or the whole of the display portion 9323 can function as a touch panel. By touching an operation key displayed on the touch panel, a user can make settings for shooting such as still image shooting or moving image shooting, for example. One embodiment of the present invention can be applied to the display portion 9323 also in the case where the display portion 9323 is a touch panel.

Figure 30D:
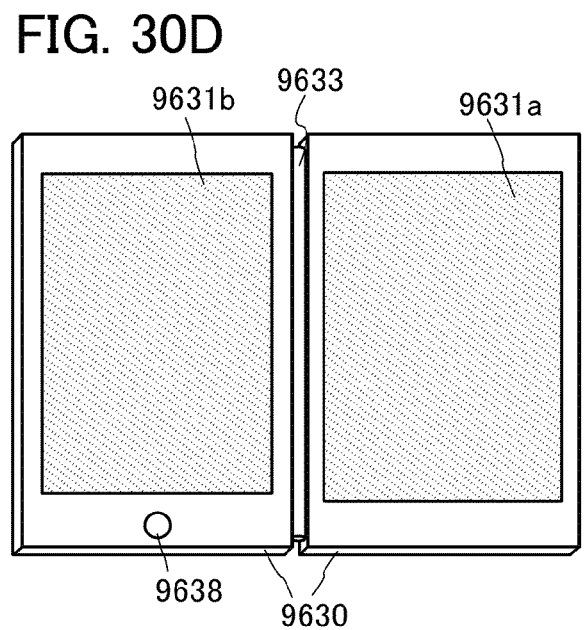

FIG. 30D illustrates a double-foldable portable information terminal. The double-foldable portable information terminal illustrated in FIG. 30D includes a housing 9630, a display portion 9631a, a display portion 9631b, a hinge 9633, and an operation switch 9638. One embodiment of the present invention can be applied to the display portion 9631a and the display portion 9631b. One embodiment of the present invention can also be applied to an arithmetic unit, a wireless circuit, or a memory circuit in a main body.

Part or the whole of the display portion 9631a and/or the display portion 9631b can function as a touch panel. By touching an operation key displayed on the touch panel, a user can input data, for example. One embodiment of the present invention can be applied to the display portion 9631a and/or the display portion 9631b also in the case where the display portion 9631a and/or the display portion 9631b are/is a touch panel.

With the use of a semiconductor device according to one embodiment of the present invention, a highly reliable electronic device can be provided.

REFERENCE NUMERALS

10: film formation chamber, 10a: film formation chamber, 10b: film formation chamber, 10c: film formation chamber, 11: substrate supply chamber, 12a: load lock chamber, 12b: load lock chamber, 13: transfer chamber, 14: cassette port, 15: substrate heating chamber, 20a: film formation chamber, 20b: film formation chamber, 20c: film formation chamber, 20d: film formation chamber, 21: substrate supply chamber, 23: transfer chamber, 24: cassette port, 25: substrate heating chamber, 32: target, 34: target holder, 54: refiner, 58a: cryopump, 58b: cryopump, 58c: turbo molecular pump, 58d: cryopump, 58e: cryopump, 58f: cryopump, 59: vacuum pump, 59a: vacuum pump, 59b: vacuum pump, 59c: vacuum pump, 60: mass flow controller, 62: gas heating system, 66: cryotrap, 100: substrate, 104: gate electrode, 106: multi-layer film, 106a: oxide layer, 106b: oxide semiconductor layer, 106c: oxide layer, 106d: source region, 106e: drain region, 112: gate insulating film, 116a: source electrode, 116b: drain electrode, 118: protective insulating film, 118a: first silicon oxide layer, 118b: second silicon oxide layer, 118c: silicon nitride layer, 119: multi-layer film, 119a: oxide layer, 119b: oxide layer, 119c: oxide layer, 200: substrate, 202:

base insulating film, 204: gate electrode, 206: multi-layer film, 206a: oxide layer, 206b: oxide semiconductor layer, 206c: oxide layer, 212: gate insulating film, 216a: source electrode, 216b: drain electrode, 218: protective insulating film, 700: pixel portion, 701: pixel, 703: transistor, 704: scan line driver circuit, 705: capacitor, 706: signal line driver circuit, 707: scan line, 708: liquid crystal element, 709: signal line, 713: pixel electrode, 715: capacitor line, 717: opening, 719: multi-layer film, 721: pixel electrode, 723: opening, 725: conductive film, 750: counter substrate, 752: light-blocking film, 754: counter electrode, 755: wiring, 756: insulating film, 758: insulating film, 760: liquid crystal layer, 796: pixel, 797: capacitor, 798: multi-layer film, 816: insulating film, 818: reflective electrode, 820: light-emitting layer, 822: cathode, 824: bank, 826: bank, 830: light-emitting element, 831: light-emitting element, 833: microcavity layer, 834: microcavity layer, 850: transistor, 860: sealing substrate, 862: base layer, 864: black matrix, 865: blue color filter, 866: green color filter, 867: red color filter, 903: pixel, 904: pixel, 906: photosensor, 907: scan line, 908: signal line, 909: selection line, 910: signal line, 911: photosensor output signal line, 925: reset line, 926: ground line, 927: scan line, 928: power supply line, 951: amorphous silicon layer, 952: electrode, 953: interlayer insulating film, 954: electrode, 955: wiring, 962: power supply line, 964: sensor element, 965: transistor, 966: transistor, 967: transistor, 968: transistor, 9300: housing, 9301: button, 9302: microphone, 9303: display portion, 9304: speaker, 9305: camera, 9310: housing, 9311: display portion, 9320: housing, 9321: button, 9322: microphone, 9323: display portion, 9630: housing, 9631a: display portion, 9631b: display portion, 9633: hinge, and 9638: operation switch This application is based on Japanese Patent Application serial no. 2012-210231 filed with Japan Patent Office on Sep. 24, 2012, the entire contents of which are hereby incorporated by reference.

The invention claimed is:

1. A display device comprising:
   a multi-layer film including an oxide layer and an oxide semiconductor layer;
   a gate insulating film in contact with the multi-layer film; and
   a gate electrode overlapping with the multi-layer film with the gate insulating film therebetween,
   wherein each of the oxide layer and the oxide semiconductor layer contains indium,
   wherein the oxide layer is directly in contact with the gate insulating film,
   wherein the oxide semiconductor layer is not directly in contact with the gate insulating film,
   wherein the oxide semiconductor layer is in contact with the oxide layer,
   wherein a band gap of the oxide layer is larger than a band gap of the oxide semiconductor layer, and
   wherein a bottom of a conduction band is gradually decreased from the oxide layer to the oxide semiconductor layer and a top of a valence band is gradually increased from the oxide layer to the oxide semiconductor layer.

2. The display device according to claim 1, wherein a channel is formed in the oxide semiconductor layer.

3. The display device according to claim 1, further comprising a source electrode and a drain electrode, wherein each of the source electrode and the drain electrode is in contact with one of side edges of the oxide semiconductor layer.

4. The display device according to claim 1,
   wherein the oxide semiconductor layer includes a crystal part, and
   wherein a c-axis of the crystal part is parallel to a normal vector of a surface of the oxide layer.

5. The display device according to claim 1,
   wherein each of the oxide semiconductor layer and the oxide layer comprises at least one of indium, zinc, and a metal,
   wherein the metal is selected from aluminum, titanium, gallium, yttrium, zirconium, tin, lanthanum, cerium, neodymium, and hafnium, and
   wherein an atomic ratio of indium to the metal in the oxide layer is lower than an atomic ratio of indium to the metal in the oxide semiconductor layer.

6. The display device according to claim 1, wherein the oxide semiconductor layer is an In—Zn oxide, an In—Ga oxide, or an In—Ga—Zn oxide.

7. The display device according to claim 1,
   wherein a thickness of the oxide semiconductor layer is greater than or equal to 3 nm and less than or equal to 200 nm, and
   wherein a thickness of the oxide layer is greater than or equal to 3 nm and less than or equal to 50 nm.

8. The display device according to claim 1, wherein the thickness of the oxide layer is greater than or equal to 3 nm and less than or equal to 40 nm.

9. The display device according to claim 1, wherein a concentration of silicon in the oxide semiconductor layer is less than $5 \times 10^{18}$ atoms/cm$^3$.

10. The display device according to claim 1, wherein a concentration of carbon in the oxide semiconductor layer is less than $1 \times 10^{19}$ atoms/cm$^3$.

11. A display device comprising:
    a multi-layer film including an oxide layer and an oxide semiconductor layer;
    a gate insulating film in contact with the multi-layer film; and
    a gate electrode overlapping with the multi-layer film with the gate insulating film therebetween,
    wherein each of the oxide layer and the oxide semiconductor layer contains indium,
    wherein the oxide layer is directly in contact with the gate insulating film,
    wherein the oxide semiconductor layer is not directly in contact with the gate insulating film,
    wherein the oxide semiconductor layer is in contact with the oxide layer,
    wherein an energy at a bottom of a conduction band of the oxide layer is closer to a vacuum level than an energy at a bottom of a conduction band of the oxide semiconductor layer, and
    wherein a bottom of a conduction band is gradually decreased from the oxide layer to the oxide semiconductor layer and a top of a valence band is gradually increased from the oxide layer to the oxide semiconductor layer.

12. The display device according to claim 11, wherein a gap between the energy at the bottom of the conduction band of the oxide layer and the energy at the bottom of the conduction band of the oxide semiconductor layer is greater than or equal to 0.05 eV and less than or equal to 2 eV.

13. The display device according to claim 11, wherein a channel is formed in the oxide semiconductor layer.

14. The display device according to claim 11, further comprising a source electrode and a drain electrode, wherein each of the source electrode and the drain electrode is in contact with one of side edges of the oxide semiconductor layer.

15. The display device according to claim 11,
wherein the oxide semiconductor layer includes a crystal part, and
wherein a c-axis of the crystal part is parallel to a normal vector of a surface of the oxide layer.

16. The display device according to claim 11,
wherein each of the oxide semiconductor layer and the oxide layer comprises at least one of indium, zinc, and a metal,
wherein the metal is selected from aluminum, titanium, gallium, yttrium, zirconium, tin, lanthanum, cerium, neodymium, and hafnium, and
wherein an atomic ratio of indium to the metal in the oxide layer is lower than an atomic ratio of indium to the metal in the oxide semiconductor layer.

17. The display device according to claim 11, wherein the oxide semiconductor layer is an In—Zn oxide, an In—Ga oxide, or an In—Ga—Zn oxide.

18. The display device according to claim 11,
wherein a thickness of the oxide semiconductor layer is greater than or equal to 3 nm and less than or equal to 200 nm, and
wherein a thickness of the oxide layer is greater than or equal to 3 nm and less than or equal to 50 nm.

19. The display device according to claim 11, wherein the thickness of the oxide layer is greater than or equal to 3 nm and less than or equal to 40 nm.

20. The display device according to claim 11, wherein a concentration of silicon in the oxide semiconductor layer is less than $5\times10^{18}$ atoms/cm$^3$.

21. The display device according to claim 11, wherein a concentration of carbon in the oxide semiconductor layer is less than $1\times10^{19}$ atoms/cm$^3$.

* * * * *